US009411751B2

(12) United States Patent
Whitt, III et al.

(10) Patent No.: US 9,411,751 B2
(45) Date of Patent: Aug. 9, 2016

(54) KEY FORMATION

(75) Inventors: David Otto Whitt, III, Sammamish, WA (US); Timothy C. Shaw, Sammamish, WA (US); Christopher Harry Stoumbos, Sammamish, WA (US); Joel Lawrence Pelley, Bellevue, WA (US); Matthew David Mickelson, Seattle, WA (US); James Alec Ishihara, Bellevue, WA (US); Hua Wang, Sammamish, WA (US); Karsten Aagaard, Monroe, WA (US); Ralf Groene, Kirkland, WA (US); Rob Huala, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 132 days.

(21) Appl. No.: 13/470,951

(22) Filed: May 14, 2012

(65) Prior Publication Data

US 2013/0229351 A1 Sep. 5, 2013

Related U.S. Application Data

(60) Provisional application No. 61/606,321, filed on Mar. 2, 2012, provisional application No. 61/606,301, filed on Mar. 2, 2012, provisional application No. 61/606,313, filed on Mar. 2, 2012, provisional (Continued)

(51) Int. Cl.
*G06F 3/02* (2006.01)
*G06F 13/10* (2006.01)
(Continued)

(52) U.S. Cl.
CPC .......... *G06F 13/102* (2013.01); *E05D 11/1064* (2013.01); *E05F 5/08* (2013.01);
(Continued)

(58) Field of Classification Search
CPC ..... G05B 11/01; G06F 1/1618; G06F 1/1654; G06F 1/1669; G06F 1/1681; G06F 1/1683; G06F 1/1684; G06F 3/0202; G06F 3/0414; G06F 3/0416; H01H 13/704; H01H 13/82; H04M 1/0216; H04M 1/0245; H04M 1/0254; H04M 1/72527
USPC .......................................... 345/168; 400/491
See application file for complete search history.

(56) References Cited

U.S. PATENT DOCUMENTS 578,325 A 3/1897 Fleming
3,600,528 A 8/1971 Leposavic
(Continued)

FOREIGN PATENT DOCUMENTS

CA 990023 6/1976
CN 1352767 6/2002
(Continued)

OTHER PUBLICATIONS

"Cirago Slim Case®—Protective case with built-in kickstand for your iPhone 5®", Retrieved from <http://cirago.com/wordpress/wp-content/uploads/2012/10/ipc1500brochure1.pdf> on Jan. 29, 2013, (Jan. 20, 2013), 1 page.

(Continued)

*Primary Examiner* — Jennifer Nguyen
*Assistant Examiner* — Tony Davis
(74) *Attorney, Agent, or Firm* — Judy Yee; Micky Minhas

(57) ABSTRACT

Key formation techniques are described. In one or more implementations, an input device includes a key assembly including a plurality of keys that are usable to initiate respective inputs for a computing device, a connection portion configured to be removably connected to the computing device physically and communicatively to communicate signals generated by the plurality of keys to the computing device, and an outer layer that is configured to cover the plurality of keys of the key assembly, the outer layer having a plurality of areas that are embossed thereon that indicate one or more borders of respective said keys.

20 Claims, 19 Drawing Sheets

Related U.S. Application Data application No. 61/606,333, filed on Mar. 2, 2012, provisional application No. 61/613,745, filed on Mar. 21, 2012, provisional application No. 61/606,336, filed on Mar. 2, 2012, provisional application No. 61/607,451, filed on Mar. 6, 2012.

(51) Int. Cl.

| | | |
|---|---|---|
| *H01H 13/79* | (2006.01) | |
| *H01H 13/78* | (2006.01) | |
| *H01H 13/785* | (2006.01) | |
| *G06F 1/16* | (2006.01) | |
| *H05K 5/02* | (2006.01) | |
| *H04M 1/02* | (2006.01) | |
| *H04M 1/725* | (2006.01) | |
| *G05B 11/01* | (2006.01) | |
| *G06F 3/041* | (2006.01) | |
| *H01H 13/704* | (2006.01) | |
| *H01H 13/82* | (2006.01) | |
| *G06F 3/00* | (2006.01) | |
| *G06F 3/01* | (2006.01) | |
| *H01H 13/702* | (2006.01) | |
| *H01H 13/14* | (2006.01) | |
| *H01H 13/703* | (2006.01) | |
| *G06F 9/54* | (2006.01) | |
| *G06F 11/30* | (2006.01) | |
| *G06F 3/023* | (2006.01) | |
| *G06F 3/0488* | (2013.01) | |
| *G06F 3/0487* | (2013.01) | |
| *H01H 13/807* | (2006.01) | |
| *H01H 11/00* | (2006.01) | |
| *E05D 11/10* | (2006.01) | |
| *E05F 5/08* | (2006.01) | |
| *F16M 11/38* | (2006.01) | |
| *H01H 9/26* | (2006.01) | |

(52) U.S. Cl.
CPC ............ *F16M 11/38* (2013.01); *G05B 11/01* (2013.01); *G06F 1/166* (2013.01); *G06F 1/1618* (2013.01); *G06F 1/1637* (2013.01); *G06F 1/1654* (2013.01); *G06F 1/1656* (2013.01); *G06F 1/1662* (2013.01); *G06F 1/1669* (2013.01); *G06F 1/1681* (2013.01); *G06F 1/1683* (2013.01); *G06F 1/1684* (2013.01); *G06F 1/1686* (2013.01); *G06F 3/002* (2013.01); *G06F 3/01* (2013.01); *G06F 3/0202* (2013.01); *G06F 3/023* (2013.01); *G06F 3/0414* (2013.01); *G06F 3/0416* (2013.01); *G06F 3/0487* (2013.01); *G06F 3/0488* (2013.01); *G06F 9/541* (2013.01); *G06F 11/3089* (2013.01); *H01H 11/00* (2013.01); *H01H 13/14* (2013.01); *H01H 13/702* (2013.01); *H01H 13/703* (2013.01); *H01H 13/704* (2013.01); *H01H 13/78* (2013.01); *H01H 13/785* (2013.01); *H01H 13/79* (2013.01); *H01H 13/807* (2013.01); *H01H 13/82* (2013.01); *H04M 1/0216* (2013.01); *H04M 1/0254* (2013.01); *H04M 1/72527* (2013.01); *H05K 5/0226* (2013.01); *H05K 5/0234* (2013.01); *H01H 9/26* (2013.01); *H01H 2201/036* (2013.01); *H01H 2203/02* (2013.01); *H01H 2205/006* (2013.01); *H01H 2211/004* (2013.01); *H01H 2211/006* (2013.01); *H01H 2213/016* (2013.01); *H01H 2217/004* (2013.01); *H01H 2217/01* (2013.01); *H04M 1/0245* (2013.01); *Y02B 60/1228* (2013.01); *Y10T 16/5401* (2015.01); *Y10T 16/551* (2015.01); *Y10T 29/49826* (2015.01)

(56) References Cited

U.S. PATENT DOCUMENTS

| | | |
|---|---|---|
| 3,777,082 A | 12/1973 | Hatley |
| 3,879,586 A | 4/1975 | DuRocher et al. |
| 3,968,336 A | 7/1976 | Johnson |
| 4,046,975 A | 9/1977 | Seeger, Jr. |
| 4,065,649 A | 12/1977 | Carter et al. |
| 4,086,451 A | 4/1978 | Boulanger |
| 4,243,861 A | 1/1981 | Strandwitz |
| 4,261,042 A | 4/1981 | Ishiwatari et al. |
| 4,302,648 A | 11/1981 | Sado et al. |
| 4,317,011 A | 2/1982 | Mazurk |
| 4,317,013 A | 2/1982 | Larson |
| 4,323,740 A | 4/1982 | Balash |
| 4,365,130 A | 12/1982 | Christensen |
| 4,375,018 A | 2/1983 | Petersen |
| 4,492,829 A | 1/1985 | Rodrique |
| 4,503,294 A | 3/1985 | Matsumaru |
| 4,527,021 A | 7/1985 | Morikawa et al. |
| 4,559,426 A | 12/1985 | Van Zeeland et al. |
| 4,577,822 A | 3/1986 | Wilkerson |
| 4,588,187 A | 5/1986 | Dell |
| 4,607,147 A | 8/1986 | Ono et al. |
| 4,651,133 A | 3/1987 | Ganesan et al. |
| 4,652,704 A | 3/1987 | Franklin |
| 4,724,605 A | 2/1988 | Fiorella |
| 4,735,394 A | 4/1988 | Facco |
| 4,801,771 A | 1/1989 | Mizuguchi et al. |
| 4,824,268 A | 4/1989 | Diernisse |
| 4,864,084 A | 9/1989 | Cardinale |
| 4,990,900 A | 2/1991 | Kikuchi |
| 5,008,497 A | 4/1991 | Asher |
| 5,021,638 A | 6/1991 | Nopper et al. |
| 5,053,585 A | 10/1991 | Yaniger |
| 5,107,401 A | 4/1992 | Youn |
| 5,128,829 A | 7/1992 | Loew |
| 5,218,177 A | 6/1993 | Coleman et al. |
| 5,220,318 A | 6/1993 | Staley |
| 5,220,521 A | 6/1993 | Kikinis |
| 5,235,495 A | 8/1993 | Blair et al. |
| 5,253,362 A | 10/1993 | Nolan et al. |
| 5,283,559 A | 2/1994 | Kalendra et al. |
| 5,331,443 A | 7/1994 | Stanisci |
| 5,363,075 A | 11/1994 | Fanucchi |
| 5,375,076 A | 12/1994 | Goodrich et al. |
| 5,480,118 A | 1/1996 | Cross |
| 5,491,313 A | 2/1996 | Bartley et al. |
| 5,546,271 A | 8/1996 | Gut et al. |
| 5,548,477 A | 8/1996 | Kumar et al. |
| 5,558,577 A | 9/1996 | Kato |
| 5,581,682 A | 12/1996 | Anderson et al. |
| 5,596,700 A | 1/1997 | Darnell et al. |
| 5,617,343 A | 4/1997 | Danielson et al. |
| 5,661,279 A | 8/1997 | Kenmochi |
| 5,666,112 A | 9/1997 | Crowley et al. |
| 5,681,220 A | 10/1997 | Bertram et al. |
| 5,737,183 A | 4/1998 | Kobayashi et al. |
| 5,745,376 A | 4/1998 | Barker et al. |
| 5,748,114 A | 5/1998 | Koehn |
| 5,781,406 A | 7/1998 | Hunte |
| 5,803,748 A | 9/1998 | Maddrell et al. |
| 5,807,175 A | 9/1998 | Davis et al. |
| 5,818,361 A | 10/1998 | Acevedo |
| 5,828,770 A | 10/1998 | Leis et al. |
| 5,842,027 A | 11/1998 | Oprescu et al. |
| 5,874,697 A | 2/1999 | Selker et al. |
| 5,905,485 A | 5/1999 | Podoloff |
| 5,920,317 A | 7/1999 | McDonald |
| 5,924,555 A | 7/1999 | Sadamori et al. |
| 5,926,170 A | 7/1999 | Oba |
| 5,971,635 A | 10/1999 | Wise |
| 5,995,026 A | 11/1999 | Sellers |
| 6,002,389 A | 12/1999 | Kasser |

(56) References Cited

U.S. PATENT DOCUMENTS

| | | |
|---|---|---|
| 6,002,581 A | 12/1999 | Lindsey |
| 6,005,209 A | 12/1999 | Burleson et al. |
| 6,012,714 A | 1/2000 | Worley et al. |
| 6,014,800 A | 1/2000 | Lee |
| 6,040,823 A | 3/2000 | Seffernick et al. |
| 6,042,075 A | 3/2000 | Burch, Jr. |
| 6,044,717 A | 4/2000 | Biegelsen et al. |
| 6,055,705 A | 5/2000 | Komatsu et al. |
| 6,061,644 A | 5/2000 | Leis |
| 6,108,200 A | 8/2000 | Fullerton |
| 6,128,007 A | 10/2000 | Seybold |
| 6,141,388 A | 10/2000 | Servais et al. |
| 6,178,085 B1 | 1/2001 | Leung |
| 6,178,443 B1 | 1/2001 | Lin |
| 6,188,391 B1 | 2/2001 | Seely et al. |
| 6,254,105 B1 | 7/2001 | Rinde et al. |
| 6,305,073 B1 | 10/2001 | Badders |
| 6,329,617 B1 | 12/2001 | Burgess |
| 6,344,791 B1 | 2/2002 | Armstrong |
| 6,366,440 B1 | 4/2002 | Kung |
| 6,380,497 B1 | 4/2002 | Hashimoto et al. |
| 6,437,682 B1 | 8/2002 | Vance |
| 6,450,046 B1 | 9/2002 | Maeda |
| 6,511,378 B1 | 1/2003 | Bhatt et al. |
| 6,532,147 B1 | 3/2003 | Christ, Jr. |
| 6,543,949 B1 | 4/2003 | Ritchey et al. |
| 6,565,439 B2 | 5/2003 | Shinohara et al. |
| 6,585,435 B2 | 7/2003 | Fang |
| 6,597,347 B1 | 7/2003 | Yasutake |
| 6,600,121 B1 | 7/2003 | Olodort et al. |
| 6,603,408 B1 | 8/2003 | Gaba |
| 6,603,461 B2 | 8/2003 | Smith, Jr. et al. |
| 6,608,664 B1 | 8/2003 | Hasegawa |
| 6,617,536 B2 | 9/2003 | Kawaguchi |
| 6,651,943 B2 | 11/2003 | Cho et al. |
| 6,684,166 B2 | 1/2004 | Bellwood et al. |
| 6,685,369 B2 | 2/2004 | Lien |
| 6,687,614 B2 | 2/2004 | Ihara et al. |
| 6,695,273 B2 | 2/2004 | Iguchi |
| 6,704,864 B1 | 3/2004 | Philyaw |
| 6,721,019 B2 | 4/2004 | Kono et al. |
| 6,725,318 B1 | 4/2004 | Sherman et al. |
| 6,774,888 B1 | 8/2004 | Genduso |
| 6,776,546 B2 | 8/2004 | Kraus et al. |
| 6,780,019 B1 | 8/2004 | Ghosh et al. |
| 6,781,819 B2 | 8/2004 | Yang et al. |
| 6,784,869 B1 | 8/2004 | Clark et al. |
| 6,798,887 B1 | 9/2004 | Andre |
| 6,813,143 B2 | 11/2004 | Makela |
| 6,819,316 B2 | 11/2004 | Schulz et al. |
| 6,856,506 B2 | 2/2005 | Doherty et al. |
| 6,856,789 B2 | 2/2005 | Pattabiraman et al. |
| 6,861,961 B2 | 3/2005 | Sandbach et al. |
| 6,909,354 B2 | 6/2005 | Baker et al. |
| 6,914,197 B2 | 7/2005 | Doherty et al. |
| 6,950,950 B2 | 9/2005 | Sawyers et al. |
| 6,962,454 B1 | 11/2005 | Costello |
| 6,976,799 B2 | 12/2005 | Kim et al. |
| 7,007,238 B2 | 2/2006 | Glaser |
| 7,091,436 B2 | 8/2006 | Serban |
| 7,099,149 B2 | 8/2006 | Krieger et al. |
| 7,106,222 B2 | 9/2006 | Ward et al. |
| 7,123,292 B1 | 10/2006 | Seeger et al. |
| D535,292 S | 1/2007 | Shi et al. |
| 7,159,132 B2 | 1/2007 | Takahashi et al. |
| 7,194,662 B2 | 3/2007 | Do et al. |
| 7,213,323 B2 | 5/2007 | Baker et al. |
| 7,213,991 B2 | 5/2007 | Chapman et al. |
| 7,252,512 B2 | 8/2007 | Tai et al. |
| 7,260,221 B1 | 8/2007 | Atsmon |
| 7,277,087 B2 | 10/2007 | Hill et al. |
| 7,301,759 B2 | 11/2007 | Hsiung |
| 7,365,967 B2 | 4/2008 | Zheng |
| 7,415,676 B2 | 8/2008 | Fujita |
| 7,447,922 B1 | 11/2008 | Asbury et al. |
| 7,457,108 B2 | 11/2008 | Ghosh |
| 7,469,386 B2 | 12/2008 | Bear et al. |
| 7,486,165 B2 | 2/2009 | Ligtenberg et al. |
| 7,499,037 B2 | 3/2009 | Lube |
| 7,539,882 B2 | 5/2009 | Jessup et al. |
| 7,542,052 B2 | 6/2009 | Solomon et al. |
| 7,558,594 B2 | 7/2009 | Wilson |
| 7,559,834 B1 | 7/2009 | York |
| RE40,891 E | 9/2009 | Yasutake |
| 7,594,638 B2 | 9/2009 | Chan et al. |
| 7,629,966 B2 | 12/2009 | Anson |
| 7,636,921 B2 | 12/2009 | Louie |
| 7,639,329 B2 | 12/2009 | Takeda et al. |
| 7,656,392 B2 | 2/2010 | Bolender |
| 7,693,654 B1 | 4/2010 | Dietsch et al. |
| 7,722,358 B2 | 5/2010 | Chatterjee et al. |
| 7,729,493 B2 | 6/2010 | Krieger et al. |
| 7,731,147 B2 | 6/2010 | Rha |
| 7,733,326 B1 | 6/2010 | Adiseshan |
| 7,761,119 B2 | 7/2010 | Patel |
| 7,777,972 B1 | 8/2010 | Chen et al. |
| 7,782,342 B2 | 8/2010 | Koh |
| 7,813,715 B2 | 10/2010 | McKillop et al. |
| 7,822,338 B2 | 10/2010 | Wernersson |
| 7,865,639 B2 | 1/2011 | McCoy et al. |
| 7,884,807 B2 | 2/2011 | Hovden et al. |
| 7,893,921 B2 | 2/2011 | Sato |
| D636,397 S | 4/2011 | Green |
| 7,928,964 B2 | 4/2011 | Kolmykov-Zotov et al. |
| 7,932,890 B2 | 4/2011 | Onikiri et al. |
| 7,944,520 B2 | 5/2011 | Ichioka et al. |
| 7,945,717 B2 | 5/2011 | Rivalsi |
| 7,973,771 B2 | 7/2011 | Geaghan |
| 7,978,281 B2 | 7/2011 | Vergith et al. |
| 8,016,255 B2 | 9/2011 | Lin |
| 8,053,688 B2 | 11/2011 | Conzola et al. |
| 8,059,384 B2 | 11/2011 | Park et al. |
| 8,065,624 B2 | 11/2011 | Morin et al. |
| 8,069,356 B2 | 11/2011 | Rathi et al. |
| 8,090,885 B2 | 1/2012 | Callaghan et al. |
| 8,098,233 B2 | 1/2012 | Hotelling et al. |
| 8,115,499 B2 | 2/2012 | Osoinach et al. |
| 8,117,362 B2 | 2/2012 | Rodriguez et al. |
| 8,118,274 B2 | 2/2012 | McClure et al. |
| 8,120,166 B2 | 2/2012 | Koizumi et al. |
| 8,130,203 B2 | 3/2012 | Westerman |
| 8,149,219 B2 | 4/2012 | Lii et al. |
| 8,154,524 B2 | 4/2012 | Wilson et al. |
| 8,159,372 B2 | 4/2012 | Sherman |
| 8,162,282 B2 | 4/2012 | Hu et al. |
| D659,139 S | 5/2012 | Gengler |
| 8,169,421 B2 | 5/2012 | Wright et al. |
| 8,229,509 B2 | 7/2012 | Paek et al. |
| 8,229,522 B2 | 7/2012 | Kim et al. |
| 8,231,099 B2 | 7/2012 | Chen |
| 8,243,432 B2 | 8/2012 | Duan et al. |
| 8,248,791 B2 | 8/2012 | Wang et al. |
| 8,255,708 B1 | 8/2012 | Zhang |
| 8,264,310 B2 | 9/2012 | Lauder et al. |
| 8,267,368 B2 | 9/2012 | Torii et al. |
| 8,269,731 B2 | 9/2012 | Molne |
| 8,274,784 B2 | 9/2012 | Franz et al. |
| 8,279,589 B2 | 10/2012 | Kim |
| 8,322,290 B1 | 12/2012 | Mignano |
| 8,346,206 B1 | 1/2013 | Andrus et al. |
| 8,373,664 B2 | 2/2013 | Wright |
| 8,384,566 B2 | 2/2013 | Bocirnea |
| 8,387,078 B2 | 2/2013 | Memmott |
| 8,387,938 B2 | 3/2013 | Lin |
| 8,403,576 B2 | 3/2013 | Merz |
| 8,416,559 B2 | 4/2013 | Agata et al. |
| 8,424,160 B2 | 4/2013 | Chen |
| 8,446,359 B2 | 5/2013 | Doczy et al. |
| 8,464,079 B2 | 6/2013 | Chueh et al. |
| 8,498,100 B1 | 7/2013 | Whitt, III et al. |
| 8,514,568 B2 | 8/2013 | Qiao et al. |
| 8,520,371 B2 | 8/2013 | Peng et al. |
| 8,543,227 B1 | 9/2013 | Perek et al. |
| 8,548,608 B2 | 10/2013 | Perek et al. |

(56) References Cited

U.S. PATENT DOCUMENTS

| | | |
|---|---|---|
| 8,564,944 B2 | 10/2013 | Whitt, III et al. |
| 8,569,640 B2 | 10/2013 | Yamada et al. |
| 8,570,725 B2 | 10/2013 | Whitt, III et al. |
| 8,576,031 B2 | 11/2013 | Lauder et al. |
| 8,587,701 B2 | 11/2013 | Tatsuzawa |
| 8,599,542 B1 | 12/2013 | Healey et al. |
| 8,610,015 B2 | 12/2013 | Whitt et al. |
| 8,614,666 B2 | 12/2013 | Whitman et al. |
| 8,633,898 B2 | 1/2014 | Westerman et al. |
| 8,646,999 B2 | 2/2014 | Shaw et al. |
| 8,674,941 B2 | 3/2014 | Casparian et al. |
| 8,699,215 B2 | 4/2014 | Whitt, III et al. |
| 8,719,603 B2 | 5/2014 | Belesiu |
| 8,724,302 B2 | 5/2014 | Whitt et al. |
| 8,744,070 B2 | 6/2014 | Zhang et al. |
| 8,744,391 B2 | 6/2014 | Tenbrook et al. |
| 8,762,746 B1 | 6/2014 | Lachwani et al. |
| 8,767,388 B2 | 7/2014 | Ahn et al. |
| 8,780,540 B2 | 7/2014 | Whitt, III et al. |
| 8,780,541 B2 | 7/2014 | Whitt et al. |
| 8,791,382 B2 | 7/2014 | Whitt, III et al. |
| 8,797,765 B2 | 8/2014 | Lin et al. |
| 8,823,652 B2 | 9/2014 | Linegar et al. |
| 8,825,187 B1 | 9/2014 | Hamrick et al. |
| 8,830,668 B2 | 9/2014 | Whitt, III et al. |
| 8,850,241 B2 | 9/2014 | Oler et al. |
| 8,854,799 B2 | 10/2014 | Whitt, III et al. |
| 8,873,227 B2 | 10/2014 | Whitt et al. |
| 8,891,232 B2 | 11/2014 | Wang |
| 8,896,993 B2 | 11/2014 | Belesiu et al. |
| 8,903,517 B2 | 12/2014 | Perek et al. |
| 8,908,858 B2 | 12/2014 | Chiu et al. |
| 8,934,221 B2 | 1/2015 | Guo |
| 8,935,774 B2 | 1/2015 | Belesiu et al. |
| 8,939,422 B2 | 1/2015 | Liu et al. |
| 8,947,864 B2 | 2/2015 | Whitt, III et al. |
| 8,949,477 B2 | 2/2015 | Drasnin |
| 8,964,376 B2 | 2/2015 | Chen |
| 9,047,207 B2 | 6/2015 | Belesiu et al. |
| 9,064,654 B2 | 6/2015 | Whitt, III et al. |
| 9,075,566 B2 | 7/2015 | Whitt, III et al. |
| 9,098,117 B2 | 8/2015 | Lutz, III et al. |
| 9,116,550 B2 | 8/2015 | Siddiqui et al. |
| 9,134,807 B2 | 9/2015 | Shaw et al. |
| 9,134,808 B2 | 9/2015 | Siddiqui et al. |
| 9,146,620 B2 | 9/2015 | Whitt et al. |
| 9,158,383 B2 | 10/2015 | Shaw et al. |
| 9,158,384 B2 | 10/2015 | Whitt, III et al. |
| 9,176,900 B2 | 11/2015 | Whitt, III et al. |
| 9,176,901 B2 | 11/2015 | Whitt, III et al. |
| 9,268,373 B2 | 2/2016 | Whitt et al. |
| 9,275,809 B2 | 3/2016 | Panay et al. |
| 9,298,236 B2 | 3/2016 | Oler et al. |
| 9,304,549 B2 | 4/2016 | Siddiqui |
| 9,304,948 B2 | 4/2016 | Whitman et al. |
| 9,304,949 B2 | 4/2016 | Whitman et al. |
| 9,348,605 B2 | 5/2016 | Drasnin |
| 2001/0023818 A1* | 9/2001 | Masaru et al. ............... 200/512 |
| 2002/0005108 A1 | 1/2002 | Ludwig |
| 2002/0044216 A1 | 4/2002 | Cha |
| 2002/0070883 A1 | 6/2002 | Dosch |
| 2002/0126446 A1 | 9/2002 | Miyako et al. |
| 2002/0134828 A1 | 9/2002 | Sandbach et al. |
| 2002/0135457 A1 | 9/2002 | Sandbach et al. |
| 2002/0195177 A1 | 12/2002 | Hinkley et al. |
| 2003/0000821 A1 | 1/2003 | Takahashi et al. |
| 2003/0007648 A1 | 1/2003 | Currell |
| 2003/0011576 A1 | 1/2003 | Sandbach et al. |
| 2003/0044216 A1* | 3/2003 | Fang ................ H01H 13/702 400/491 |
| 2003/0051983 A1 | 3/2003 | Lahr |
| 2003/0067450 A1 | 4/2003 | Thursfield et al. |
| 2003/0108720 A1* | 6/2003 | Kashino ................ 428/189 |
| 2003/0160712 A1 | 8/2003 | Levy |
| 2003/0163611 A1 | 8/2003 | Nagao |
| 2003/0197687 A1 | 10/2003 | Shetter |
| 2003/0231243 A1 | 12/2003 | Shibutani |
| 2004/0005184 A1 | 1/2004 | Kim et al. |
| 2004/0046796 A1 | 3/2004 | Fujita |
| 2004/0056843 A1 | 3/2004 | Lin et al. |
| 2004/0085716 A1 | 5/2004 | Uke |
| 2004/0113956 A1 | 6/2004 | Bellwood et al. |
| 2004/0156168 A1 | 8/2004 | LeVasseur et al. |
| 2004/0160734 A1 | 8/2004 | Yim |
| 2004/0169641 A1* | 9/2004 | Bean et al. ................ 345/168 |
| 2004/0212598 A1* | 10/2004 | Kraus et al. ............... 345/168 |
| 2004/0212601 A1 | 10/2004 | Cake et al. |
| 2004/0258924 A1 | 12/2004 | Berger et al. |
| 2004/0268000 A1 | 12/2004 | Barker et al. |
| 2005/0030728 A1 | 2/2005 | Kawashima et al. |
| 2005/0047773 A1 | 3/2005 | Satake et al. |
| 2005/0052831 A1 | 3/2005 | Chen |
| 2005/0055498 A1 | 3/2005 | Beckert et al. |
| 2005/0057515 A1 | 3/2005 | Bathiche |
| 2005/0059489 A1 | 3/2005 | Kim |
| 2005/0062715 A1 | 3/2005 | Tsuji et al. |
| 2005/0099400 A1 | 5/2005 | Lee |
| 2005/0134717 A1 | 6/2005 | Misawa |
| 2005/0146512 A1 | 7/2005 | Hill et al. |
| 2005/0206737 A1 | 9/2005 | Gim et al. |
| 2005/0236848 A1 | 10/2005 | Kim et al. |
| 2005/0264653 A1 | 12/2005 | Starkweather et al. |
| 2005/0264988 A1 | 12/2005 | Nicolosi |
| 2005/0283731 A1 | 12/2005 | Saint-Hilaire et al. |
| 2006/0049920 A1 | 3/2006 | Sadler et al. |
| 2006/0085658 A1 | 4/2006 | Allen et al. |
| 2006/0092139 A1 | 5/2006 | Sharma |
| 2006/0096392 A1 | 5/2006 | Inkster et al. |
| 2006/0102020 A1* | 5/2006 | Takada ................ B41J 3/46 101/3.1 |
| 2006/0125799 A1 | 6/2006 | Hillis et al. |
| 2006/0154725 A1 | 7/2006 | Glaser et al. |
| 2006/0155391 A1 | 7/2006 | Pistemaa et al. |
| 2006/0156415 A1 | 7/2006 | Rubinstein et al. |
| 2006/0174143 A1 | 8/2006 | Sawyers et al. |
| 2006/0176377 A1 | 8/2006 | Miyasaka |
| 2006/0181514 A1 | 8/2006 | Newman |
| 2006/0187216 A1 | 8/2006 | Trent, Jr. et al. |
| 2006/0192763 A1 | 8/2006 | Ziemkowski |
| 2006/0195522 A1 | 8/2006 | Miyazaki |
| 2006/0220465 A1 | 10/2006 | Kingsmore et al. |
| 2006/0265617 A1 | 11/2006 | Priborsky |
| 2006/0267931 A1 | 11/2006 | Vainio et al. |
| 2006/0272429 A1 | 12/2006 | Ganapathi et al. |
| 2007/0003267 A1 | 1/2007 | Shibutani |
| 2007/0056385 A1 | 3/2007 | Lorenz |
| 2007/0062089 A1 | 3/2007 | Homer et al. |
| 2007/0069153 A1 | 3/2007 | Pai-Paranjape et al. |
| 2007/0072474 A1 | 3/2007 | Beasley et al. |
| 2007/0117600 A1 | 5/2007 | Robertson et al. |
| 2007/0121956 A1 | 5/2007 | Bai et al. |
| 2007/0145945 A1 | 6/2007 | McGinley et al. |
| 2007/0172229 A1 | 7/2007 | Wernersson |
| 2007/0176902 A1 | 8/2007 | Newman et al. |
| 2007/0178891 A1 | 8/2007 | Louch et al. |
| 2007/0182663 A1 | 8/2007 | Biech |
| 2007/0182722 A1 | 8/2007 | Hotelling et al. |
| 2007/0185590 A1 | 8/2007 | Reindel et al. |
| 2007/0200830 A1 | 8/2007 | Yamamoto |
| 2007/0220708 A1 | 9/2007 | Lewis |
| 2007/0222766 A1 | 9/2007 | Bolender |
| 2007/0230227 A1 | 10/2007 | Palmer |
| 2007/0234420 A1 | 10/2007 | Novotney et al. |
| 2007/0236408 A1 | 10/2007 | Yamaguchi et al. |
| 2007/0236475 A1 | 10/2007 | Wherry |
| 2007/0236873 A1 | 10/2007 | Yukawa et al. |
| 2007/0247432 A1 | 10/2007 | Oakley |
| 2007/0252674 A1 | 11/2007 | Nelson et al. |
| 2007/0260892 A1 | 11/2007 | Paul et al. |
| 2007/0268273 A1 | 11/2007 | Westerman et al. |
| 2007/0283179 A1 | 12/2007 | Burnett et al. |
| 2007/0296709 A1 | 12/2007 | Guanghai |
| 2007/0297125 A1 | 12/2007 | Maatta |
| 2007/0297625 A1 | 12/2007 | Hjort et al. |

(56) References Cited

U.S. PATENT DOCUMENTS

| | | |
|---|---|---|
| 2008/0001924 A1 | 1/2008 | de los Reyes et al. |
| 2008/0042978 A1 | 2/2008 | Perez-Noguera |
| 2008/0053222 A1 | 3/2008 | Ehrensvard et al. |
| 2008/0059888 A1 | 3/2008 | Dunko |
| 2008/0074398 A1 | 3/2008 | Wright |
| 2008/0104437 A1 | 5/2008 | Lee |
| 2008/0129520 A1 | 6/2008 | Lee |
| 2008/0151478 A1 | 6/2008 | Chern |
| 2008/0158185 A1 | 7/2008 | Westerman |
| 2008/0174570 A1 | 7/2008 | Jobs et al. |
| 2008/0186660 A1 | 8/2008 | Yang |
| 2008/0228969 A1 | 9/2008 | Cheah et al. |
| 2008/0238884 A1 | 10/2008 | Harish |
| 2008/0253822 A1 | 10/2008 | Matias |
| 2008/0273297 A1 | 11/2008 | Kumar |
| 2008/0307242 A1 | 12/2008 | Qu |
| 2008/0316002 A1 | 12/2008 | Brunet et al. |
| 2008/0316183 A1 | 12/2008 | Westerman et al. |
| 2008/0320190 A1 | 12/2008 | Lydon et al. |
| 2009/0009476 A1 | 1/2009 | Daley, III |
| 2009/0073957 A1 | 3/2009 | Newland et al. |
| 2009/0083562 A1 | 3/2009 | Park et al. |
| 2009/0089600 A1 | 4/2009 | Nousiainen |
| 2009/0096756 A1 | 4/2009 | Lube |
| 2009/0102805 A1 | 4/2009 | Meijer et al. |
| 2009/0131134 A1 | 5/2009 | Baerlocher et al. |
| 2009/0140985 A1 | 6/2009 | Liu |
| 2009/0158221 A1 | 6/2009 | Nielsen et al. |
| 2009/0174759 A1 | 7/2009 | Yeh et al. |
| 2009/0177906 A1 | 7/2009 | Paniagua, Jr. et al. |
| 2009/0189873 A1 | 7/2009 | Peterson |
| 2009/0195497 A1 | 8/2009 | Fitzgerald et al. |
| 2009/0195518 A1 | 8/2009 | Mattice et al. |
| 2009/0201254 A1 | 8/2009 | Rais |
| 2009/0207144 A1 | 8/2009 | Bridger |
| 2009/0231275 A1 | 9/2009 | Odgers |
| 2009/0239586 A1 | 9/2009 | Boeve et al. |
| 2009/0244009 A1 | 10/2009 | Staats et al. |
| 2009/0244832 A1 | 10/2009 | Behar et al. |
| 2009/0244872 A1 | 10/2009 | Yan |
| 2009/0251008 A1 | 10/2009 | Sugaya |
| 2009/0259865 A1 | 10/2009 | Sheynblat et al. |
| 2009/0262492 A1 | 10/2009 | Whitchurch et al. |
| 2009/0265670 A1 | 10/2009 | Kim et al. |
| 2009/0285491 A1 | 11/2009 | Ravenscroft et al. |
| 2009/0296331 A1 | 12/2009 | Choy |
| 2009/0303204 A1 | 12/2009 | Nasiri et al. |
| 2009/0315830 A1 | 12/2009 | Westerman |
| 2009/0320244 A1 | 12/2009 | Lin |
| 2009/0321490 A1 | 12/2009 | Groene et al. |
| 2010/0006412 A1* | 1/2010 | Wang .................... H01H 3/125 200/314 |
| 2010/0013319 A1 | 1/2010 | Kamiyama et al. |
| 2010/0023869 A1 | 1/2010 | Saint-Hilaire et al. |
| 2010/0026656 A1 | 2/2010 | Hotelling et al. |
| 2010/0038821 A1 | 2/2010 | Jenkins et al. |
| 2010/0039081 A1 | 2/2010 | Sip |
| 2010/0039764 A1 | 2/2010 | Locker et al. |
| 2010/0045633 A1 | 2/2010 | Gettemy et al. |
| 2010/0051432 A1 | 3/2010 | Lin et al. |
| 2010/0052880 A1 | 3/2010 | Laitinen et al. |
| 2010/0053534 A1 | 3/2010 | Hsieh et al. |
| 2010/0054435 A1 | 3/2010 | Louch et al. |
| 2010/0056130 A1 | 3/2010 | Louch et al. |
| 2010/0072334 A1 | 3/2010 | Le Gette et al. |
| 2010/0073329 A1 | 3/2010 | Raman et al. |
| 2010/0077237 A1 | 3/2010 | Sawyers |
| 2010/0079379 A1 | 4/2010 | Demuynck et al. |
| 2010/0083108 A1 | 4/2010 | Rider et al. |
| 2010/0085321 A1 | 4/2010 | Pundsack |
| 2010/0100752 A1 | 4/2010 | Chueh et al. |
| 2010/0102182 A1 | 4/2010 | Lin |
| 2010/0103112 A1 | 4/2010 | Yoo et al. |
| 2010/0105443 A1 | 4/2010 | Vaisanen |
| 2010/0106983 A1 | 4/2010 | Kasprzak et al. |
| 2010/0115309 A1 | 5/2010 | Carvalho et al. |
| 2010/0117993 A1 | 5/2010 | Kent |
| 2010/0123686 A1 | 5/2010 | Klinghult et al. |
| 2010/0128427 A1 | 5/2010 | Iso |
| 2010/0133398 A1 | 6/2010 | Chiu et al. |
| 2010/0142130 A1 | 6/2010 | Wang et al. |
| 2010/0146317 A1 | 6/2010 | Challener et al. |
| 2010/0148995 A1 | 6/2010 | Elias |
| 2010/0148999 A1 | 6/2010 | Casparian et al. |
| 2010/0149104 A1 | 6/2010 | Sim et al. |
| 2010/0149111 A1 | 6/2010 | Olien |
| 2010/0149377 A1 | 6/2010 | Shintani et al. |
| 2010/0156913 A1 | 6/2010 | Ortega et al. |
| 2010/0161522 A1 | 6/2010 | Tirpak et al. |
| 2010/0164857 A1 | 7/2010 | Liu et al. |
| 2010/0164897 A1 | 7/2010 | Morin et al. |
| 2010/0171891 A1 | 7/2010 | Kaji et al. |
| 2010/0174421 A1 | 7/2010 | Tsai et al. |
| 2010/0180063 A1 | 7/2010 | Ananny et al. |
| 2010/0185877 A1 | 7/2010 | Chueh et al. |
| 2010/0188299 A1 | 7/2010 | Rinehart et al. |
| 2010/0201308 A1 | 8/2010 | Lindholm |
| 2010/0205472 A1 | 8/2010 | Tupman et al. |
| 2010/0206614 A1 | 8/2010 | Park et al. |
| 2010/0207774 A1 | 8/2010 | Song |
| 2010/0220205 A1 | 9/2010 | Lee et al. |
| 2010/0222110 A1 | 9/2010 | Kim et al. |
| 2010/0231522 A1 | 9/2010 | Li |
| 2010/0235546 A1 | 9/2010 | Terlizzi et al. |
| 2010/0238620 A1 | 9/2010 | Fish |
| 2010/0250975 A1 | 9/2010 | Gill et al. |
| 2010/0250988 A1 | 9/2010 | Okuda et al. |
| 2010/0259482 A1 | 10/2010 | Ball |
| 2010/0259876 A1 | 10/2010 | Kim |
| 2010/0265182 A1 | 10/2010 | Ball et al. |
| 2010/0271771 A1 | 10/2010 | Wu et al. |
| 2010/0274932 A1 | 10/2010 | Kose |
| 2010/0279768 A1 | 11/2010 | Huang et al. |
| 2010/0289457 A1 | 11/2010 | Onnerud et al. |
| 2010/0295812 A1 | 11/2010 | Burns et al. |
| 2010/0302378 A1 | 12/2010 | Marks et al. |
| 2010/0306538 A1 | 12/2010 | Thomas et al. |
| 2010/0308778 A1 | 12/2010 | Yamazaki et al. |
| 2010/0308844 A1 | 12/2010 | Day et al. |
| 2010/0309617 A1 | 12/2010 | Wang et al. |
| 2010/0313680 A1 | 12/2010 | Joung et al. |
| 2010/0315348 A1 | 12/2010 | Jellicoe et al. |
| 2010/0315373 A1 | 12/2010 | Steinhauser et al. |
| 2010/0321877 A1 | 12/2010 | Moser |
| 2010/0324457 A1 | 12/2010 | Bean et al. |
| 2010/0325155 A1 | 12/2010 | Skinner et al. |
| 2011/0012873 A1 | 1/2011 | Prest et al. |
| 2011/0019123 A1 | 1/2011 | Prest et al. |
| 2011/0031287 A1 | 2/2011 | Le Gette et al. |
| 2011/0032127 A1 | 2/2011 | Roush |
| 2011/0036965 A1 | 2/2011 | Zhang et al. |
| 2011/0037721 A1 | 2/2011 | Cranfill et al. |
| 2011/0043990 A1 | 2/2011 | Mickey et al. |
| 2011/0050576 A1 | 3/2011 | Forutanpour et al. |
| 2011/0050626 A1 | 3/2011 | Porter et al. |
| 2011/0055407 A1 | 3/2011 | Lydon et al. |
| 2011/0057724 A1 | 3/2011 | Pabon |
| 2011/0060926 A1 | 3/2011 | Brooks et al. |
| 2011/0069148 A1 | 3/2011 | Jones et al. |
| 2011/0074688 A1 | 3/2011 | Hull et al. |
| 2011/0102326 A1 | 5/2011 | Casparian et al. |
| 2011/0102752 A1 | 5/2011 | Chen et al. |
| 2011/0107958 A1 | 5/2011 | Pance et al. |
| 2011/0108401 A1* | 5/2011 | Yamada .................. H01H 3/125 200/302.1 |
| 2011/0113368 A1 | 5/2011 | Carvajal et al. |
| 2011/0115738 A1 | 5/2011 | Suzuki et al. |
| 2011/0117970 A1 | 5/2011 | Choi |
| 2011/0134032 A1 | 6/2011 | Chiu et al. |
| 2011/0134043 A1 | 6/2011 | Chen |
| 2011/0157046 A1 | 6/2011 | Lee et al. |
| 2011/0157087 A1 | 6/2011 | Kanehira et al. |
| 2011/0163955 A1 | 7/2011 | Nasiri et al. |
| 2011/0164370 A1 | 7/2011 | McClure et al. |

(56) References Cited

U.S. PATENT DOCUMENTS

| | | |
|---|---|---|
| 2011/0167181 A1 | 7/2011 | Minoo et al. |
| 2011/0167287 A1 | 7/2011 | Walsh et al. |
| 2011/0167391 A1 | 7/2011 | Momeyer et al. |
| 2011/0169762 A1 | 7/2011 | Weiss |
| 2011/0176035 A1 | 7/2011 | Poulsen |
| 2011/0179864 A1 | 7/2011 | Raasch et al. |
| 2011/0184646 A1 | 7/2011 | Wong et al. |
| 2011/0184824 A1* | 7/2011 | George et al. ............... 705/24 |
| 2011/0188199 A1 | 8/2011 | Pan |
| 2011/0191480 A1 | 8/2011 | Kobayashi |
| 2011/0193787 A1 | 8/2011 | Morishige et al. |
| 2011/0199389 A1 | 8/2011 | Lu et al. |
| 2011/0205372 A1 | 8/2011 | Miramontes |
| 2011/0221678 A1 | 9/2011 | Davydov |
| 2011/0227913 A1 | 9/2011 | Hyndman |
| 2011/0231682 A1 | 9/2011 | Kakish et al. |
| 2011/0234494 A1 | 9/2011 | Peterson et al. |
| 2011/0241999 A1 | 10/2011 | Thier |
| 2011/0248152 A1 | 10/2011 | Svajda et al. |
| 2011/0248920 A1 | 10/2011 | Larsen |
| 2011/0248941 A1 | 10/2011 | Abdo et al. |
| 2011/0261001 A1 | 10/2011 | Liu |
| 2011/0265287 A1 | 11/2011 | Li et al. |
| 2011/0266672 A1 | 11/2011 | Sylvester |
| 2011/0267272 A1 | 11/2011 | Meyer et al. |
| 2011/0273475 A1 | 11/2011 | Herz et al. |
| 2011/0285555 A1 | 11/2011 | Bocirnea |
| 2011/0290686 A1 | 12/2011 | Huang |
| 2011/0295697 A1 | 12/2011 | Boston et al. |
| 2011/0297566 A1 | 12/2011 | Gallagher et al. |
| 2011/0298919 A1 | 12/2011 | Maglaque |
| 2011/0302518 A1 | 12/2011 | Zhang |
| 2011/0304577 A1 | 12/2011 | Brown |
| 2011/0305875 A1 | 12/2011 | Sanford et al. |
| 2011/0314425 A1 | 12/2011 | Chiang |
| 2011/0316807 A1 | 12/2011 | Corrion |
| 2011/0320204 A1 | 12/2011 | Locker et al. |
| 2012/0002820 A1 | 1/2012 | Leichter |
| 2012/0007821 A1 | 1/2012 | Zaliva |
| 2012/0020490 A1 | 1/2012 | Leichter |
| 2012/0023401 A1 | 1/2012 | Arscott et al. |
| 2012/0023459 A1 | 1/2012 | Westerman |
| 2012/0024682 A1 | 2/2012 | Huang et al. |
| 2012/0026096 A1 | 2/2012 | Ku |
| 2012/0026110 A1 | 2/2012 | Yamano |
| 2012/0032887 A1 | 2/2012 | Chiu et al. |
| 2012/0032891 A1 | 2/2012 | Parivar |
| 2012/0032901 A1 | 2/2012 | Kwon |
| 2012/0032917 A1 | 2/2012 | Yamaguchi |
| 2012/0038495 A1 | 2/2012 | Ishikawa |
| 2012/0044179 A1 | 2/2012 | Hudson |
| 2012/0047368 A1 | 2/2012 | Chinn et al. |
| 2012/0050975 A1 | 3/2012 | Garelli et al. |
| 2012/0062564 A1 | 3/2012 | Miyashita |
| 2012/0068919 A1 | 3/2012 | Lauder et al. |
| 2012/0069540 A1 | 3/2012 | Lauder et al. |
| 2012/0075249 A1 | 3/2012 | Hoch |
| 2012/0077384 A1 | 3/2012 | Bar-Niv et al. |
| 2012/0092279 A1 | 4/2012 | Martin |
| 2012/0094257 A1 | 4/2012 | Pillischer et al. |
| 2012/0099749 A1 | 4/2012 | Rubin et al. |
| 2012/0113137 A1 | 5/2012 | Nomoto |
| 2012/0113579 A1 | 5/2012 | Agata et al. |
| 2012/0117409 A1 | 5/2012 | Lee et al. |
| 2012/0127118 A1 | 5/2012 | Nolting et al. |
| 2012/0127126 A1 | 5/2012 | Mattice et al. |
| 2012/0139727 A1 | 6/2012 | Houvener et al. |
| 2012/0140396 A1 | 6/2012 | Zeliff et al. |
| 2012/0145525 A1 | 6/2012 | Ishikawa |
| 2012/0156875 A1* | 6/2012 | Srinivas ............... B23K 26/36 438/675 |
| 2012/0162693 A1 | 6/2012 | Ito |
| 2012/0175487 A1 | 7/2012 | Goto |
| 2012/0182242 A1 | 7/2012 | Lindahl et al. |
| 2012/0182249 A1 | 7/2012 | Endo et al. |
| 2012/0194448 A1 | 8/2012 | Rothkopf |
| 2012/0212438 A1 | 8/2012 | Vaisanen |
| 2012/0218194 A1 | 8/2012 | Silverman |
| 2012/0221877 A1 | 8/2012 | Prabu |
| 2012/0224073 A1 | 9/2012 | Miyahara |
| 2012/0229634 A1 | 9/2012 | Laett et al. |
| 2012/0242584 A1 | 9/2012 | Tuli |
| 2012/0246377 A1 | 9/2012 | Bhesania |
| 2012/0249443 A1 | 10/2012 | Anderson et al. |
| 2012/0250873 A1 | 10/2012 | Bakalos et al. |
| 2012/0256829 A1 | 10/2012 | Dodge |
| 2012/0256959 A1 | 10/2012 | Ye et al. |
| 2012/0260177 A1 | 10/2012 | Sehrer |
| 2012/0274811 A1 | 11/2012 | Bakin |
| 2012/0299872 A1 | 11/2012 | Nishikawa et al. |
| 2012/0300275 A1 | 11/2012 | Vilardell et al. |
| 2012/0312955 A1 | 12/2012 | Randolph |
| 2013/0009413 A1 | 1/2013 | Chiu et al. |
| 2013/0015311 A1 | 1/2013 | Kim |
| 2013/0021289 A1 | 1/2013 | Chen et al. |
| 2013/0027867 A1 | 1/2013 | Lauder et al. |
| 2013/0031353 A1 | 1/2013 | Noro |
| 2013/0038541 A1 | 2/2013 | Bakker |
| 2013/0044074 A1 | 2/2013 | Park et al. |
| 2013/0046397 A1 | 2/2013 | Fadell et al. |
| 2013/0063873 A1 | 3/2013 | Wodrich et al. |
| 2013/0067126 A1 | 3/2013 | Casparian et al. |
| 2013/0067259 A1 | 3/2013 | Freiwald et al. |
| 2013/0073877 A1 | 3/2013 | Radke |
| 2013/0076617 A1 | 3/2013 | Csaszar et al. |
| 2013/0082824 A1 | 4/2013 | Colley |
| 2013/0088431 A1 | 4/2013 | Ballagas et al. |
| 2013/0100030 A1 | 4/2013 | Los et al. |
| 2013/0100082 A1 | 4/2013 | Bakin et al. |
| 2013/0106766 A1 | 5/2013 | Yilmaz et al. |
| 2013/0118878 A1 | 5/2013 | Purcocks |
| 2013/0135214 A1 | 5/2013 | Li et al. |
| 2013/0151944 A1 | 6/2013 | Lin |
| 2013/0154959 A1 | 6/2013 | Lindsay et al. |
| 2013/0159749 A1 | 6/2013 | Moeglein et al. |
| 2013/0162554 A1 | 6/2013 | Lauder et al. |
| 2013/0172906 A1 | 7/2013 | Olson et al. |
| 2013/0191741 A1 | 7/2013 | Dickinson et al. |
| 2013/0212483 A1 | 8/2013 | Brakensiek et al. |
| 2013/0217451 A1 | 8/2013 | Komiyama et al. |
| 2013/0222272 A1 | 8/2013 | Martin, Jr. |
| 2013/0222274 A1 | 8/2013 | Mori et al. |
| 2013/0222275 A1 | 8/2013 | Byrd et al. |
| 2013/0222323 A1 | 8/2013 | McKenzie |
| 2013/0226794 A1 | 8/2013 | Englebardt |
| 2013/0227836 A1 | 9/2013 | Whitt, III |
| 2013/0228023 A1 | 9/2013 | Drasnin |
| 2013/0228433 A1 | 9/2013 | Shaw |
| 2013/0228434 A1 | 9/2013 | Whitt, III |
| 2013/0228439 A1 | 9/2013 | Whitt, III |
| 2013/0229100 A1 | 9/2013 | Siddiqui |
| 2013/0229335 A1 | 9/2013 | Whitman |
| 2013/0229347 A1 | 9/2013 | Lutz, III |
| 2013/0229350 A1 | 9/2013 | Shaw |
| 2013/0229354 A1 | 9/2013 | Whitt, III et al. |
| 2013/0229363 A1 | 9/2013 | Whitman |
| 2013/0229366 A1 | 9/2013 | Dighde |
| 2013/0229380 A1 | 9/2013 | Lutz, III |
| 2013/0229534 A1 | 9/2013 | Panay |
| 2013/0229568 A1 | 9/2013 | Belesiu |
| 2013/0229570 A1 | 9/2013 | Beck et al. |
| 2013/0229756 A1 | 9/2013 | Whitt, III |
| 2013/0229757 A1 | 9/2013 | Whitt, III et al. |
| 2013/0229758 A1 | 9/2013 | Belesiu |
| 2013/0229759 A1 | 9/2013 | Whitt, III et al. |
| 2013/0229760 A1 | 9/2013 | Whitt, III et al. |
| 2013/0229761 A1 | 9/2013 | Shaw |
| 2013/0229762 A1 | 9/2013 | Whitt, III |
| 2013/0229773 A1 | 9/2013 | Siddiqui |
| 2013/0230346 A1 | 9/2013 | Shaw |
| 2013/0231755 A1 | 9/2013 | Perek |
| 2013/0232280 A1 | 9/2013 | Perek |
| 2013/0232348 A1 | 9/2013 | Oler |
| 2013/0232349 A1 | 9/2013 | Oler |

(56) References Cited

U.S. PATENT DOCUMENTS

| | | |
|---|---|---|
| 2013/0232350 A1 | 9/2013 | Belesiu et al. |
| 2013/0232353 A1 | 9/2013 | Belesiu |
| 2013/0232571 A1 | 9/2013 | Belesiu |
| 2013/0232742 A1 | 9/2013 | Burnett et al. |
| 2013/0262886 A1 | 10/2013 | Nishimura |
| 2013/0268897 A1 | 10/2013 | Li et al. |
| 2013/0285922 A1 | 10/2013 | Alberth, Jr. et al. |
| 2013/0300590 A1 | 11/2013 | Dietz |
| 2013/0300647 A1 | 11/2013 | Drasnin |
| 2013/0301199 A1 | 11/2013 | Whitt |
| 2013/0301206 A1 | 11/2013 | Whitt |
| 2013/0304941 A1 | 11/2013 | Drasnin |
| 2013/0321992 A1 | 12/2013 | Liu et al. |
| 2013/0322000 A1 | 12/2013 | Whitt |
| 2013/0322001 A1 | 12/2013 | Whitt |
| 2013/0329360 A1 | 12/2013 | Aldana |
| 2013/0332628 A1 | 12/2013 | Panay |
| 2013/0339757 A1 | 12/2013 | Reddy |
| 2013/0342976 A1 | 12/2013 | Chung |
| 2014/0012401 A1 | 1/2014 | Perek |
| 2014/0043275 A1 | 2/2014 | Whitman |
| 2014/0048399 A1 | 2/2014 | Whitt, III |
| 2014/0085814 A1 | 3/2014 | Kielland |
| 2014/0119802 A1 | 5/2014 | Shaw |
| 2014/0139989 A1 | 5/2014 | Mori et al. |
| 2014/0167585 A1 | 6/2014 | Kuan et al. |
| 2014/0185215 A1 | 7/2014 | Whitt |
| 2014/0185220 A1 | 7/2014 | Whitt |
| 2014/0204514 A1 | 7/2014 | Whitt |
| 2014/0204515 A1 | 7/2014 | Whitt |
| 2014/0247546 A1 | 9/2014 | Whitt |
| 2014/0291134 A1 | 10/2014 | Whitt |
| 2014/0293534 A1 | 10/2014 | Siddiqui |
| 2014/0313665 A1 | 10/2014 | Delpier et al. |
| 2014/0362506 A1 | 12/2014 | Whitt, III et al. |
| 2014/0372914 A1 | 12/2014 | Byrd et al. |
| 2014/0379942 A1 | 12/2014 | Perek et al. |
| 2015/0005953 A1 | 1/2015 | Fadell et al. |
| 2015/0036274 A1 | 2/2015 | Belesui et al. |
| 2015/0227212 A1 | 8/2015 | Whitt, III et al. |
| 2015/0234478 A1 | 8/2015 | Belesiu et al. |
| 2015/0261262 A1 | 9/2015 | Whitt, III et al. |
| 2015/0311014 A1 | 10/2015 | Shaw et al. |
| 2015/0378392 A1 | 12/2015 | Siddiqui et al. |
| 2016/0124467 A1 | 5/2016 | Whitt et al. |

FOREIGN PATENT DOCUMENTS

| | | |
|---|---|---|
| CN | 1537223 | 10/2004 |
| CN | 1653411 | 8/2005 |
| CN | 1787605 | 6/2006 |
| CN | 1808362 | 7/2006 |
| CN | 101198925 | 6/2008 |
| CN | 101335147 | 12/2008 |
| CN | 101366001 | 2/2009 |
| CN | 101410781 | 4/2009 |
| CN | 101452334 | 6/2009 |
| CN | 101464750 | 6/2009 |
| CN | 101490642 | 7/2009 |
| CN | 101500388 | 8/2009 |
| CN | 101644979 | 2/2010 |
| CN | 101675406 | 3/2010 |
| CN | 101681189 | 3/2010 |
| CN | 101908428 | 12/2010 |
| CN | 102004559 | 4/2011 |
| CN | 1102012763 | 4/2011 |
| CN | 102096494 | 6/2011 |
| CN | 102112947 | 6/2011 |
| CN | 201853163 | 6/2011 |
| CN | 102117121 | 7/2011 |
| CN | 102124532 | 7/2011 |
| CN | 102138113 | 7/2011 |
| CN | 102147643 | 8/2011 |
| CN | 102214040 | 10/2011 |
| CN | 102292687 | 12/2011 |
| CN | 102356624 | 2/2012 |
| CN | 103455149 | 12/2013 |
| CN | 203606723 | 5/2014 |
| DE | 10116556 | 10/2002 |
| EP | 645726 | 3/1995 |
| EP | 1003188 | 5/2000 |
| EP | 1223722 | 7/2002 |
| EP | 1480029 | 11/2004 |
| EP | 1591891 | 11/2005 |
| EP | 1983411 | 10/2008 |
| EP | 2006869 | 12/2008 |
| EP | 2009660 | 12/2008 |
| EP | 2026178 | 2/2009 |
| EP | 2353978 | 8/2011 |
| EP | 2400365 | 12/2011 |
| EP | 2410408 | 1/2012 |
| EP | 2423787 | 2/2012 |
| GB | 2068643 | 8/1981 |
| GB | 2123213 | 1/1984 |
| GB | 2305780 | 4/1997 |
| GB | 2381584 | 5/2003 |
| GB | 2402460 | 12/2004 |
| GB | 2482932 | 2/2012 |
| JP | 52107722 | 9/1977 |
| JP | 56108127 | 8/1981 |
| JP | 6014315 | 1/1985 |
| JP | 08273471 | 10/1996 |
| JP | 10326124 | 12/1998 |
| JP | 1173239 | 3/1999 |
| JP | 11338575 | 12/1999 |
| JP | 2000010654 | 1/2000 |
| JP | 2001142564 | 5/2001 |
| JP | 2002170458 | 6/2002 |
| JP | 2004038950 | 2/2004 |
| JP | 2005117161 | 4/2005 |
| JP | 2006163459 | 6/2006 |
| JP | 2006294361 | 10/2006 |
| JP | 2010244514 | 10/2010 |
| JP | 2003077368 | 3/2014 |
| KR | 20010107055 | 12/2001 |
| KR | 20050014299 | 2/2005 |
| KR | 20060053093 | 1/2006 |
| KR | 20080006404 | 1/2008 |
| KR | 20090029411 | 3/2009 |
| KR | 20100022059 | 2/2010 |
| KR | 20100067366 | 6/2010 |
| KR | 20100115675 | 10/2010 |
| KR | 102011008717 | 8/2011 |
| KR | 20110109791 | 10/2011 |
| KR | 20110120002 | 11/2011 |
| KR | 20110122333 | 11/2011 |
| KR | 101113530 | 2/2012 |
| WO | WO-9919995 | 4/1999 |
| WO | WO-2006044818 | 4/2006 |
| WO | WO-2007103631 | 9/2007 |
| WO | WO-2007112172 | 10/2007 |
| WO | WO-2009034484 | 3/2009 |
| WO | WO-2010074116 | 7/2010 |
| WO | WO-2011049609 | 4/2011 |

OTHER PUBLICATIONS

"Non-Final Office Action", U.S. Appl. No. 13/471,001, (Feb. 19, 2013), 15 pages.

"Non-Final Office Action", U.S. Appl. No. 13/471,139, (Mar. 21, 2013), 12 pages.

"Non-Final Office Action", U.S. Appl. No. 13/471,202, (Feb. 11, 2013), 10 pages.

"Non-Final Office Action", U.S. Appl. No. 13/471,336, (Jan. 18, 2013), 14 pages.

"Non-Final Office Action", U.S. Appl. No. 13/651,195, (Jan. 2, 2013), 14 pages.

"Non-Final Office Action", U.S. Appl. No. 13/651,232, (Jan. 17, 2013), 15 pages.

"Non-Final Office Action", U.S. Appl. No. 13/651,272, (Feb. 12, 2013), 10 pages.

"Non-Final Office Action", U.S. Appl. No. 13/651,287, (Jan. 29, 2013), 13 pages.

(56) References Cited

OTHER PUBLICATIONS

"Non-Final Office Action", U.S. Appl. No. 13/651,304, (Mar. 22, 2013), 9 pages.
"Non-Final Office Action", U.S. Appl. No. 13/651,327, (Mar. 22, 2013), 6 pages.
"Non-Final Office Action", U.S. Appl. No. 13/651,871, (Mar. 18, 2013), 14 pages.
"Non-Final Office Action", U.S. Appl. No. 13/651,976, (Feb. 22, 2013), 16 pages.
"Non-Final Office Action", U.S. Appl. No. 13/653,321, (Feb. 1, 2013), 13 pages.
"Non-Final Office Action", U.S. Appl. No. 13/653,682, (Feb. 7, 2013), 11 pages.
"Notice of Allowance", U.S. Appl. No. 13/470,633, (Mar. 22, 2013), 7 pages.
"Restriction Requirement", U.S. Appl. No. 13/471,139, (Jan. 17, 2013), 7 pages.
"Restriction Requirement", U.S. Appl. No. 13/651,304, (Jan. 18, 2013), 7 pages.
"Restriction Requirement", U.S. Appl. No. 13/651,726, (Feb. 22, 2013), 6 pages.
"Restriction Requirement", U.S. Appl. No. 13/651,871, (Feb. 7, 2013), 6 pages.
"The Microsoft Surface Tablets Comes With Impressive Design and Specs", Retrieved from <http://microsofttabletreview.com/the-microsoft-surface-tablets-comes-with-impressive-design-and-specs> on Jan. 30, 2013, (Jun. 2012), 2 pages.
"Tilt Shift Lenses: Perspective Control", retrieved from http://www.cambridgeincolour.com/tutorials/tilt-shift-lenses1.htm, (Mar. 28, 2008), 11 Pages.
"What is Active Alignment?", http://www.kasalis.com/active_alignment.html, retrieved on Nov. 22, 2012, 2 Pages.
"Corrected Notice of Allowance", U.S. Appl. No. 13/470,633, (Apr. 9, 2013), 2 pages.
"Final Office Action", U.S. Appl. No. 13/651,195, (Apr. 18, 2013), 13 pages.
"Final Office Action", U.S. Appl. No. 13/651,232, (May 21, 2013), 21 pages.
"Final Office Action", U.S. Appl. No. 13/651,287, (May 3, 2013), 16 pages.
"Non-Final Office Action", U.S. Appl. No. 13/651,726, (Apr. 15, 2013), 6 pages.
"Non-Final Office Action", U.S. Appl. No. 13/653,682, (Jun. 3, 2013), 14 pages.
"Non-Final Office Action", U.S. Appl. No. 13/656,055, (Apr. 23, 2013), 11 pages.
"Notice of Allowance", U.S. Appl. No. 13/471,202, (May 28, 2013), 7 pages.
"Notice of Allowance", U.S. Appl. No. 13/651,272, (May 2, 2013), 7 pages.
"Notice of Allowance", U.S. Appl. No. 13/651,726, (May 31, 2013), 5 pages.
"Accessing Device Sensors", retrieved from <https://developer.palm.com/content/api/dev-guide/pdk/accessing-device-sensors.html>on May 25, 2012, 4 pages.
"First One Handed Fabric Keyboard with Bluetooth Wireless Technology", Retrieved from: <http://press.xtvworld.com/article3817.html> on May 8, 2012,(Jan. 6, 2005), 2 pages.
"Force and Position Sensing Resistors: An Emerging Technology", *Interlink Electronics*, Available at <http://staff.science.uva.nl/~vlaander/docu/FSR/An_Exploring_Technology.pdf>,(Feb. 1990), pp. 1-6.
"Frogpad Introduces Weareable Fabric Keyboard with Bluetooth Technology", Retrieved from: <http://www.geekzone.co.nz/contentasp?contentid=3898> on May 7, 2012,(Jan. 7, 2005), 3 pages.
"Incipio LG G-Slate Premium Kickstand Case—Black Nylon", Retrieved from: <http://www.amazon.com/Incipio-G-Slate-Premium-Kickstand-Case/dp/B004ZKP916> on May 8, 2012, 4 pages.
"Membrane Keyboards & Membrane Keypads", Retrieved from: <http://www.pannam.com/> on May 9, 2012,(Mar. 4, 2009), 2 pages.

"Motion Sensors", *Android Developers*, retrieved from <http://developer.android.com/guide/topics/sensors/sensors_motion.html> on May 25, 2012, 7 pages.
"Position Sensors", *Android Developers*, retrieved from <http://developer.android.com/guide/topics/sensors/sensors_position.html> on May 25, 2012, 5 pages.
"SolRxTM E-Series Multidirectional Phototherapy ExpandableTM 2-Bulb Full Body Panel System", Retrieved from: <http://www.solarcsystems.com/us_multidirectional_uv_light_therapy_1_intro.html> on Jul. 25, 2012,(2011), 4 pages.
"Virtualization Getting Started Guide", *Red Hat Enterprise Linux 6, Edition 0.2*, retrieved from <http://docs.redhat.com/docs/en-US/Red_Hat_Enterprise_Linux/6/html-single/Virtualization_Getting_Started_Guide/index.html> on Jun. 13, 2012, 24 pages.
Block, Steve et al., "DeviceOrientation Event Specification", *W3C, Editor's Draft*, retrieved from <https://developer.palm.com/content/api/dev-guide/pdk/accessing-device-sensors.html> on May 25, 2012,(Jul. 12, 2011), 14 pages.
Brown, Rich "Microsoft Shows Off Pressure-Sensitive Keyboard", retrieved from <http://news.cnet.com/8301-17938_105-10304792-1.html> on May 7, 2012, (Aug. 6, 2009), 2 pages.
Butler, Alex et al., "SideSight: Multi-"touch" Interaction around Small Devices", *In the proceedings of the 21st annual ACM symposium on User interface software and technology.*, retrieved from <http://research.microsoft.com/pubs/132534/sidesight_crv3.pdf> on May 29, 2012,(Oct. 19, 2008), 4 pages.
Crider, Michael "Sony Slate Concept Tablet "Grows" a Kickstand", Retrieved from: <http://androidcommunity.com/sony-slate-concept-tablet-grows-a-kickstand-20120116/>on May 4, 2012,(Jan. 16, 2012), 9 pages.
Dietz, Paul H., et al., "A Practical Pressure Sensitive Computer Keyboard", In Proceedings of UIST 2009,(Oct. 2009), 4 pages.
Glatt, Jeff "Channel and Key Pressure (Aftertouch).", Retrieved from: <http://home.roadrunner.com/~jgglatt/tutr/touch.htm> on Jun. 1, 2012, 2 pages.
Hanlon, Mike "ElekTex Smart Fabric Keyboard Goes Wireless", Retrieved from: <http://www.gizmag.com/go/5048/> on May 7, 2012,(Jan. 15, 2006), 5 pages.
Kaur, Sukhmani "Vincent Liew's redesigned laptop satisfies ergonomic needs", Retrieved from: <http://www.designbuzz.com/entry/vincent-liew-s-redesigned-laptop-satisfies-ergonomic-needs/> on Jul. 27, 2012,(Jun. 21, 2010), 4 pages.
Khuntontong, Puttachat et al., "Fabrication of Molded Interconnection Devices by Ultrasonic Hot Embossing on Thin Polymer Films", IEEE Transactions on Electronics Packaging Manufacturing, vol. 32, No. 3,(Jul. 2009), pp. 152-156.
Linderholm, Owen "Logitech Shows Cloth Keyboard for PDAs", Retrieved from: <http://www.pcworld.com/article/89084/logitech_shows_cloth_keyboard_for_pdas.html>on May 7, 2012,(Mar. 15, 2002), 5 pages.
McLellan, Charles "Eleksen Wireless Fabric Keyboard: a first look", Retrieved from: <http://www.zdnetasia.com/eleksen-wireless-fabric-keyboard-a-first-look-40278954.htm> on May 5, 2012,(Jul. 17, 2006), 9 pages.
Post, E.R. et al., "E-Broidery: Design and Fabrication of Textile-Based Computing", IBM Systems Journal, vol. 39, Issue 3 & 4,(Jul. 2000), pp. 840-860.
Purcher, Jack "Apple is Paving the Way for a New 3D GUI for IOS Devices", Retrieved from: <http://www.patentlyapple.com/patently-apple/2012/01/apple-is-paving-the-way-for-a-new-3d-gui-for-ios-devices.html> on Jun. 4, 2012,(Jan. 12, 2012), 15 pages.
Takamatsu, Seiichi et al., "Flexible Fabric Keyboard with Conductive Polymer-Coated Fibers", In Proceedings of Sensors 2011,(Oct. 28, 2011), 4 pages.
Zhang, et al., "Model-Based Development of Dynamically Adaptive Software", *In Proceedings of ICSE 2006*, Available at <http://www.irisa.fr/lande/lande/icse-proceedings/icse/p371.pdf>,(May 20, 2006), pp. 371-380.
"Corrected Notice of Allowance",U.S. Appl. No. 13/470,633, (Jul. 2, 2013), 2 pages.
"Final Office Action", U.S. Appl. No. 13/471,001, (Jul. 25, 2013), 20 pages.

(56) References Cited

OTHER PUBLICATIONS

"Final Office Action", U.S. Appl. No. 13/471,336, (Aug. 28, 2013), 18 pages.
"Final Office Action", U.S. Appl. No. 13/651,976, (Jul. 25, 2013), 21 pages.
"Final Office Action", U.S. Appl. No. 13/653,321, (Aug. 2, 2013), 17 pages.
"Non-Final Office Action", U.S. Appl. No. 13/527,263, (Jul. 19, 2013), 5 pages.
"Non-Final Office Action", U.S. Appl. No. 13/563,435, (Jun. 14, 2013), 6 pages.
"Non-Final Office Action", U.S. Appl. No. 13/564,520, (Jun. 19, 2013), 8 pages.
"Non-Final Office Action", U.S. Appl. No. 13/565,124, (Jun. 17, 2013), 5 pages.
"Non-Final Office Action", U.S. Appl. No. 13/651,871, (Jul. 1, 2013), 5 pages.
"Non-Final Office Action", U.S. Appl. No. 13/938,930, (Aug. 29, 2013), 9 pages.
"Non-Final Office Action", U.S. Appl. No. 13/939,002, (Aug. 28, 2013), 6 pages.
"Non-Final Office Action", U.S. Appl. No. 13/939,032, (Aug. 29, 2013), 7 pages.
"Notice of Allowance", U.S. Appl. No. 13/651,195, (Jul. 8, 2013), 9 pages.
"Notice of Allowance", U.S. Appl. No. 13/651,304, (Jul. 1, 2013), 5 pages.
"Notice of Allowance", U.S. Appl. No. 13/651,327, (Jun. 11, 2013), 7 pages.
"PCT Search Report and Written Opinion", Application No. PCT/US2013/029461, (Jun. 21, 2013), 11 pages.
"PCT Search Report and Written Opinion", Application No. PCT/US2013/028948, (Jun. 21, 2013), 11 pages.
"Advanced Configuration and Power Management Specification", *Intel Corporation, Microsoft Corporation, Toshiba Corp. Revision 1*, (Dec. 22, 1996), 364 pages.
"Corrected Notice of Allowance", U.S. Appl. No. 13/651,327, (Sep. 12, 2013), 2 pages.
"Corrected Notice of Allowance", U.S. Appl. No. 13/651,327, (Sep. 23, 2013), 2 pages.
"Corrected Notice of Allowance", U.S. Appl. No. 13/651,726, (Sep. 17, 2013), 2 pages.
"Final Office Action", U.S. Appl. No. 13/471,139, (Sep. 16, 2013), 13 pages.
"Final Office Action", U.S. Appl. No. 13/653,682, (Oct. 18, 2013), 16 pages.
"Final Office Action", U.S. Appl. No. 13/656,055, (Oct. 23, 2013), 14 pages.
"Final Office Action", U.S. Appl. No. 13/938,930, (Nov. 8, 2013), 10 pages.
"Final Office Action", U.S. Appl. No. 13/939,002, (Nov. 8, 2013), 7 pages.
"International Search Report and Written Opinion", Application No. PCT/US2013/040968, (Sep. 5, 2013), 12 pages.
"International Search Report and Written Opinion", Application No. PCT/US2013/042550, (Sep. 24, 2013), 14 pages.
"Non-Final Office Action", U.S. Appl. No. 13/780,228, (Oct. 30, 2013), 12 pages.
"Notice of Allowance", U.S. Appl. No. 13/563,435, (Nov. 12, 2013), 5 pages.
"Notice of Allowance", U.S. Appl. No. 13/651,871, (Oct. 2, 2013), 7 pages.
"Notice to Grant", CN Application No. 201320097089.9, (Sep. 29, 2013), 2 Pages.
"Notice to Grant", CN Application No. 201320097124.7, (Oct. 8, 2013), 2 pages.
"Welcome to Windows 7", Retrieved from: <http://www.microsoft.com/en-us/download/confirmation.aspx?id=4984> on Aug. 1, 2013, (Sep. 16, 2009), 3 pages.

Prospero, Michael "Samsung Outs Series 5 Hybrid PC Tablet", Retrieved from: <http://blog.laptopmag.com/samsung-outs-series-5-hybrid-pc-tablet-running-windows-8> on Oct. 31, 2013, (Jun. 4, 2012), 7 pages.
"Non-Final Office Action", U.S. Appl. No. 14/063,912, Jan. 2, 2014, 10 pages.
"FingerWorks Installation and Operation Guide for the TouchStream ST and TouchStream LP", FingerWorks, Inc. Retrieved from <http://ec1.images-amazon.com/media/i3d/01/A/man-migrate/MANUAL000049862.pdf>, 2002, 14 pages.
"Non-Final Office Action", U.S. Appl. No. 13/651,232, Dec. 5, 2013, 15 pages.
"Non-Final Office Action", U.S. Appl. No. 13/468,918, Dec. 26, 2013, 18 pages.
"Corrected Notice of Allowance", U.S. Appl. No. 13/563,435, Jan. 14, 2014, 2 pages.
"Corrected Notice of Allowance", U.S. Appl. No. 13/563,435, Jan. 22, 2014, 2 pages.
"Notice of Allowance", U.S. Appl. No. 13/653,321, Dec. 18, 2013, 41 pages.
"Foreign Office Action", Chinese Application No. 201320097066.8, Oct. 24, 2013, 5 Pages.
"Non-Final Office Action", U.S. Appl. No. 13/939,002, Dec. 20, 2013, 5 pages.
"Final Office Action", U.S. Appl. No. 13/939,032, Dec. 20, 2013, 5 pages.
"Restriction Requirement", U.S. Appl. No. 13/468,918, Nov. 29, 2013, 6 pages.
"Notice of Allowance", U.S. Appl. No. 13/565,124, Dec. 24, 2013, 6 pages.
"Final Office Action", U.S. Appl. No. 13/564,520, Jan. 15, 2014, 7 pages.
"Non-Final Office Action", U.S. Appl. No. 13/653,682, Feb. 26, 2014, 10 pages.
"Advisory Action", U.S. Appl. No. 13/939,032, Feb. 24, 2014, 2 pages.
"Non-Final Office Action", U.S. Appl. No. 13/599,635, Feb. 25, 2014, 13 pages.
"Non-Final Office Action", U.S. Appl. No. 13/471,186, Feb. 27, 2014, 8 pages.
"Non-Final Office Action", U.S. Appl. No. 13/471,405, Feb. 20, 2014, 37 pages.
"Non-Final Office Action", U.S. Appl. No. 13/564,520, Feb. 14, 2014, 5 pages.
"Non-Final Office Action", U.S. Appl. No. 13/656,055, Mar. 12, 2014, 17 pages.
"Notice of Allowance", U.S. Appl. No. 13/471,139, Mar. 17, 2014, 4 pages.
"Notice of Allowance", U.S. Appl. No. 13/938,930, Feb. 20, 2014, 4 pages.
"Notice of Allowance", U.S. Appl. No. 13/939,002, Mar. 3, 2014, 4 pages.
"Corrected Notice of Allowance", U.S. Appl. No. 13/563,435, Mar. 20, 2014, 2 pages.
"Corrected Notice of Allowance", U.S. Appl. No. 13/565,124, Apr. 3, 2014, 4 pages.
"Corrected Notice of Allowance", U.S. Appl. No. 13/565,124, Mar. 10, 2014, 2 pages.
"Corrected Notice of Allowance", U.S. Appl. No. 13/565,124, Apr. 14, 2014, 2 pages.
"Corrected Notice of Allowance", U.S. Appl. No. 13/938,930, May 6, 2014, 2 pages.
"Corrected Notice of Allowance", U.S. Appl. No. 13/939,002, May 5, 2014, 2 pages.
"Final Office Action", U.S. Appl. No. 13/780,228, Mar. 28, 2014, 13 pages.
"Final Office Action", U.S. Appl. No. 14/063,912, Apr. 29, 2014, 10 pages.
"Final Office Action", U.S. Appl. No. 14/199,924, May 6, 2014, 5 pages.
"Foreign Office Action", CN Application No. 201320328022.1, Feb. 17, 2014, 4 Pages.

(56) References Cited

OTHER PUBLICATIONS

"Foreign Office Action", CN Application No. 201320328022.1, Oct. 18, 2013, 3 Pages.
"Non-Final Office Action", U.S. Appl. No. 13/471,237, Mar. 24, 2014, 7 pages.
"Non-Final Office Action", U.S. Appl. No. 13/471,336, May 7, 2014, 17 pages.
"Non-Final Office Action", U.S. Appl. No. 13/471,376, Apr. 2, 2014, 17 pages.
"Non-Final Office Action", U.S. Appl. No. 13/492,232, Apr. 30, 2014, 9 pages.
"Non-Final Office Action", U.S. Appl. No. 13/527,263, Apr. 3, 2014, 6 pages.
"Non-Final Office Action", U.S. Appl. No. 14/199,924, Apr. 10, 2014, 6 pages.
"Non-Final Office Action", U.S. Appl. No. 14/200,595, Apr. 11, 2014, 4 pages.
"Notice of Allowance", U.S. Appl. No. 13/651,232, Apr. 25, 2014, 9 pages.
"Notice of Allowance", U.S. Appl. No. 13/651,287, May 2, 2014, 6 pages.
"Notice of Allowance", U.S. Appl. No. 13/939,032, Apr. 3, 2014, 4 pages.
"Supplemental Notice of Allowance", U.S. Appl. No. 13/653,321, Mar. 28, 2014, 4 pages.
"Advisory Action", U.S. Appl. No. 14/199,924, May 28, 2014, 2 pages.
"Corrected Notice of Allowance", U.S. Appl. No. 13/471,030, Sep. 30, 2014, 2 pages.
"Corrected Notice of Allowance", U.S. Appl. No. 13/651,232, Jul. 31, 2014, 2 pages.
"Corrected Notice of Allowance", U.S. Appl. No. 13/651,287, Aug. 21, 2014, 2 pages.
"Corrected Notice of Allowance", U.S. Appl. No. 13/938,930, Jun. 6, 2014, 2 pages.
"Corrected Notice of Allowance", U.S. Appl. No. 13/939,002, May 22, 2014, 2 pages.
"Corrected Notice of Allowance", U.S. Appl. No. 13/939,002, Jun. 19, 2014, 2 pages.
"Corrected Notice of Allowance", U.S. Appl. No. 13/939,032, Jun. 26, 2014, 2 pages.
"Corrected Notice of Allowance", U.S. Appl. No. 13/939,032, Jul. 15, 2014, 2 pages.
"Corrected Notice of Allowance", U.S. Appl. No. 14/199,924, Aug. 29, 2014, 2 pages.
"Corrected Notice of Allowance", U.S. Appl. No. 14/199,924, Sep. 5, 2014, 2 pages.
"Corrected Notice of Allowance", U.S. Appl. No. 14/199,924, Sep. 19, 2014, 2 pages.
"Final Office Action", U.S. Appl. No. 13/468,949, Oct. 6, 2014, 11 pages.
"Final Office Action", U.S. Appl. No. 13/471,054, Oct. 23, 2014, 17 pages.
"Final Office Action", U.S. Appl. No. 13/471,336, Oct. 6, 2014, 13 pages.
"Final Office Action", U.S. Appl. No. 13/471,376, Aug. 18, 2014, 24 pages.
"Final Office Action", U.S. Appl. No. 13/595,700, Aug. 15, 2014, 6 pages.
"Final Office Action", U.S. Appl. No. 13/595,700, Oct. 9, 2014, 8 pages.
"Final Office Action", U.S. Appl. No. 13/599,635, Aug. 8, 2014, 16 pages.
"Final Office Action", U.S. Appl. No. 13/653,682, Jun. 11, 2014, 11 pages.
"Final Office Action", U.S. Appl. No. 13/656,055, Sep. 17, 2014, 10 pages.
"Foreign Notice of Allowance", CN Application No. 201320096755.7, Jan. 27, 2014, 2 pages.
"Foreign Notice of Allowance", CN Application No. 201320097065.3, Nov. 21, 2013, 2 pages.
"Foreign Office Action", CN Application No. 201320097065.3, Jun. 18, 2013, 2 pages.
"Foreign Office Action", CN Application No. 201320097079.5, Sep. 26, 2013, 4 pages.
"Interlink Electronics FSR (TM) Force Sensing Resistors (TM)", Retrieved at <<http://akizukidenshi.com/download/ds/ interlinkelec/ 94-00004+Rev+B%20FSR%20 1ntegration%20Guide.pdf on Mar. 21, 2013, 36 pages.
"International Search Report and Written Opinion", Application No. PCT/US2014/031531, Jun. 20, 2014, 10 Pages.
"International Search Report and Written Opinion", Application No. PCT/US2013/028483, Jun. 24, 2014, 10 pages.
"International Search Report and Written Opinion", Application No. PCT/US2013/028484, Jun. 24, 2014, 10 pages.
"International Search Report and Written Opinion", Application No. PCT/US2013/028485, Jun. 25, 2014, 10 pages.
"International Search Report and Written Opinion", Application No. PCT/US2013/028769, Jun. 26, 2014, 10 pages.
"International Search Report and Written Opinion", Application No. PCT/US2013/028771, Jun. 19, 2014, 10 pages.
"International Search Report and Written Opinion", Application No. PCT/US2013/028486, Jun. 20, 2014, 10 pages.
"International Search Report and Written Opinion", Application No. PCT/US2013/041017, Jul. 17, 2014, 10 pages.
"International Search Report and Written Opinion", Application No. PCT/US2013/028489, Jun. 20, 2014, 11 pages.
"International Search Report and Written Opinion", Application No. PCT/US2013/028488, Jun. 24, 2014, 11 pages.
"International Search Report and Written Opinion", Application No. PCT/US2013/028767, Jun. 24, 2014, 11 pages.
"International Search Report and Written Opinion", Application No. PCT/US2013/028481, Jun. 19, 2014, 11 pages.
"International Search Report and Written Opinion", Application No. PCT/US2013/028490, Jun. 24, 2014, 11 pages.
"International Search Report and Written Opinion", Application No. PCT/US2013/028766, Jun. 26, 2014, 11 pages.
"International Search Report and Written Opinion", Application No. PCT/US2013/028772, Jun. 30, 2014, 11 pages.
"International Search Report and Written Opinion", Application No. PCT/US2013/028768, Jun. 24, 2014, 12 pages.
"International Search Report and Written Opinion", Application No. PCT/US2013/028482, Jun. 20, 2014, 13 pages.
"International Search Report and Written Opinion", Application No. PCT/US2013/028487, May 27, 2014, 9 pages.
"International Search Report and Written Opinion", Application No. PCT/US2013/028770, Jun. 26, 2014, 9 pages.
"International Search Report and Written Opinion", PCT App PCT/US2014/043546, Oct. 9, 2014, 10 pages.
"Non-Final Office Action", U.S. Appl. No. 13/468,882, Jul. 9, 2014, 9 pages.
"Non-Final Office Action", U.S. Appl. No. 13/468,949, Jun. 20, 2014, 10 pages.
"Non-Final Office Action", U.S. Appl. No. 13/471,001, Jun. 17, 2014, 23 pages.
"Non-Final Office Action", U.S. Appl. No. 13/471,030, May 15, 2014, 10 pages.
"Non-Final Office Action", U.S. Appl. No. 13/471,054, Jun. 3, 2014, 15 pages.
"Non-Final Office Action", U.S. Appl. No. 13/471,282, Sep. 3, 2014, 13 pages.
"Non-Final Office Action", U.S. Appl. No. 13/471,393, Oct. 20, 2014, 12 pages.
"Non-Final Office Action", U.S. Appl. No. 13/471,412, Jul. 11, 2014, 22 pages.
"Non-Final Office Action", U.S. Appl. No. 13/564,520, Jun. 16, 2014, 5 pages.
"Non-Final Office Action", U.S. Appl. No. 13/595,700, Jun. 18, 2014, 8 pages.
"Non-Final Office Action", U.S. Appl. No. 13/651,976, Jun. 16, 2014, 23 pages.

(56) References Cited

OTHER PUBLICATIONS

"Non-Final Office Action", U.S. Appl. No. 13/780,228, Sep. 15, 2014, 18 pages.
"Non-Final Office Action", U.S. Appl. No. 14/063,912, Sep. 2, 2014, 11 pages.
"Non-Final Office Action", U.S. Appl. No. 14/225,250, Jun. 17, 2014, 5 pages.
"Non-Final Office Action", U.S. Appl. No. 14/225,276, Jun. 13, 2014, 6 pages.
"Non-Final Office Action", U.S. Appl. No. 14/277,240, Jun. 13, 2014, 6 pages.
"Notice of Allowance", U.S. Appl. No. 13/468,918, Jun. 17, 2014, 5 pages.
"Notice of Allowance", U.S. Appl. No. 13/471,030, Sep. 5, 2014, 6 pages.
"Notice of Allowance", U.S. Appl. No. 13/471,186, Jul. 3, 2014, 7 pages.
"Notice of Allowance", U.S. Appl. No. 13/471,237, May 12, 2014, 8 pages.
"Notice of Allowance", U.S. Appl. No. 13/471,405, Jun. 24, 2014, 9 pages.
"Notice of Allowance", U.S. Appl. No. 13/653,682, Sep. 24, 2014, 4 pages.
"Notice of Allowance", U.S. Appl. No. 14/018,286, May 23, 2014, 8 pages.
"Notice of Allowance", U.S. Appl. No. 14/199,924, Jun. 10, 2014, 4 pages.
"Notice of Allowance", U.S. Appl. No. 14/277,240, Sep. 16, 2014, 4 pages.
"Restriction Requirement", U.S. Appl. No. 13/595,700, May 28, 2014, 6 pages.
"Supplemental Notice of Allowance", U.S. Appl. No. 13/471,405, Aug. 29, 2014, 5 pages.
"Supplemental Notice of Allowance", U.S. Appl. No. 14/018,286, Jun. 11, 2014, 5 pages.
Harrison, "UIST 2009 Student Innovation Contest—Demo Video", Retrieved From: <https://www.youtube.com/watch?v=PDI8eYIASf0> Sep. 16, 2014, Jul. 23, 2009, 1 pages.
"Corrected Notice of Allowance", U.S. Appl. No. 14/277,240, Jan. 8, 2015, 2 pages.
"Final Office Action", U.S. Appl. No. 13/468,882, Feb. 12, 2015, 9 pages.
"Final Office Action", U.S. Appl. No. 13/527,263, Jan. 27, 2015, 7 pages.
"Final Office Action", U.S. Appl. No. 14/063,912, Jan. 12, 2015, 12 pages.
"Final Office Action", U.S. Appl. No. 14/225,250, Mar. 13, 2015, 7 pages.
"First Examination Report", NZ Application No. 628690, Nov. 27, 2014, 2 pages.
"Non-Final Office Action", U.S. Appl. No. 13/471,030, Jan. 15, 2015, 7 pages.
"Non-Final Office Action", U.S. Appl. No. 13/471,054, Mar. 13, 2015, 18 pages.
"Non-Final Office Action", U.S. Appl. No. 13/471,376, Mar. 27, 2015, 28 pages.
"Non-Final Office Action", U.S. Appl. No. 13/471,393, Mar. 26, 2015, 13 pages.
"Non-Final Office Action", U.S. Appl. No. 13/492,232, Feb. 24, 2015, 12 pages.
"Non-Final Office Action", U.S. Appl. No. 13/564,520, Jan. 26, 2015, 6 pages.
"Non-Final Office Action", U.S. Appl. No. 13/599,635, Feb. 12, 2015, 16 pages.
"Non-Final Office Action", U.S. Appl. No. 13/852,848, Mar. 26, 2015, 7 pages.
"Non-Final Office Action", U.S. Appl. No. 14/059,280, Mar. 3, 2015, 18 pages.
"Non-Final Office Action", U.S. Appl. No. 14/147,252, Feb. 23, 2015, 11 pages.
"Notice of Allowance", U.S. Appl. No. 13/471,030, Apr. 6, 2015, 6 pages.
"Notice of Allowance", U.S. Appl. No. 13/595,700, Jan. 21, 2015, 4 pages.
"Notice of Allowance", U.S. Appl. No. 13/651,232, Mar. 30, 2015, 7 pages.
"Notice of Allowance", U.S. Appl. No. 13/651,976, Jan. 21, 2015, 10 pages.
"Notice of Allowance", U.S. Appl. No. 13/656,055, Mar. 4, 2015, 7 pages.
"Notice of Allowance", U.S. Appl. No. 14/200,595, Feb. 17, 2015, 2 pages.
"Notice of Allowance", U.S. Appl. No. 14/200,595, Feb. 25, 2015, 4 pages.
Schaffer, "Using Interactive Maps for Navigation and Collaboration", CHI '01 Extended Abstracts on Human Factors in Computing Systems, Mar. 31, 2001, 2 pages.
"Corrected Notice of Allowance", U.S. Appl. No. 13/471,030, Aug. 10, 2015, 2 pages.
"Corrected Notice of Allowance", U.S. Appl. No. 13/564,520, Aug. 14, 2015, 2 pages.
"Corrected Notice of Allowance", U.S. Appl. No. 13/651,232, Jul. 6, 2015, 2 pages.
"Corrected Notice of Allowance", U.S. Appl. No. 13/656,055, Jul. 1, 2015, 2 pages.
"Final Office Action", U.S. Appl. No. 13/471,376, Jul. 28, 2015, 35 pages.
"Final Office Action", U.S. Appl. No. 13/492,232, Jul. 10, 2015, 11 pages.
"Final Office Action", U.S. Appl. No. 13/599,635, Jul. 30, 2015, 23 pages.
"Final Office Action", U.S. Appl. No. 13/852,848, Jul. 20, 2015, 9 pages.
"Final Office Action", U.S. Appl. No. 14/059,280, Jul. 22, 2015, 25 pages.
"Foreign Office Action", CN Application No. 201310067335.0, Jun. 12, 2015, 15 Pages.
"Foreign Office Action", CN Application No. 201310225788.1, Jun. 23, 2015, 14 Pages.
"International Preliminary Report on Patentability", Application No. PCT/US2014/031531, Jun. 9, 2015, 7 pages.
"Non-Final Office Action", U.S. Appl. No. 13/525,614, Jul. 31, 2015, 20 pages.
"Non-Final Office Action", U.S. Appl. No. 14/225,276, Aug. 19, 2015, 9 pages.
"Non-Final Office Action", U.S. Appl. No. 14/727,001, Jul. 10, 2015, 7 pages.
"Notice of Allowance", U.S. Appl. No. 14/457,881, Jul. 22, 2015, 7 pages.
"Supplemental Notice of Allowance", U.S. Appl. No. 13/468,918, Aug. 7, 2015, 4 pages.
Cunningham,"Software Infrastructure for Natural Language Processing", In Proceedings of the fifth conference on Applied natural language processing, Mar. 31, 1997, pp. 237-244.
"Corrected Notice of Allowance", U.S. Appl. No. 13/651,232, Apr. 24, 2015, 2 pages.
"Corrected Notice of Allowance", U.S. Appl. No. 13/651,232, Jun. 10, 2015, 2 pages.
"Corrected Notice of Allowance", U.S. Appl. No. 13/656,055, Apr. 13, 2015, 2 pages.
"Corrected Notice of Allowance", U.S. Appl. No. 14/200,595, Jun. 4, 2015, 3 pages.
"Final Office Action", U.S. Appl. No. 13/525,614, Apr. 29, 2015, 20 pages.
"Final Office Action", U.S. Appl. No. 13/780,228, Apr. 10, 2015, 19 pages.
"Final Office Action", U.S. Appl. No. 14/147,252, Jun. 25, 2015, 11 pages.
"Foreign Notice on Reexamination", CN Application No. 201320097066.8, Apr. 3, 2015, 7 Pages.
"Foreign Office Action", CN Application No. 201310067808.7, May 28, 2015, 14 Pages.

(56) References Cited

OTHER PUBLICATIONS

"Non-Final Office Action", U.S. Appl. No. 13/471,336, Jun. 24, 2015, 15 pages.
"Non-Final Office Action", U.S. Appl. No. 13/471,412, Jun. 1, 2015, 31 pages.
"Non-Final Office Action", U.S. Appl. No. 14/063,912, May 7, 2015, 12 pages.
"Non-Final Office Action", U.S. Appl. No. 14/225,276, Apr. 23, 2015, 7 pages.
"Notice of Allowance", U.S. Appl. No. 13/468,949, Apr. 24, 2015, 9 pages.
"Notice of Allowance", U.S. Appl. No. 13/468,918, Apr. 8, 2015, 7 pages.
"Notice of Allowance", U.S. Appl. No. 13/468,949, Apr. 24, 2015, 8 pages.
"Notice of Allowance", U.S. Appl. No. 13/471,282, Apr. 30, 2015, 8 pages.
"Notice of Allowance", U.S. Appl. No. 13/564,520, May 8, 2015, 4 pages.
"Notice of Allowance", U.S. Appl. No. 14/225,276, Jun. 22, 2015, 4 pages.
"Supplemental Notice of Allowance", U.S. Appl. No. 13/468,918, Jun. 4, 2015, 2 pages.
"Supplemental Notice of Allowance", U.S. Appl. No. 13/468,949, Jun. 5, 2015, 2 pages.
"Supplemental Notice of Allowance", U.S. Appl. No. 13/595,700, Apr. 10, 2015, 2 pages.
"Supplemental Notice of Allowance", U.S. Appl. No. 13/595,700, May 4, 2015, 2 pages.
"Supplemental Notice of Allowance", U.S. Appl. No. 13/595,700, May 22, 2015, 2 pages.
"Supplemental Notice of Allowance", U.S. Appl. No. 13/656,055, May 15, 2015, 2 pages.
"Supplemental Notice of Allowance", U.S. Appl. No. 13/656,055, Jun. 10, 2015, 2 pages.
"Final Office Action", U.S. Appl. No. 13/471,412, Dec. 15, 2014, 11 pages.
"Final Office Action", U.S. Appl. No. 13/492,232, Nov. 17, 2014, 13 pages.
"Final Office Action", U.S. Appl. No. 14/200,595, Nov. 19, 2014, 5 pages.
"Final Office Action", U.S. Appl. No. 14/225,276, Dec. 17, 2014, 6 pages.
"Foreign Office Action", CN Application No. 201320097079.5, Jul. 28, 2014, 4 pages.
"Non-Final Office Action", U.S. Appl. No. 13/525,614, Nov. 24, 2014, 19 pages.
"Restriction Requirement", U.S. Appl. No. 14/147,252, Dec. 1, 2014, 6 pages.
"Supplemental Notice of Allowance", U.S. Appl. No. 13/471,405, Dec. 17, 2014, 5 pages.
"Advisory Action", U.S. Appl. No. 13/471,376, Sep. 23, 2015, 7 pages.
"Advisory Action", U.S. Appl. No. 14/059,280, Sep. 25, 2015, 7 pages.
"Corrected Notice of Allowance", U.S. Appl. No. 13/527,263, Jan. 4, 2016, 2 pages.
"Corrected Notice of Allowance", U.S. Appl. No. 13/564,520, Sep. 17, 2015, 2 pages.
"Corrected Notice of Allowance", U.S. Appl. No. 14/225,276, Aug. 27, 2015, 2 pages.
"Corrected Notice of Allowance", U.S. Appl. No. 14/225,276, Sep. 29, 2015, 2 pages.
"Corrected Notice of Allowance", U.S. Appl. No. 14/457,881, Aug. 20, 2015, 2 pages.
"Corrected Notice of Allowance", U.S. Appl. No. 14/457,881, Oct. 2, 2015, 2 pages.
"Corrected Notice of Allowance", U.S. Appl. No. 14/727,001, Dec. 15, 2015, 2 pages.
"Decision on Reexamination", CN Application No. 201320097079.5, Sep. 7, 2015, 8 Pages.
"Extended European Search Report", EP Application No. 13858283.8, Nov. 23, 2015, 10 pages.
"Extended European Search Report", EP Application No. 13858397.6, Nov. 30, 2015, 7 pages.
"Extended European Search Report", EP Application No. 13858620.1, Sep. 18, 2015, 6 pages.
"Extended European Search Report", EP Application No. 13858674.8, Nov. 27, 2015, 6 pages.
"Extended European Search Report", EP Application No. 13858834.8, Oct. 29, 2015, 8 pages.
"Extended European Search Report", EP Application No. 13859280.3, Sep. 7, 2015, 6 pages.
"Extended European Search Report", EP Application No. 13859406.4, Sep. 8, 2015, 6 pages.
"Extended European Search Report", EP Application No. 13860272.7, Dec. 14, 2015, 9 pages.
"Extended European Search Report", EP Application No. 13861292.4, Nov. 23, 2015, 7 pages.
"Final Office Action", U.S. Appl. No. 13/471,336, Dec. 10, 2015, 17 pages.
"Final Office Action", U.S. Appl. No. 13/689,541, Nov. 2, 2015, 21 pages.
"Final Office Action", U.S. Appl. No. 14/063,912, Sep. 3, 2015, 13 pages.
"Foreign Office Action", CN Application No. 201310065273.X, Oct. 28, 2015, 14 pages.
"Foreign Office Action", CN Application No. 201310067385.9, Aug. 6, 2015, 16 pages.
"Foreign Office Action", CN Application No. 201310067429.8, Nov. 25, 2015, 12 Pages.
"Foreign Office Action", CN Application No. 201310067592.4, Oct. 23, 2015, 12 Pages.
"Foreign Office Action", CN Application No. 201310067622.1, Oct. 27, 2015, 14 pages.
"Foreign Office Action", CN Application No. 201310067627.4, Sep. 28, 2015, 14 pages.
"Foreign Office Action", CN Application No. 201310067631.0, Dec. 10, 2015, 11 Pages.
"Foreign Office Action", CN Application No. 201310096345.7, Oct. 19, 2015, 16 Pages.
"Foreign Office Action", CN Application No. 201310316114.2, Sep. 29, 2015, 13 pages.
"Non-Final Office Action", U.S. Appl. No. 13/468,882, Nov. 13, 2015, 9 pages.
"Non-Final Office Action", U.S. Appl. No. 13/471,393, Sep. 30, 2015, 15 pages.
"Non-Final Office Action", U.S. Appl. No. 13/492,232, Dec. 17, 2015, 11 pages.
"Non-Final Office Action", U.S. Appl. No. 13/780,228, Sep. 18, 2015, 19 pages.
"Non-Final Office Action", U.S. Appl. No. 14/162,529, Sep. 18, 2015, 13 pages.
"Non-Final Office Action", U.S. Appl. No. 14/225,250, Aug. 19, 2015, 9 pages.
"Notice of Allowance", U.S. Appl. No. 13/471,054, Sep. 25, 2015, 7 pages.
"Notice of Allowance", U.S. Appl. No. 13/471,376, Nov. 23, 2015, 9 pages.
"Notice of Allowance", U.S. Appl. No. 13/471,412, Nov. 20, 2015, 10 pages.
"Notice of Allowance", U.S. Appl. No. 13/527,263, Dec. 9, 2015, 6 pages.
"Notice of Allowance", U.S. Appl. No. 13/852,848, Nov. 19, 2015, 4 pages.
"Notice of Allowance", U.S. Appl. No. 14/059,280, Nov. 23, 2015, 9 pages.
"Notice of Allowance", U.S. Appl. No. 14/727,001, Oct. 2, 2015, 4 pages.
"Notice of Allowance", U.S. Appl. No. 14/727,001, Dec. 15, 2015, 2 pages.

(56) References Cited

OTHER PUBLICATIONS

"Restriction Requirement", U.S. Appl. No. 14/794,182, Dec. 22, 2015, 6 pages.
"Supplemental Notice of Allowance", U.S. Appl. No. 13/468,949, Sep. 14, 2015, 2 pages.
"Supplemental Notice of Allowance", U.S. Appl. No. 13/471,054, Nov. 19, 2015, 2 pages.
"Supplementary European Search Report", EP Application No. 13728568.0, Oct. 30, 2015, 7 pages.
"Corrected Notice of Allowance", U.S. Appl. No. 13/471,054, Jan. 11, 2016, 2 pages.
"Corrected Notice of Allowance", U.S. Appl. No. 13/471,412, Feb. 16, 2016, 2 pages.
"Corrected Notice of Allowance", U.S. Appl. No. 13/527,263, Jan. 11, 2016, 2 pages.
"Corrected Notice of Allowance", U.S. Appl. No. 13/852,848, Jan. 29, 2016, 2 pages.
"Corrected Notice of Allowance", U.S. Appl. No. 14/727,001, Jan. 25, 2016, 2 pages.
"Extended European Search Report", EP Application No. 13857958.6, Dec. 18, 2015, 8 pages.
"Extended European Search Report", EP Application No. 13860836.9, Nov. 27, 2015, 9 pages.
"Final Office Action", U.S. Appl. No. 14/225,250, Jan. 29, 2016, 10 pages.
"Foreign Office Action", CN Application No. 201310067373.6, Dec. 23, 2015, 15 Pages.
"Foreign Office Action", CN Application No. 201310067641.4, Dec. 30, 2015, 12 Pages.
"Foreign Office Action", CN Application No. 201310067808.7, Jan. 7, 2016, 7 Pages.
Corrected Notice of Allowance, U.S. Appl. No. 13/471,412, filed Mar. 3, 2016, 2 pages.
Corrected Notice of Allowance, U.S. Appl. No. 13/527,263, filed Mar. 7, 2016, 2 pages.
Corrected Notice of Allowance, U.S. Appl. No. 13/852,848, filed Mar. 2, 2016, 2 pages.
Extended European Search Report, EP Application No. 13728568.0, Mar. 14, 2016, 16 pages.
Final Office Action, U.S. Appl. No. 13/471,393, filed Mar. 9, 2016, 17 pages.
Foreign Office, CN Application No. 201310067356.2, Feb. 4, 2016, 15 Pages.
Foreign Office, CN Application No. 201310067603.9, Feb. 15, 2016, 12 Pages.
Foreign Office, CN Application No. 201310225788.1, Feb. 29, 2016, 15 Pages.
Notice of Allowance, U.S. Appl. No. 14/517,048, filed Feb. 24, 2016, 8 pages.
Restriction Requirement, U.S. Appl. No. 14/307,262, filed Mar. 21, 2016, 6 pages.
Corrected Notice of Allowance, U.S. Appl. No. 13/527,263, filed Apr. 12, 2016, 2 pages.
Corrected Notice of Allowance, U.S. Appl. No. 13/527,263, filed Apr. 25, 2016, 2 pages.
Corrected Notice of Allowance, U.S. Appl. No. 14/517,048, filed Apr. 13, 2016, 2 pages.
Extended European Search Report, EP Application No. 13858403.2, Mar. 16, 2016, 12 pages.
Extended European Search Report, EP Application No. 13860271.9, May 4, 2016, 8 pages.
Extended European Search Report, EP Application No. 13861059.7, Apr. 29, 2016, 8 pages.
Final Office Action, U.S. Appl. No. 13/780,228, filed Mar. 23, 2016, 16 pages.
Foreign Notice of Allowance, CN Application No. 201310065273.X, Mar. 31, 2016, 4 Pages.
Foreign Notice of Allowance, CN Application No. 201320097079.5, Apr. 1, 2016, 4 Pages.
Foreign Notice of Allowance, CN Application No. 201310067808.7, May 4, 2016, 4 pages.
Foreign Office Action, CN Application No. 201310067385.9, Apr. 14, 2016, 14 Pages.
Foreign Office Action, CN Application No. 201310067627.4, May 3, 2016, 7 pages.
Foreign Office Action, CN Application No. 201310225788.1, Feb. 29, 2016, 11 pages.
Foreign Office Action, CN Application No. 201310316114.2, Apr. 18, 2016, 11 pages.
Non-Final Office Action, U.S. Appl. No. 13/689,541, filed Apr. 14, 2016, 23 pages.
Non-Final Office Action, U.S. Appl. No. 14/307,262, filed Apr. 20, 2016, 10 pages.
Non-Final Office Action, U.S. Appl. No. 14/794,182, filed Apr. 13, 2016, 15 pages.
Non-Final Office Action, U.S. Appl. No. 14/994,737, filed Apr. 5, 2016, 6 pages.
Final Office Action, U.S. Appl. No. 13/492,232, filed May 25, 2016, 12 pages.
Foreign Notice of Allowance, CN Application No. 201310067592.4, May 17, 2016, 4 pages.
Foreign Office Action, CL Application No. 14-211.785, Apr. 26, 2016, 12 pages.
Foreign Office Action, CN Application No. 201310096345.7, May 25, 2016, 16 Pages.
Foreign Office Action, CN Application No. 201380025290.9, May 10, 2016, 15 pages.
Notice of Allowance, U.S. Appl. No. 13/468,882, filed May 24, 2016, 5 pages.

\* cited by examiner

KEY FORMATION

RELATED APPLICATIONS

This application claims priority under 35 U.S.C. §119(e) to the following U.S. Provisional patent applications, the entire disclosures of each of these applications being incorporated by reference in their entirety:

U.S. Provisional Patent Application No. 61/606,321, filed Mar. 2, 2012, and titled "Screen Edge;"

U.S. Provisional Patent Application No. 61/606,301, filed Mar. 2, 2012, and titled "Input Device Functionality;"

U.S. Provisional Patent Application No. 61/606,313, filed Mar. 2, 2012, and titled "Functional Hinge;"

U.S. Provisional Patent Application No. 61/606,333, filed Mar. 2, 2012, and titled "Usage and Authentication;"

U.S. Provisional Patent Application No. 61/613,745, filed Mar. 21, 2012, and titled "Usage and Authentication;"

U.S. Provisional Patent Application No. 61/606,336, filed Mar. 2, 2012, and titled "Kickstand and Camera;" and U.S. Provisional Patent Application No. 61/607,451, filed Mar. 6, 2012, and titled "Spanaway Provisional;" and further this application incorporates the following application by reference in their entirety:

U.S. patent application Ser. No. 13/470,633, filed May 14, 2012, and titled "Flexible Hinge and Removable Attachment;" and U.S. patent application Ser. No. 13/471,282, filed May 14, 2012, and titled "Input Device Assembly."

BACKGROUND

Mobile computing devices have been developed to increase the functionality that is made available to users in a mobile setting. For example, a user may interact with a mobile phone, tablet computer, or other mobile computing device to check email, surf the web, compose texts, interact with applications, and so on. However, traditional mobile computing devices often employed a virtual keyboard that was accessed using touchscreen functionality of the device. This was generally employed to maximize an amount of display area of the computing device.

Use of the virtual keyboard, however, could be frustrating to a user that desired to provide a significant amount of inputs, such as to enter a significant amount of text to compose a long email, document, and so forth. Thus, conventional mobile computing devices were often perceived to have limited usefulness for such tasks, especially in comparison with ease at which users could enter text using a conventional keyboard, e.g., of a conventional desktop computer. Use of the conventional keyboards, though, with the mobile computing device could decrease the mobility of the mobile computing device and thus could make the mobile computing device less suited for its intended use in mobile settings.

SUMMARY

Key formation techniques are described. In one or more implementations, an input device includes a key assembly including a plurality of keys that are usable to initiate respective inputs for a computing device, a connection portion configured to be removably connected to the computing device physically and communicatively to communicate signals generated by the plurality of keys to the computing device, and an outer layer that is configured to cover the plurality of keys of the key assembly, the outer layer having a plurality of areas that are embossed thereon to indicate one or more borders of respective keys.

In one or more implementations, a keyboard includes a key assembly including a plurality of keys that are usable to initiate respective inputs for a computing device, a connection portion configured to be removably connected to the computing device physically and communicatively to communicate signals generated by the plurality of keys to the computing device, and an outer layer that is configured to cover the plurality of keys of the key assembly, the outer layer having an outer skin and a middle layer that is disposed beneath the outer skin, a portion of the outer skin is removed to expose the middle layer to form at least part of an indication of a function of a respective key.

In one or more implementations, an outer skin of an outer layer is embossed that is usable to cover a plurality of keys of a key assembly to indicate a border of respective said keys. A portion of the outer skin is removed to expose a middle layer of the outer layer that is disposed beneath the outer skin, the portion removed to form at least part of an indication of a function of the respective key. The key assembly is covered with the outer layer having the indication of the border and the indication of the function of the respective key.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

Overview

Input devices may be configured to support a thin form factor, such as approximately three and a half millimeters and smaller. However, because of this form factor it may be difficult using conventional configurations for a user to locate particular keys of the input device, such as to type using a QWERTY keyboard.

Key formation techniques are described. In one or more implementations, keys of an input device are formed to support a thin form factor. An input device, for instance, may be formed to include an outer surface formed from a substantially continuous piece of material such that the material covers a plurality of keys of the input device.

The outer surface may have embossed thereon indications of one or more borders of particular keys and other input elements. This embossing may be performed such that the borders have sharp edges that may be readily felt tactilely by a user. In this way, a depth of the embossing of the borders may be made shallow (e.g., approximately 0.2 mm) yet still support user feedback, thus supporting material thicknesses that are thinner than conventional thicknesses, e.g., a thickness of 0.65 mm as opposed to conventional thicknesses of over a millimeter.

Additionally, indications of functions of respective keys (e.g., letters, numbers, punctuation, and so on) may also be configured to support this form factor. For example, a layer may be disposed beneath the outer surface described above. The indications may then be formed by using a laser to cut through the outer surface to expose an underlying layer, e.g., which may have a different color than a color of the outer surface. Further, due to the thickness of the outer layer the material removal performed by the laser (e.g., the cuts of the indications) may be performed quickly and cleanly, thereby supporting an efficient manufacturing process. Further discussion of these techniques may be found in relation to the following sections beginning at FIG. 20.

In the following discussion, an example environment is first described that may employ the techniques described herein. Example procedures are then described which may be performed in the example environment as well as other environments. Consequently, performance of the example procedures is not limited to the example environment and the example environment is not limited to performance of the example procedures.

Example Environment

Figure 1:
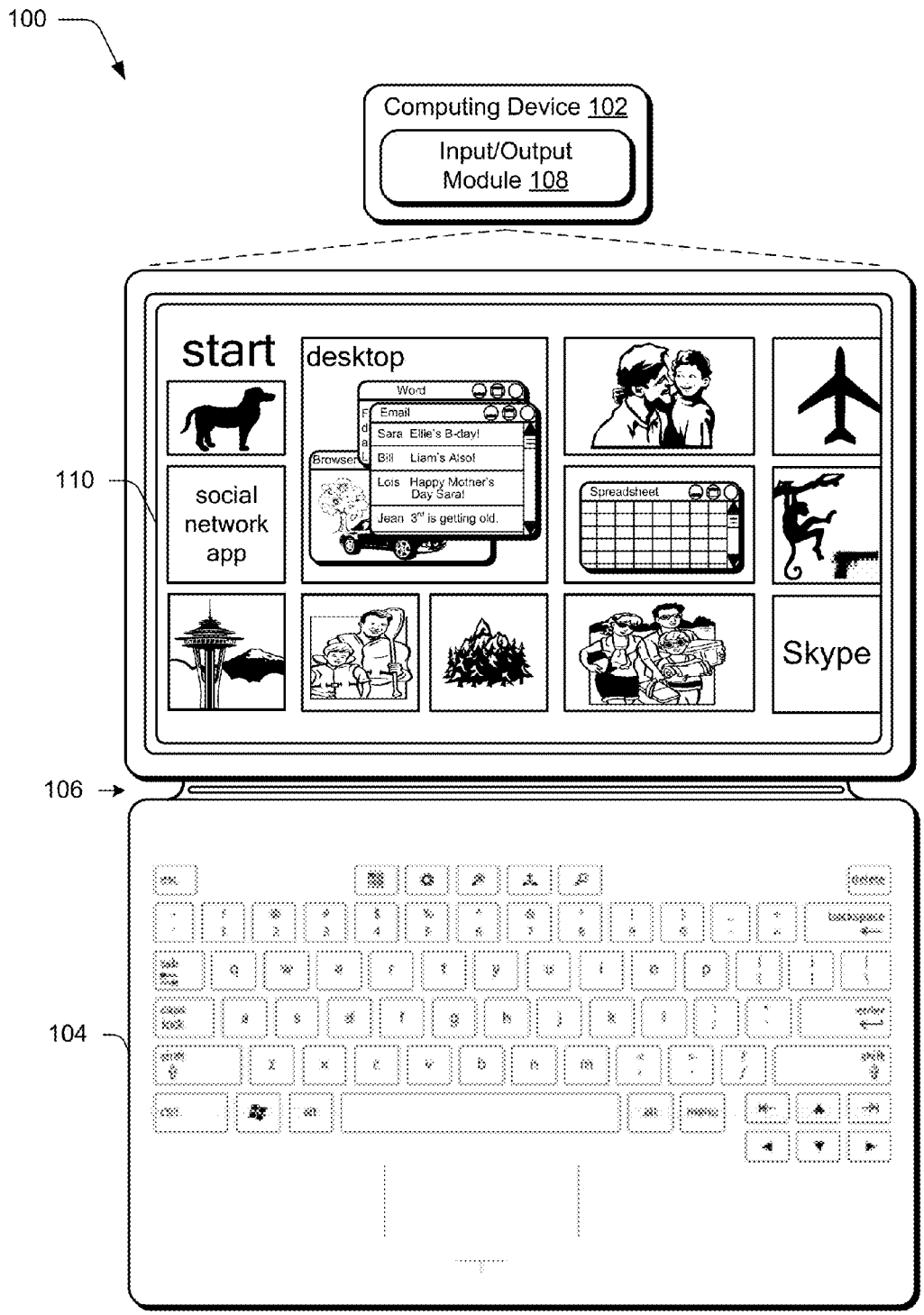
FIG. 1 is an illustration of an environment in an example implementation that is operable to employ the techniques described herein.

FIG. 1 is an illustration of an environment 100 in an example implementation that is operable to employ the techniques described herein. The illustrated environment 100 includes an example of a computing device 102 that is physically and communicatively coupled to an input device 104 via a flexible hinge 106. The computing device 102 may be configured in a variety of ways. For example, the computing device 102 may be configured for mobile use, such as a mobile phone, a tablet computer as illustrated, and so on. Thus, the computing device 102 may range from full resource devices with substantial memory and processor resources to a low-resource device with limited memory and/or processing resources. The computing device 102 may also relate to software that causes the computing device 102 to perform one or more operations.

The computing device 102, for instance, is illustrated as including an input/output module 108. The input/output module 108 is representative of functionality relating to processing of inputs and rendering outputs of the computing device 102. A variety of different inputs may be processed by the input/output module 108, such as inputs relating to functions that correspond to keys of the input device 104, keys of a virtual keyboard displayed by the display device 110 to identify gestures and cause operations to be performed that correspond to the gestures that may be recognized through the input device 104 and/or touchscreen functionality of the display device 110, and so forth. Thus, the input/output module 108 may support a variety of different input techniques by recognizing and leveraging a division between types of inputs including key presses, gestures, and so on.

In the illustrated example, the input device 104 is configured as a keyboard having a QWERTY arrangement of keys although other arrangements of keys are also contemplated. Further, other non-conventional configurations are also contemplated, such as a game controller, configuration to mimic a musical instrument, and so forth. Thus, the input device 104 and keys incorporated by the input device 104 may assume a variety of different configurations to support a variety of different functionality.

As previously described, the input device 104 is physically and communicatively coupled to the computing device 102 in this example through use of a flexible hinge 106. The flexible hinge 106 is flexible in that rotational movement supported by the hinge is achieved through flexing (e.g., bending) of the material forming the hinge as opposed to mechanical rotation as supported by a pin, although that embodiment is also contemplated. Further, this flexible rotation may be configured to support movement in one direction (e.g., vertically in the figure) yet restrict movement in other directions, such as lateral movement of the input device 104 in relation to the computing device 102. This may be used to support consistent alignment of the input device 104 in relation to the computing device 102, such as to align sensors used to change power states, application states, and so on.

The flexible hinge 106, for instance, may be formed using one or more layers of fabric and include conductors formed as flexible traces to communicatively couple the input device 104 to the computing device 102 and vice versa. This communication, for instance, may be used to communicate a result of a key press to the computing device 102, receive power from the computing device, perform authentication, provide supplemental power to the computing device 102, and so on. The flexible hinge 106 may be configured in a variety of ways, further discussion of which may be found in relation to the following figure.

Figure 2:
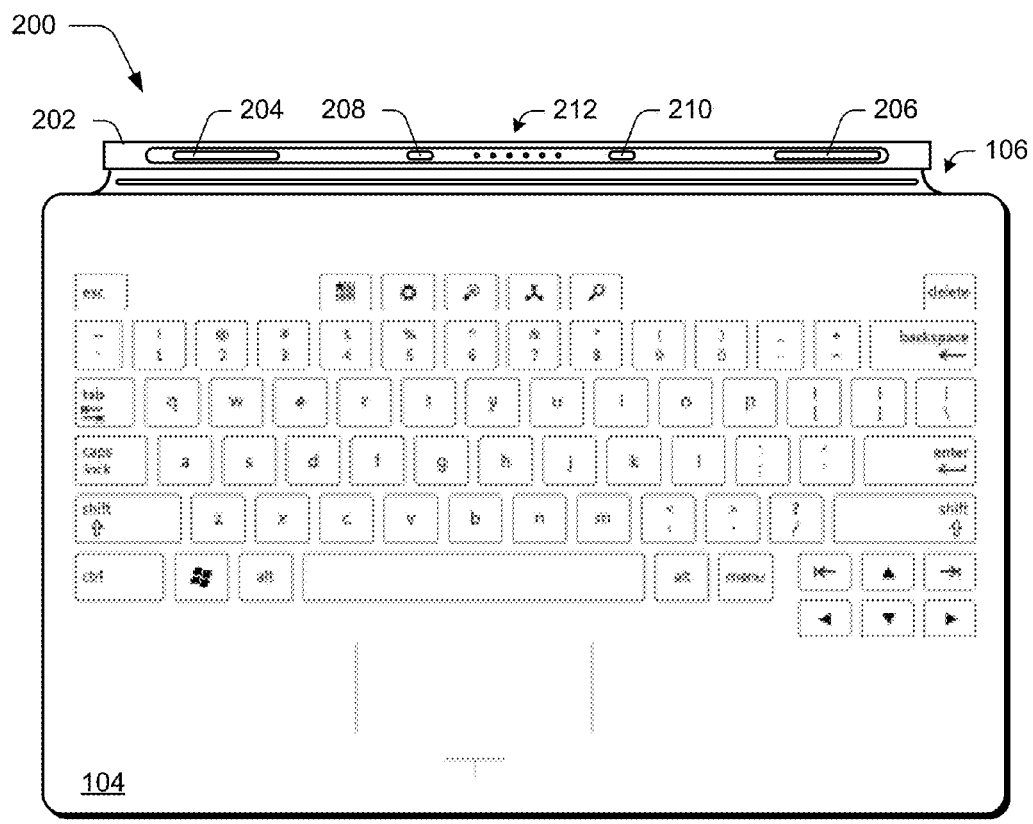
FIG. 2 depicts an example implementation of an input device of FIG. 1 as showing a flexible hinge in greater detail.

FIG. 2 depicts an example implementation 200 of the input device 104 of FIG. 1 as showing the flexible hinge 106 in greater detail. In this example, a connection portion 202 of the input device is shown that is configured to provide a communicative and physical connection between the input device 104 and the computing device 102. In this example, the connection portion 202 has a height and cross section configured to be received in a channel in the housing of the computing device 102, although this arrangement may also be reversed without departing from the spirit and scope thereof.

The connection portion 202 is flexibly connected to a portion of the input device 104 that includes the keys through use of the flexible hinge 106. Thus, when the connection portion 202 is physically connected to the computing device the combination of the connection portion 202 and the flexible hinge 106 supports movement of the input device 104 in relation to the computing device 102 that is similar to a hinge of a book.

For example, rotational movement may be supported by the flexible hinge 106 such that the input device 104 may be placed against the display device 110 of the computing device 102 and thereby act as a cover. The input device 104 may also be rotated so as to be disposed against a back of the computing device 102, e.g., against a rear housing of the computing device 102 that is disposed opposite the display device 110 on the computing device 102.

Naturally, a variety of other orientations are also supported. For instance, the computing device 102 and input device 104 may assume an arrangement such that both are laid flat against a surface as shown in FIG. 1. In another instance, a typing arrangement may be supported in which the input device 104 is laid flat against a surface and the computing device 102 is disposed at an angle to permit viewing of the display device 110, e.g., such as through use of a kickstand disposed on a rear surface of the computing device 102. Other instances are also contemplated, such as a tripod arrangement, meeting arrangement, presentation arrangement, and so forth.

The connecting portion 202 is illustrated in this example as including magnetic coupling devices 204, 206, mechanical coupling protrusions 208, 210, and a plurality of communication contacts 212. The magnetic coupling devices 204, 206 are configured to magnetically couple to complementary magnetic coupling devices of the computing device 102 through use of one or more magnets. In this way, the input device 104 may be physically secured to the computing device 102 through use of magnetic attraction.

The connecting portion 202 also includes mechanical coupling protrusions 208, 210 to form a mechanical physical connection between the input device 104 and the computing device 102. The mechanical coupling protrusions 208, 210 are shown in greater detail in the following figure.

Figure 3:
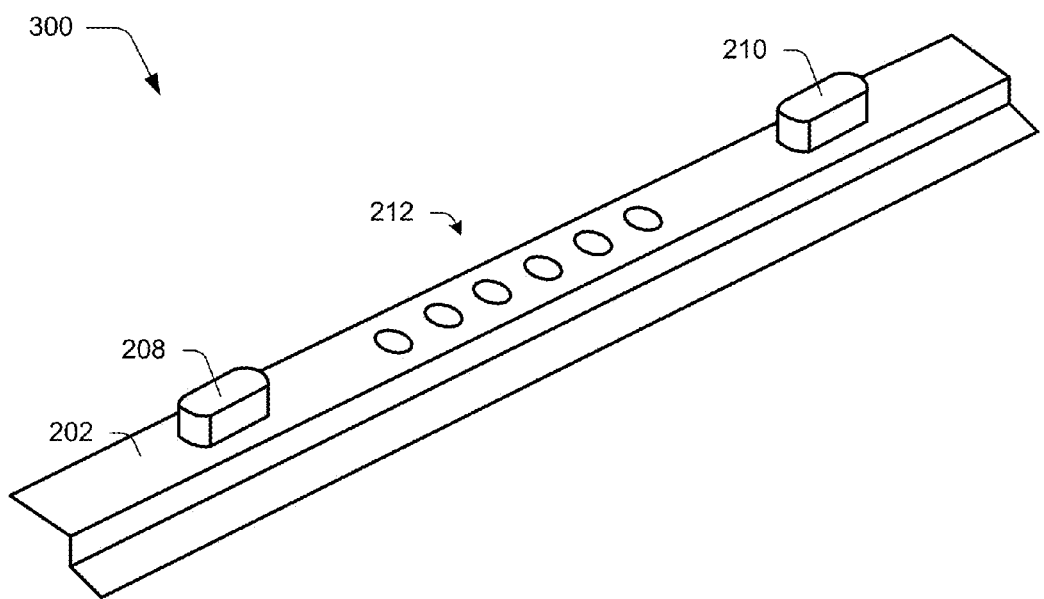
FIG. 3 depicts an example implementation showing a perspective view of a connecting portion of FIG. 2 that includes mechanical coupling protrusions and a plurality of communication contacts.

FIG. 3 depicts an example implementation 300 shown a perspective view of the connecting portion 202 of FIG. 2 that includes the mechanical coupling protrusions 208, 210 and the plurality of communication contacts 212. As illustrated, the mechanical coupling protrusions 208, 210 are configured to extend away from a surface of the connecting portion 202, which in this case is perpendicular although other angles are also contemplated.

The mechanical coupling protrusions 208, 210 are configured to be received within complimentary cavities within the channel of the computing device 102. When so received, the mechanical coupling protrusions 208, 210 promote a mechanical binding between the devices when forces are applied that are not aligned with an axis that is defined as correspond to the height of the protrusions and the depth of the cavity.

For example, when a force is applied that does coincide with the longitudinal axis described previously that follows the height of the protrusions and the depth of the cavities, a user overcomes the force applied by the magnets solely to separate the input device 104 from the computing device 102. However, at other angles the mechanical coupling protrusion 208, 210 are configured to mechanically bind within the cavities, thereby creating a force to resist removal of the input device 104 from the computing device 102 in addition to the magnetic force of the magnetic coupling devices 204, 206. In this way, the mechanical coupling protrusions 208, 210 may bias the removal of the input device 104 from the computing device 102 to mimic tearing a page from a book and restrict other attempts to separate the devices.

The connecting portion 202 is also illustrated as including a plurality of communication contacts 212. The plurality of communication contacts 212 is configured to contact corresponding communication contacts of the computing device 102 to form a communicative coupling between the devices. The communication contacts 212 may be configured in a variety of ways, such as through formation using a plurality of spring loaded pins that are configured to provide a consistent communication contact between the input device 104 and the computing device 102. Therefore, the communication contact may be configured to remain during minor movement of jostling of the devices. A variety of other examples are also contemplated, including placement of the pins on the computing device 102 and contacts on the input device 104.

Figure 4:
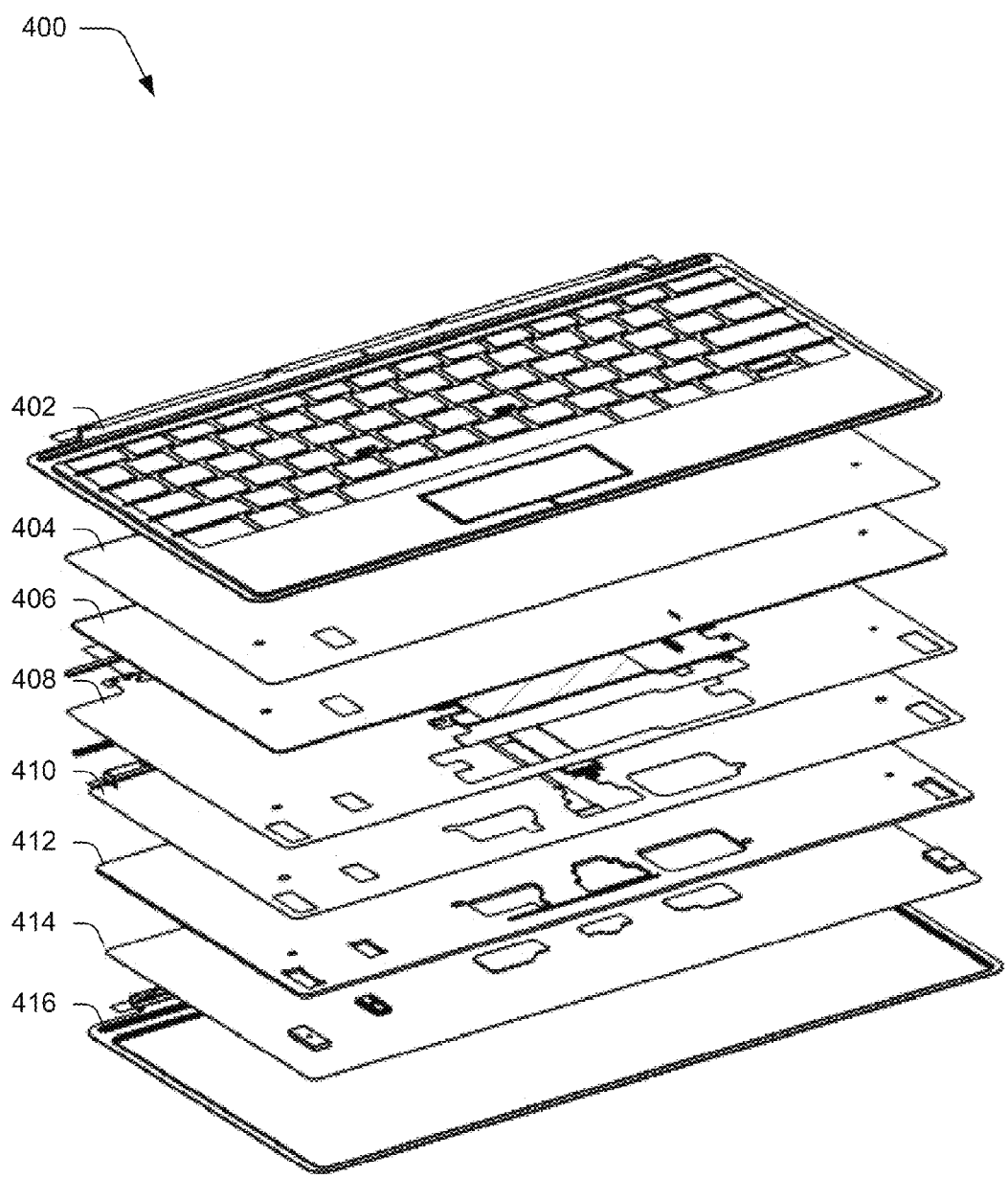
FIG. 4 depicts a plurality of layers of the input device of FIG. 2 in a perspective exploded view.

FIG. 4 depicts a plurality of layers of the input device 104 in a perspective exploded view 400. At top, an outer layer 402 is shown which may be configured using an embossed fabric (e.g., 0.6 millimeter polyurethane) in which the embossing is used to provide indications of underlying keys as well as indications of respective functions of the keys.

A force concentrator 404 is disposed beneath the outer layer 402. The force concentrator 402 may be configured to provide a mechanical filter, force direction, and to hide witness lines of underlying components as further described in the "Force Concentrator" section below.

Below the force concentrator 404 in this example is a pressure sensitive key assembly 406. The pressure sensitive key assembly 406 may include layers used to implement pressure sensitive keys, as further described in the "Pressure Sensitive Key" section below.

A support layer 408 is illustrated below the pressures sensitive key 406 assembly. The support layer 408 is configured to support the flexible hinge 106 and conductors included therein from damage. Further discussion of the support layer 408 may be found in relation to the "Support Layer" section.

An adhesive layer 410 is illustrated as disposed beneath the support layer 408 and above a support board 412 which is configured to add mechanical stiffness to an input portion of the input device 104. The adhesive layer 410 may be configured in a variety of ways to secure the support board 412 to the support layer 408. The adhesive layer 410, for instance, may be configured to include a dot matrix of adhesive on both sides of the layer. Therefore, air is permitted to escape as the layers are rolled together, thereby reducing wrinkles and air bubbles between the layers. In the illustrated example, the adhesive layer 410 also includes a nesting channel configured to support flexible printed circuit routing, e.g., between controllers, sensors, or other modules and the pressure sensitive keys and/or communication contacts of the connection portion 202. Beneath the support board 412 is a backer layer 414 with PSA and an outer surface 416. The outer surface 416 may be formed from a material that is the same as or different from the other outer surface 402.

Pressure Sensitive Key Assembly

Figure 5:
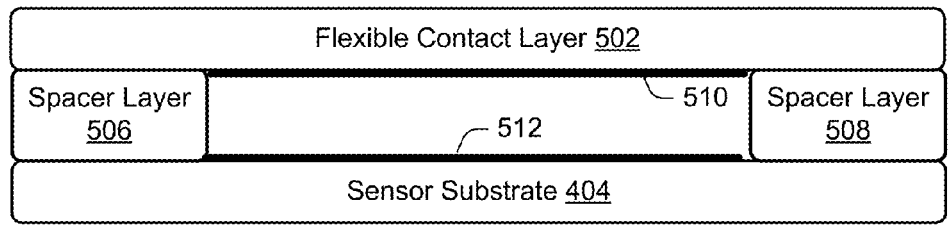
FIG. 5 depicts an example of a cross-sectional view of a pressure sensitive key of a keyboard of the input device of FIG. 2.

FIG. 5 depicts an example of a cross-sectional view of a pressure sensitive key 500 of a keyboard of the input device 104 of FIG. 2 that forms the pressure sensitive key assembly 406. The pressure sensitive key 500 in this example is illustrated as being formed using a flexible contact layer 502 (e.g., Mylar) that is spaced apart from the sensor substrate 504 using a spacer layer 508, 408, which may be formed as another layer of Mylar, formed on the sensor substrate 504, and so on. In this example, the flexible contact layer 502 does not contact the sensor substrate 504 absent application of pressure against the flexible contact layer 502.

The flexible contact layer 502 in this example includes a force sensitive ink 510 disposed on a surface of the flexible contact layer 502 that is configured to contact the sensor substrate 504. The force sensitive ink 510 is configured such that an amount of resistance of the ink varies directly in relation to an amount of pressure applied. The force sensitive ink 510, for instance, may be configured with a relatively rough surface that is compressed against the sensor substrate 504 upon an application of pressure against the flexible contact layer 502. The greater the amount of pressure, the more the force sensitive ink 510 is compressed, thereby increasing conductivity and decreasing resistance of the force sensitive ink 510. Other conductors may also be disposed on the flexible contact layer 502 without departing form the spirit and scope therefore, including other types of pressure sensitive and non-pressure sensitive conductors.

The sensor substrate 504 includes one or more conductors 512 disposed thereon that are configured to be contacted by the force sensitive ink 510 of the flexible contact layer 502. When contacted, an analog signal may be generated for processing by the input device 104 and/or the computing device 102, e.g., to recognize whether the signal is likely intended by a user to provide an input for the computing device 102. A variety of different types of conductors 512 may be disposed on the sensor substrate 504, such as formed from a variety of conductive materials (e.g., silver, copper), disposed in a variety of different configurations as further described in relation to FIG. 9, and so on.

Figure 6:
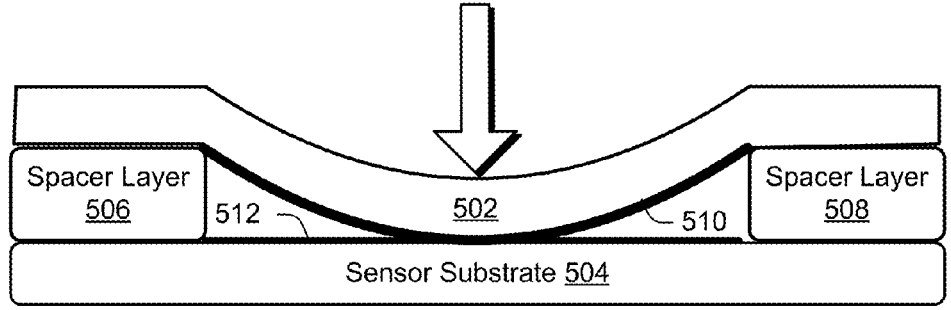
FIG. 6 depicts an example of a pressure sensitive key of FIG. 5 as having pressure applied at a first location of a flexible contact layer to cause contact with a corresponding first location of a sensor substrate.

FIG. 6 depicts an example 600 of the pressure sensitive key 500 of FIG. 5 as having pressure applied at a first location of the flexible contact layer 502 to cause contact of the force sensitive ink 510 with a corresponding first location of the sensor substrate 504. The pressure is illustrated through use of an arrow in FIG. 6 and may be applied in a variety of ways, such as by a finger of a user's hand, stylus, pen, and so on. In this example, the first location at which pressure is applied as indicated by the arrow is located generally near a center region of the flexible contact layer 502 that is disposed between the spacer layers 506, 508. Due to this location, the flexible contact layer 502 may be considered generally flexible and thus responsive to the pressure.

This flexibility permits a relatively large area of the flexible contact layer 502, and thus the force sensitive ink 510, to contact the conductors 512 of the sensor substrate 504. Thus, a relatively strong signal may be generated. Further, because the flexibility of the flexible contact layer 502 is relatively high at this location, a relatively large amount of the force may be transferred through the flexible contact layer 502, thereby applying this pressure to the force sensitive ink 510. As previously described, this increase in pressure may cause a corresponding increase in conductivity of the force sensitive ink and decrease in resistance of the ink. Thus, the relatively high amount of flexibility of the flexible contact layer at the first location may cause a relatively stronger signal to be generated in comparison with other locations of the flexible contact layer 502 that located closer to an edge of the key, an example of which is described in relation to the following figure.

Figure 7:
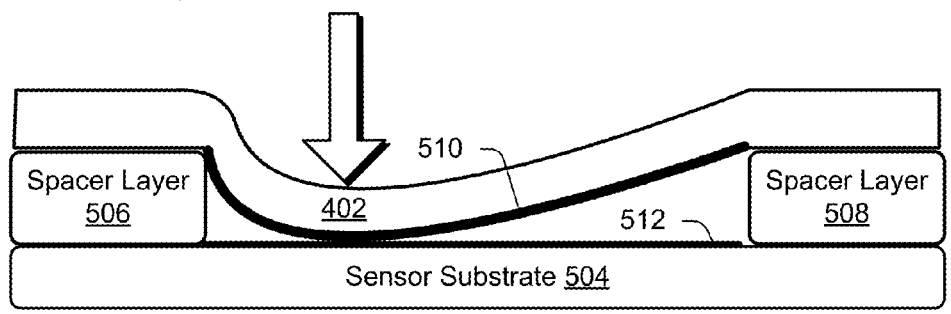
FIG. 7 depicts an example of the pressure sensitive key of FIG. 5 as having pressure applied at a second location of the flexible contact layer to cause contact with a corresponding second location of the sensor substrate.

FIG. 7 depicts an example 700 of the pressure sensitive key 500 of FIG. 5 as having pressure applied at a second location of the flexible contact layer 502 to cause contact with a corresponding second location of the sensor substrate 504. In this example, the second location of FIG. 6 at which pressure is applied is located closer to an edge of the pressure sensitive key (e.g., closer to an edge of the spacer layer 508) than the first location of FIG. 5. Due to this location, the flexible contact layer 502 has reduced flexibility when compared with the first location and thus less responsive to pressure.

This reduced flexibility may cause a reduction in an area of the flexible contact layer 502, and thus the force sensitive ink 510, that contacts the conductors 512 of the sensor substrate 504. Thus, a signal produced at the second location may be weaker than a signal produced at the first location of FIG. 6.

Further, because the flexibility of the flexible contact layer 502 is relatively low at this location, a relatively low amount of the force may be transferred through the flexible contact layer 502, thereby reducing the amount of pressure transmitted to the force sensitive ink 510. As previously described, this decrease in pressure may cause a corresponding decrease in conductivity of the force sensitive ink and increase in resistance of the ink in comparison with the first location of FIG. 5. Thus, the reduced flexibility of the flexible contact layer 502 at the second location in comparison with the first location may cause a relatively weaker signal to be generated. Further, this situation may be exacerbated by a partial hit in which a smaller portion of the user's finger is able to apply pressure at the second location of FIG. 7 in comparison with the first location of FIG. 6.

However, as previously described techniques may be employed to normalize outputs produced by the switch at the first and second locations. This may be performed in a variety of ways, such as through configuration of the flexible contact layer 502 as described in relation to FIG. 8, use of a plurality of sensors as described in relation to FIG. 9, configuration of the sensor substrate 504 as described in relation to FIG. 10, use of a force concentrator layer as described in relation to FIGS. 11-13, use of securing as described in relation to FIGS. 14-16, and combinations thereof as further described in relation to the following sections.

Flexible Contact Layer

Figure 8:
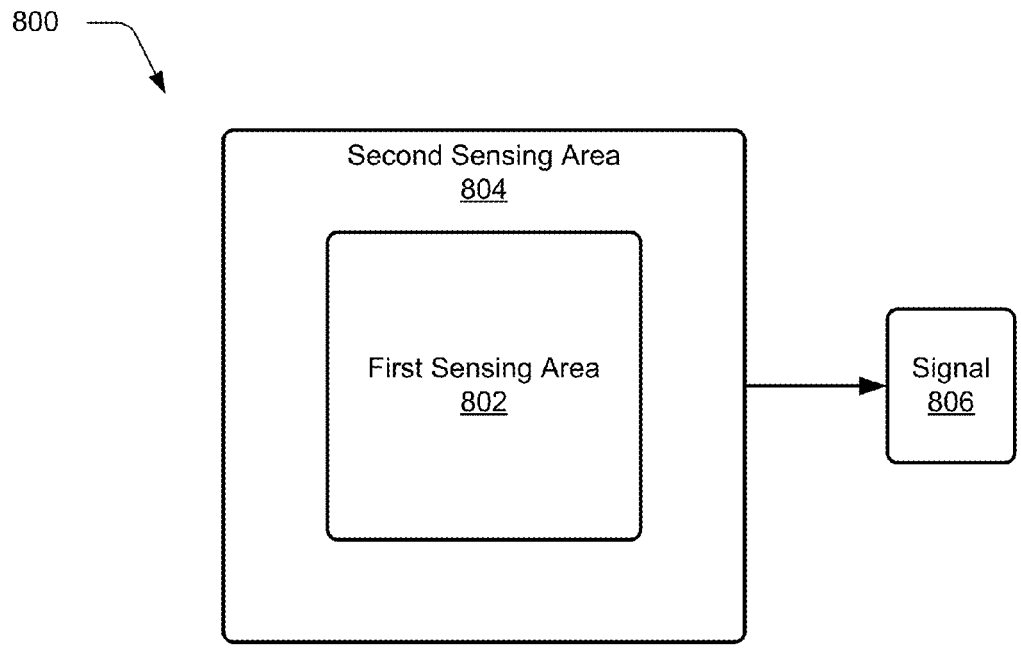
FIG. 8 illustrates an example of the flexible contact layer of a single pressure sensitive key that is configured to normalize outputs generated at a plurality of locations of the switch.

FIG. 8 illustrates an example 800 of the flexible contact layer of a single pressure sensitive key that is configured to normalize outputs generated at a plurality of locations of the switch. In this example, a view of the "bottom" or "underside" of the flexible contact layer 502 of FIG. 5 is shown that is configured to contact the conductors 512 of the sensor substrate 504.

The flexible contact layer 502 is illustrated as having first and second sensing areas 802, 804. The first sensing area 802 in this example corresponds generally to the first location at which pressure was applied in FIG. 6 and the second sensing area 804 corresponds generally to the second location at which pressure was applied in FIG. 7.

As previously described, flexing of the flexible contact layer 502 due to changes in distances from an edge of the switch may cause relatively stronger signals to be generated as distances increase from an edge of the key. Therefore, in this example the first and second sensing areas 802, 804 are configured to normalize the signals 806 generated at the different locations. This may be done in a variety of ways, such as by having a higher conductivity and less resistance at the second sensing area 804 in comparison with the first sensing area 802.

The differences in conductivity and/or resistance may be achieved using a variety of techniques. For example, one or more initial layers of a force sensitive ink may be applied to the flexible contact layer 502 that covers the first and second sensing areas 804, 802, such as through use of a silk screen, printing process, or other process by which the ink may be disposed against the surface. One or more additional layers may then be applied to the second sensing area 704 and not the first sensing area 802.

This causes the second sensing area 804 to have a greater amount (e.g., thickness) of the force sensitive ink than the first sensing area 802 for a given area, which causes a corresponding increase in conductivity and decrease in resistance. Therefore, this technique may serve to at least partially counteract the differences in flexibility of the flexible contact layer 502 at different locations. In this example, an increased height of the force sensitive ink at the second sensing area 804 may also act to reduce an amount of flexing involved in generating contact with the conductors 512 of the sensor substrate 504, which may also help to normalize the signals.

The differences in conductivity and/or resistance at the first and second sensing areas 802, 804 may be achieved in a variety of other ways. For example, a first force sensitive ink may be applied at the first sensing area 802 and a second force sensitive ink having a higher conductivity and/or resistance may be applied at the second sensing area 804. Further, although an arrangement of first and second sensing areas 802, 804 as concentric square is shown in FIG. 8, a variety of other arrangements may also be employed, such as to further increase sensitivity at the corners of the switch, employ more than two sensing areas having different sensitivities to pressure, use of a gradient of conductivities, and so forth. Other examples are also contemplated, such as to support use of a plurality of sensors for a single key, an example of which is described in relation to the following figure.

Figure 9:
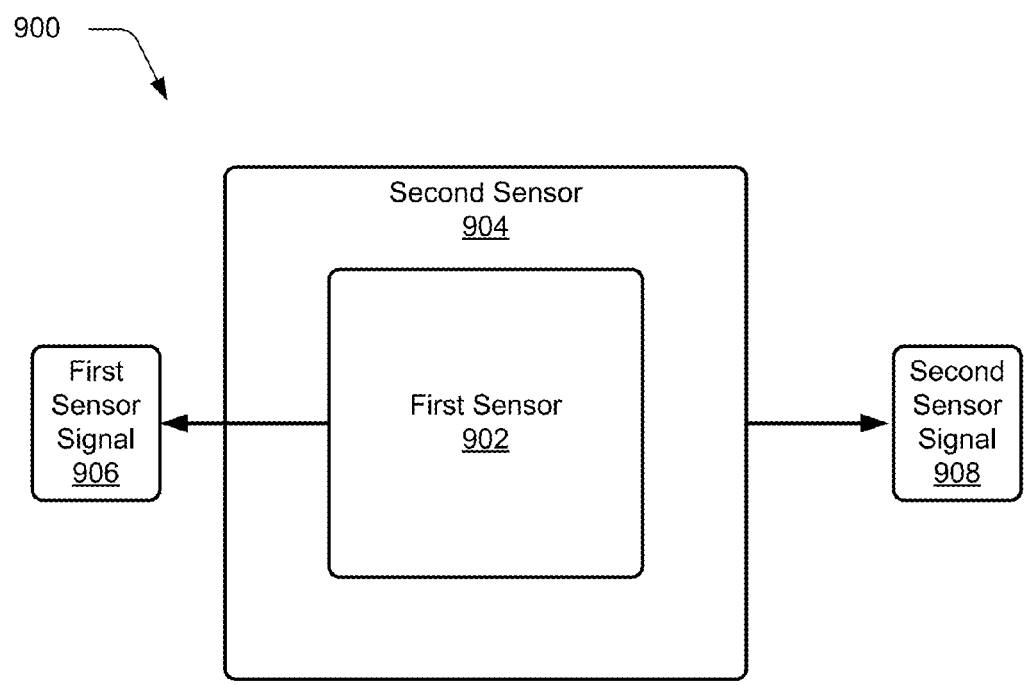
FIG. 9 depicts an example of a pressure sensitive key of FIG. 5 that includes a plurality of sensors to detect pressure at different locations.

FIG. 9 depicts an example 900 of a pressure sensitive key 500 of FIG. 5 that includes a plurality of sensors to detect pressure at different locations. As previously described, miss hits and limitations of flexibility may cause reduced performance at edges of a pressure sensitive key.

Accordingly, in this example a first sensor 902 and a second sensor 904 are employed to provide respective first and second sensor signals 906, 908, respectively. Further, the second sensor 904 is configured to have increased sensitivity (e.g., higher conductivity and/or lower resistance) that the first sensor 902. This may be achieved in a variety of ways, such as through different conductors and configurations of the conductors to act as sensors as part of the sensor substrate 504. Other configurations of the sensor substrate 504 may also be made to normalize signals generated by the pressure sensitive key at different locations of the key, an example of which is described in relation to the discussion of the following figure.

Sensor Substrate

Figure 10:
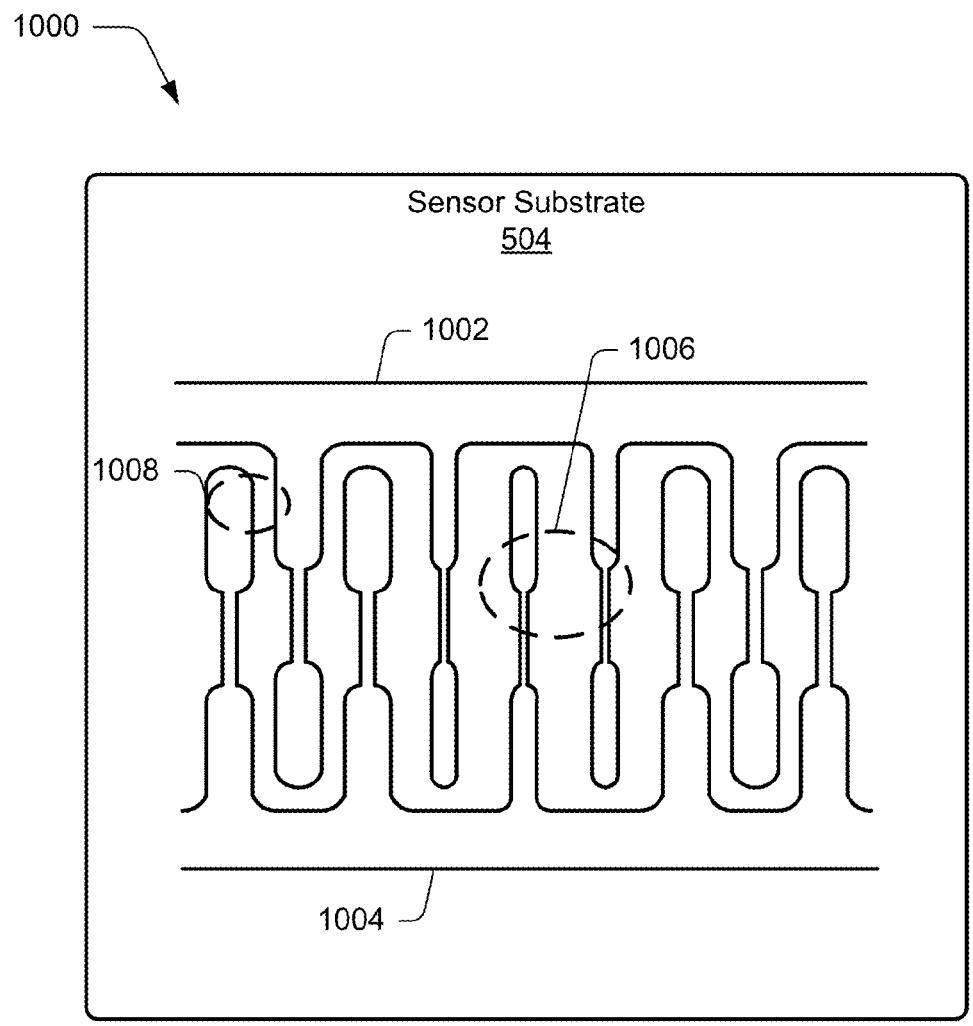
FIG. 10 depicts an example of conductors of a sensor substrate of a pressure sensitive key that is configured to normalize signals generated at different locations of the pressure sensitive key.

FIG. 10 depicts an example of conductors 512 of a sensor substrate 504 that are configured to normalize signals generated at different locations of a pressure sensitive key. In this example, conductors 512 of the sensor substrate 504 are configured in first and second portions 1002, 1004 of inter-digitated trace fingers. Surface area, amount of conductors, and gaps between the conductors are used in this example to adjust sensitivity at different locations of the sensor substrate 504.

For example, pressure may be applied to a first location 1006 may cause a relatively larger area of the force sensitive ink 510 of the flexible contact layer 502 to contact the conductors in comparison with a second location 1008 of the sensor substrate 504. As shown in the illustrated example, an amount of conductor contacted at the first location 1006 is normalized by an amount of conductor contacted at the second portion 1006 through use of gap spacing and conductor size. In this way, by using smaller conductors (e.g., thinner fingers) and larger gaps at the center of the key as opposed to the edge of the key specific performance characteristics for the keys may be adjusted to suite typical user input scenarios. Further, these techniques for configuring the sensor substrate 504 may be combined with the techniques described for configuring the flexible contact layer 502 to further promote normalization and desired user input scenarios.

Returning again to FIG. 2, these techniques may also be leveraged to normalize and support desired configuration of different keys, such as to normalize a signal generated by a first key of a keyboard of the input device 104 with a signal generated by a second key of the keyboard. As shown in the QWERTY arrangement of FIG. 2 (although this is equally applicable to other arrangements), users are more likely to apply greater typing pressure to a home row of keys located at a center of the input device 104 than keys located closer to the edges of the device. This may include initiation using fingernails of a user's hand for the shift key row as well as an increased distance to reach for the numbers, different strengths of different fingers (index versus pinky finger), and so on.

Accordingly, the techniques described above may also be applied to normalize signals between these keys, such as to increase sensitivity of number keys in relation to home row keys, increase sensitivity of "pinky" keys (e.g., the letter "a" and semicolon key) as opposed to index finger keys (e.g., the letters "f," "g," "h," and "j"), and so forth. A variety of other examples are also contemplated involving changes to sensitivity, such as to make keys having a smaller surface area (e.g., the delete button in the figure) more sensitive in comparison with larger keys, such as the shift keys, spacebar, and so forth.

Force Concentrator

Figure 11:
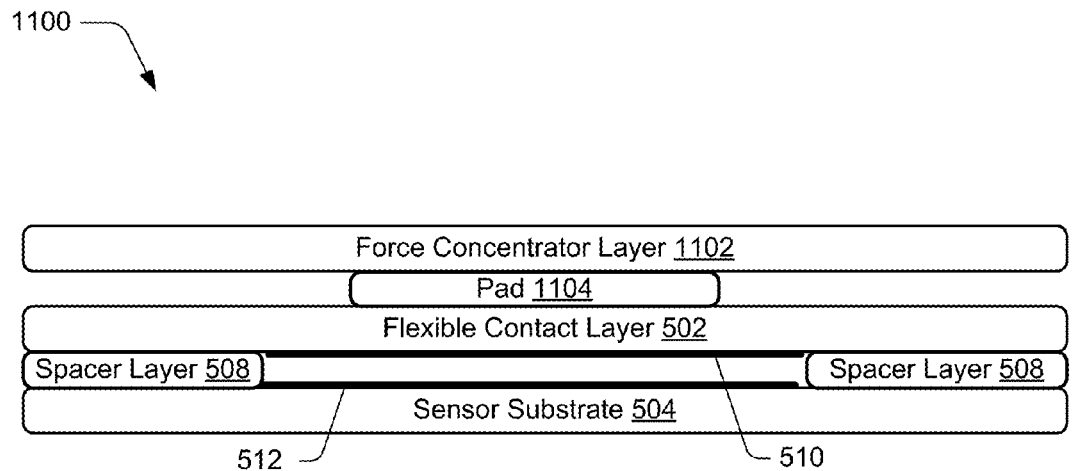
FIG. 11 depicts an example of a pressure sensitive key of FIG. 5 as employing a force concentrator layer.

FIG. 11 depicts an example 1100 of a pressure sensitive key of FIG. 4 as employing a force concentrator 404 of FIG. 4. The force concentrator 404 includes a force concentrator layer 1102 and a pad 1104. The force concentrator layer 1102 may be configured from a variety of materials, such as a flexible material (e.g., Mylar) that is capable of flexing against the flexible contact layer 502. The force concentrator 404 may be employed to improve consistency of the contact of the flexible contact layer 502 with the sensor substrate 504 as well as other features.

As described above, the force concentrator layer 1102 in this instance includes a pad 1104 disposed thereon that is raised from a surface of the force concentrator layer 1102. Thus, the pad 1104 is configured as a protrusion to contact the flexible contact layer 502. The pad 1104 may be formed in a variety of ways, such as formation as a layer (e.g., printing, deposition, forming, etc.) on a substrate of the force concentrator layer 1102 (e.g., Mylar), as an integral part of the substrate itself, and so on.

Figure 12:
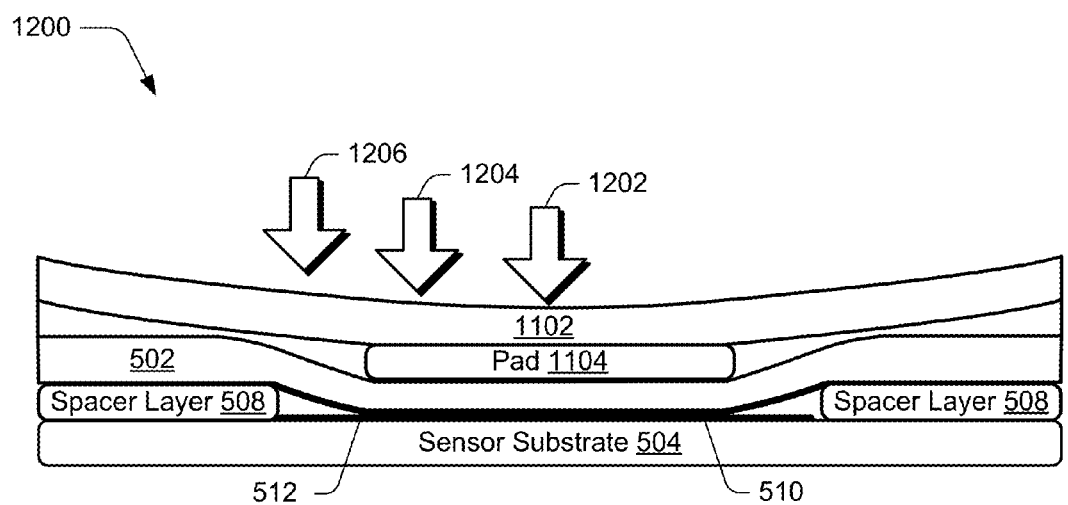
FIG. 12 an example of the pressure sensitive key of FIG. 11 as having pressure applied at a plurality of different locations of the force concentrator layer to cause a flexible contact layer to contact a sensor substrate.

FIG. 12 an example 1200 of the pressure sensitive key of FIG. 11 as having pressure applied at a plurality of different locations of the force concentrator layer 1102 to cause the flexible contact layer 502 to contact the sensor substrate 504. The pressure is again illustrated through use of arrow, which in this instance include first, second, and third locations 1202, 1204, 1206 which are positioned at distances that are respectively closer to an edge of the key, e.g., an edge defined by the spacer layer 508, 508.

As illustrated, the pad 1104 is sized so as to permit the flexible contact layer 502 to flex between the spacer layer 508, 508. The pad 1104 is configured to provide increased mechanical stiffness and thus improved resistance to bending and flexing, e.g., as in comparison with a substrate (e.g., Mylar) of the force concentrator layer 1102. Therefore, when the pad 1104 is pressed against the flexible contact layer 502, the flexible contact layer 502 has a decreased bend radius as illustrated through comparison of FIG. 12 with FIGS. 6 and 7.

Thus, the bending of the flexible contact layer 502 around the pad 1104 may promote a relatively consistent contact area between the force sensitive ink 510 and the conductors 512 of the sensor substrate 504. This may promote normalization of a signal produced by the key.

The pad 1104 may also act to spread a contact area of a source of the pressure. A user, for example, my press against the force concentrator layer 1102 using a fingernail, a tip of a stylus, pen, or other object that has a relatively small contact area. As previously described this could result in correspondingly small contact area of the flexible contact layer 502 that contacts the sensor substrate 504, and thus a corresponding decrease in signal strength.

However, due to the mechanical stiffness of the pad 1104, this pressure may be spread across an area of the pad 1104 that contacts the flexible contact layer 502, which is then spread across an area of the flexible contact layer 502 that correspondingly bends around the pad 1104 to contact the sensor substrate 504. In this way, the pad 1104 may be used to normalize a contact area between the flexible contact layer 502 and the sensor substrate 504 that is used to generate a signal by the pressure sensitive key.

The pad 1104 may also act to channel pressure, even if this pressure is applied "off center." As previously described in relation to FIGS. 6 and 7, the flexibility of the flexible contact layer 502 may depend at least partially on a distance from an edge of the pressure sensitive key, e.g., an edge defined by the spacer layer 508, 508 in this instance.

The pad 1104, however, may be used to channel pressure to the flexible contact layer 502 to promote relatively consistent contact. For example, pressure applied at a first location 1202 that is positioned at a general center region of the force concentrator layer 1102 may cause contact that is similar to contact achieved when pressure applied at a second location 1204 that is positioned at an edge of the pad 1104. Pressures applied outside of a region of the force concentrator layer 1102 defined by the pad 1104 may also be channeled through use of the pad 1104, such as a third position 1206 that is located outside of the region defined by the pad 1104 but within an edge of the key. A position that is located outside of a region of the force concentrator layer 1102 defined by the spacer layer 508, 508 may also be channeled to cause the flexible contact layer 502 to contact the sensor substrate 504, an example of which is defined in relation to the following figure.

Figure 13:
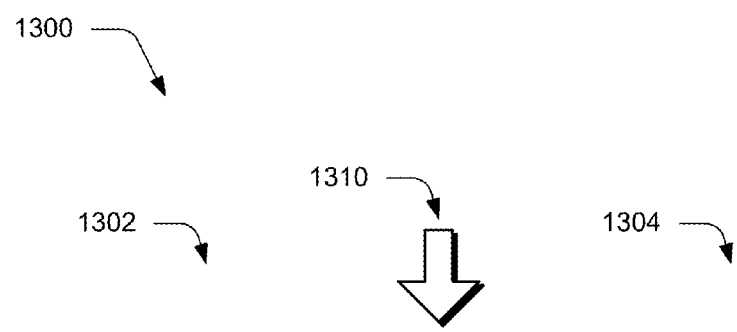
FIG. 13 illustrates an example of a view of a cross section of a keyboard that includes a plurality of pressure sensitive keys that employ the force concentrator layer.
Figure 13:
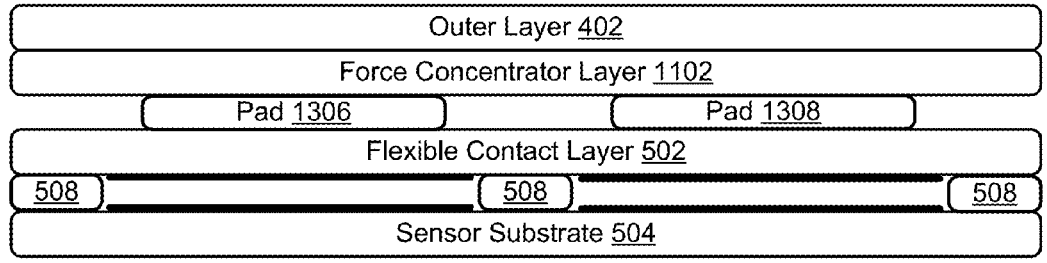

FIG. 13 illustrates an example of a view of a cross section of a keyboard 1300 that includes a plurality of pressure sensitive keys that employ the force concentrator. The keyboard 1300 in this example includes first and second pressure sensitive keys 1302, 1304. The pressure sensitive keys 1302, 1304 share a force concentrator layer 1102, a flexible contact layer 502, a sensor substrate 504, and a spacer layer 508 as before. Each of the pressure sensitive keys 1302, 1304 in this example has a respective pad 1306, 1308 that is configured to channel pressure to cause contact between a respective portion of the flexible contact layer 502 and sensor substrate 504.

As previously described, limited flexibility at the edges of conventional pressure sensitive keys could result in an inability of the keys to recognize pressure applied at the edges of the keys. This could cause "dead zones" in which the input device 104 could not recognize applied pressures. However, through use of the force concentrator layer 1102 and channeling of pressure supported by the pads 1306, 1308 the existence of dead zones may be reduced and even eliminated.

For example, a location 1310 is illustrated through use of an arrow that is disposed between the first and second pressure sensitive keys 1302, 1304. In this instance, the location 1310 is disposed over the spacer layer 508 and closer to the first pressure sensitive key 1302 than the second pressure sensitive key 1304.

Accordingly, the pad 1306 of the first pressure sensitive key 1302 may channel a greater amount of the pressure than the pad 1308 of the second pressure sensitive key 1304. This may result in a stronger signal being produce by the first pressure sensitive key 1302 than the second pressure sensitive key 1304, a signal being generated at just the first pressures sensitive key 1302 and not the second pressure sensitive key 1304, and so forth. Regardless, modules of the input device 104 and/or the computing device 102 may then determine a likely intent of a user regarding which of the keys is to be employed by processing the signals generated by the keys. In this way, the force concentrator layer 1102 may mitigate against dead zones located between the keys by increasing an area that may be used to activate the key through channeling.

The force concentrator layer 1102 may also be used to perform mechanical filtering of pressures applied against the keys. A user, for instance, when typing a document may choose to rest one or more fingers of a hand against a surface of the keys but not wish to activate the key. Without the force concentrator layer 1102, therefore, processing of inputs from the pressure sensitive keys may be complicated by determining whether an amount and/or duration of pressure applied to the key is likely intended to activate the key.

However, in this example the force concentrator layer 1102 may be configured for use with the flexible contact layer to mechanically filter inputs that are not likely to be intended by a user to activate the key. The force concentrator layer 1102, for instance, may be configured to employ a threshold that in combination with the flexible contact layer 502 defines an amount of pressure to be employed to actuate the key. This may include an amount of pressure that is sufficient to cause the flexible contact layer 502 and the force sensitive ink 510 disposed thereon to contact conductors 512 of the sensor substrate to generate a signal that is recognizable as an input by the input device 104 and/or computing device 102.

In an implementation, this threshold is set such that a pressure of approximately fifty grams or less is not sufficient to cause the force concentrator layer 1102 and the flexible contact layer 502 to initiate the signal whereas pressures above that threshold are recognizable as inputs. A variety of other implementations and thresholds are also contemplated that may be configured to differentiate against a resting pressure and a key strike.

The force concentrator layer 1102 may also be configured to provide a variety of other functionality. The input device 104, for instance, may include the outer layer 402 (e.g., fabric) which as previously described in relation to FIG. 4 may include indications of operations of respective keys, e.g., letters, numbers, and other operations such as "shift," "return," navigation, and so on. The force concentrator layer 1102 may be disposed beneath this layer. Further, a side of the force concentrator layer 1102 that is exposed towards the outer layer 402 may be configured to be substantially smooth, thereby reducing and even eliminating witness lines that could result from underlying components of the input device 104.

In this way, a surface of the outer layer 402 may be made with increased uniformity and thus provided a better typing experience with increased accuracy, e.g., by promoting a smooth tactile feel without interference from underlying components. The force concentrator layer 1102 may also be configured to protect against electrostatic discharge (ESD) to underlying components of the input device 104. For example, the input device 104 may include a track pad as illustrated in FIGS. 1 and 2 and thus movement across the track pad may generate static. The force concentrator layer 1102, however, may protect components of the input device 104 that are exposed beneath the layer from this potential ESD. A variety of other examples of such protection are also contemplated without departing from the spirit and scope thereof.

Support Layer

Figure 14:
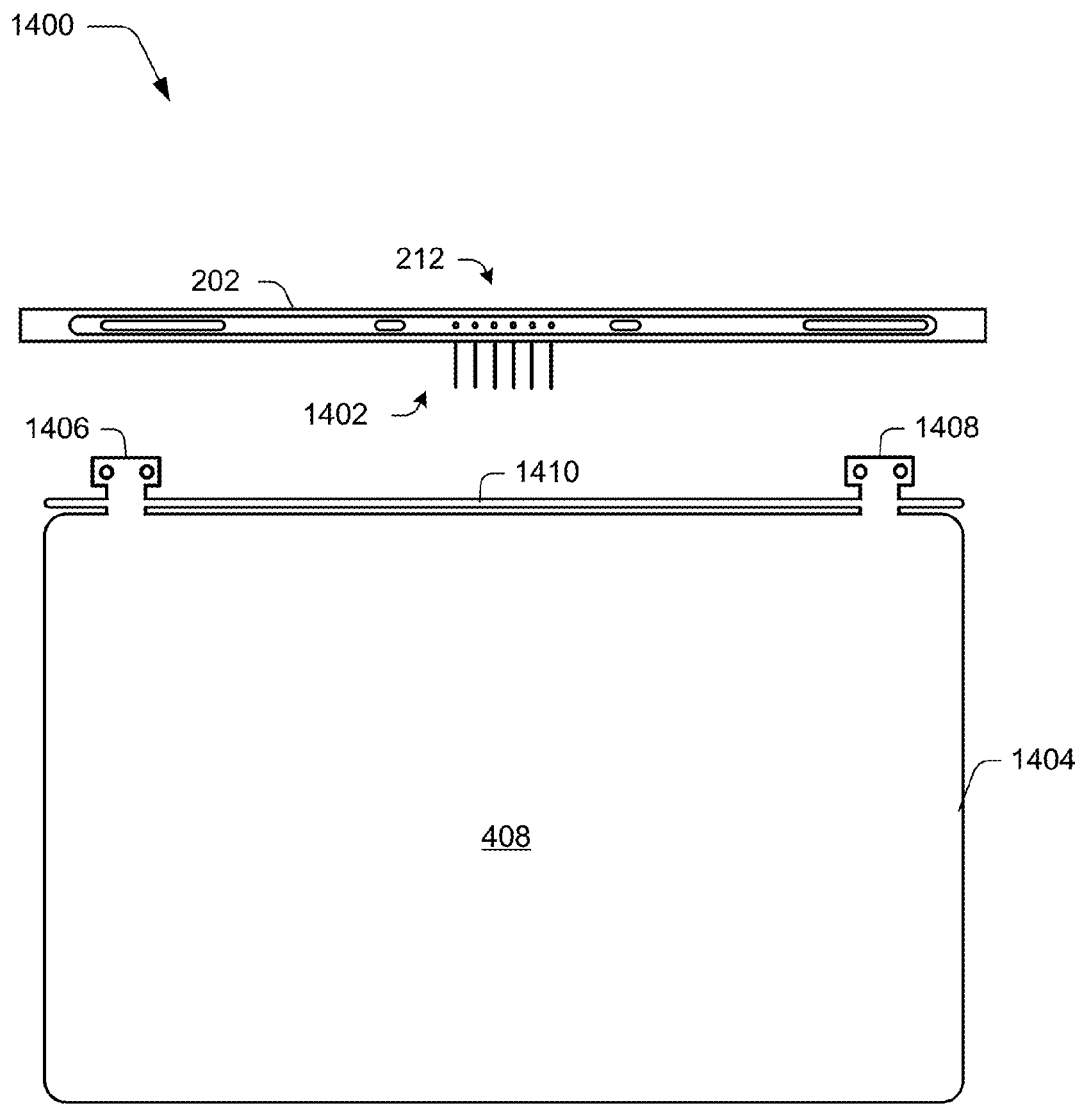
FIG. 14 depicts an example implementation showing a support layer that is configured to support operation of the flexible hinge as well as protect components of the input device during this operation.

FIG. 14 depicts an example implementation 1400 showing the support layer 408 that is configured to support operation of the flexible hinge 106 as well as protect components of the input device 104 during this operation. As previously described, the flexible hinge 106 may be configured to support various degrees of bending to assume the different configurations. However, materials chosen to form the flexible hinge 106, such as to form the outer layers 402, 416 of the flexible hinge 106 may be chosen to support a desired "look and feel" and therefore may not provide desired resiliency against tearing and stretching.

Therefore, in such an instance this could have an effect on operability of conductors 1402 that are used to communicatively couple keys and other components of the input device 104 with the computing device 102. For example, a user may grasp the input device 104 with one hand to pull it away from the computing device 102 by disengaging the protrusions 208 and magnetic attraction supported by the magnets. Therefore, this could result in an amount of force being applied to the conductors that is sufficient to break them absent sufficient support from the first or second outer layers 402, 416 or other structure.

Accordingly, the input device 104 may include a support layer 408 that may be configured to protect the flexible hinge 106 and other components of the input device 104. For example, the support layer 408 may be formed of a material that has a higher resistance to tearing and stretching than a material used to form the outer layers 402, 416, e.g., biaxially-oriented polyethylene terephthalate (BoPET) which is also known as Mylar.

Support provided by the support layer 408 may thus help protect the material used to form the outer layers 402, 416 of the flexible hinge 106. The support layer 408 may also help protect components disposed through the hinge, such as the conductors 1402 used to communicatively couple the connection portion 202 with the keys.

In the illustrated example, the support layer 408 includes a portion 1404 configured to be disposed as part of the input portion 914 of the input device 104 that includes the keys, track pad, and so on as shown in FIG. 1. The support layer 408 also includes first and second tabs 1406, 1408 that are configured to extend from the portion 1404 through the flexible hinge 106 to be secured to the connection portion 202. The tabs may be secured in a variety of ways, such as to include one or more holes as illustrated through which a protrusion (e.g., screw, pin, and so on) may be inserted to secure the tabs to the connection portion 202.

The first and second tabs 1406, 1408 are illustrated in this example as being configured to connect at approximate opposing ends of the connection portion 202. In this way, undesirable rotational movement may be restricted, e.g., that is perpendicular to a longitudinal axis defined by the connection portion 202. Thus, the conductors 1402 disposed at a relative midpoint of the flexible hinge 106 and connection portion 202 may also be protected from tearing, stretching, and other forces The support layer 408 in this illustrated example also includes a mid-spine portion 1410 that is configured to form part of a mid-spine to increase the mechanical stiffness of the mid-spine and support a minimum bend radius. Although first and second tabs 1406, 1408 are illustrated, it should be readily apparent that more or fewer tabs may also be employed by the support layer 408 to support the functionality described.

Adhesive

Figure 15:
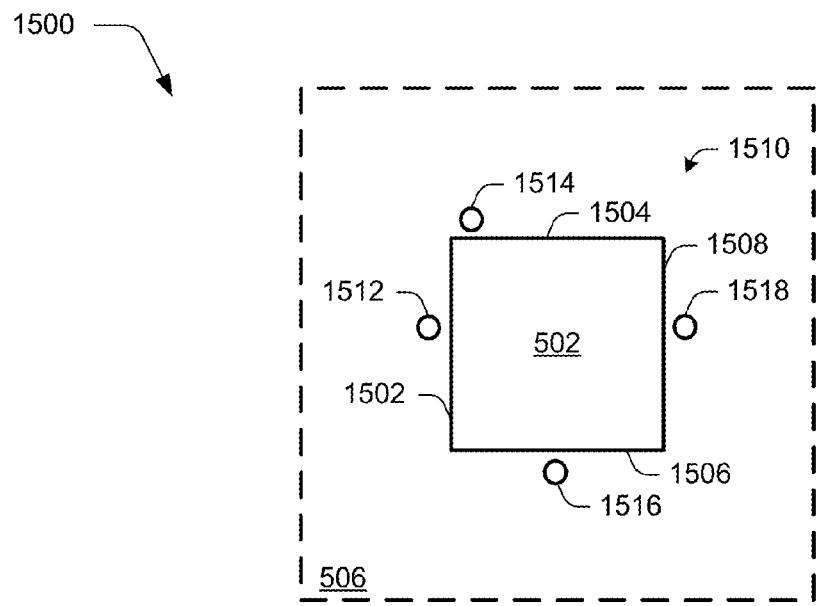
FIG. 15 depicts a bottom view of a pressure sensitive key of FIG. 5 as having a flexible contact layer secured at a plurality of locations along edges of the key.

FIG. 15 depicts a bottom view 1500 of a pressure sensitive key of FIG. 5 as having the flexible contact layer 502 secured at a plurality of locations along edges of the key. First, second, third, and fourth edges 1502, 1504, 1506, 1508 are illustrated in this example as defining an opening 1510 of a spacer layer 508 of a pressure sensitive key. The opening 1510 as described in relation to FIGS. 5-7 permits the flexible contact layer 502 to flex (e.g., bend and/or stretch) through the opening 1510 to contact the one or more conductors 512 of the sensor substrate 504.

In the illustrated example, a first securing portion 1512 is illustrated as disposed proximal to the first edge 1512 of the opening 1510. Likewise, second, third, and fourth securing portions 1514, 1516, 1518 are illustrated as disposed proximal to respective second, third, and fourth edges 1504, 1506, 1508 of the opening 1510. The securing portions may be configured in a variety of ways, such as through use of an adhesive, mechanical securing device (e.g., pins), and so on. For example, the adhesive may be applied as a series of dots or other shapes to the spacer layer 508 which is then contacted (e.g., pressed) to the flexible contact layer 502.

Regardless of the technique used to secure the flexible contact layer 502 to the spacer layer 508, flexibility may be configured as desired by permitting portions of the flexible contact layer 502 along the edge of the opening to remain unsecured. For instance, the first and second securing portions 1514, 1516 may define sole areas at which the flexible contact layer 502 is secured to the spacer layer 508 along the respective first and second edges 1502, 1504. Therefore, flexibility of the flexible contact layer 502 may decrease as a distance between a point of contact of the pressure and a securing portion decreases similar to the edge discussion of FIGS. 6 and 7, such as due to sliding of the flexible contact layer over the edge, permit increased stretching, and so forth.

However, the reverse is also true in that flexibility increases the further away pressure is applied from the securing portions. Thus, flexibility along the edges of the opening 1510 may be increased by including portions along an edge at which the flexible contact layer 502 is not secured (proximally) to the spacer layer 508. Thus, different arrangements of how the flexible contact layer 502 is secured to the spacer layer 404 may be used to support different amounts of flexibility at different locations of the flexible contact layer 502.

For example, as illustrated the first and second securing portions 1512, 1514 are located closer together than the first and third securing portions 1512, 1516. Accordingly, points (e.g., a midpoint) between the first and third securing portions 1512, 1516 may have greater flexibility than corresponding points (e.g., a midpoint) between the first and second securing portions 1512, 1514. In this way, a designer may configure the flexible contact layer 502 to increase or decrease flexibility at particular locations as desired.

Figure 16:
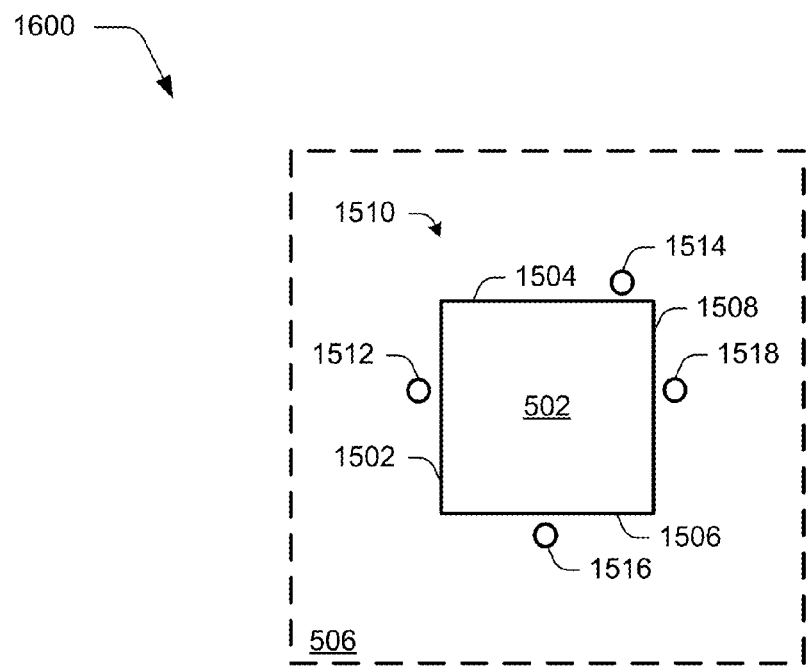
FIG. 16 depicts another version of FIG. 15 in which a securing portion is moved to a different location along an edge of the key.

In the example 1600 of FIG. 16, for instance, the second securing portion 1514 is moved from one end of the second edge 1504 to an opposing end of the second edge 1504. Thus, flexibility is increased on the left upper portion of the key in this example and decreased in the upper right portion of the key. A variety of other examples are also contemplated, examples of which are shown in relation to a keyboard in the following example.

Figure 17A:
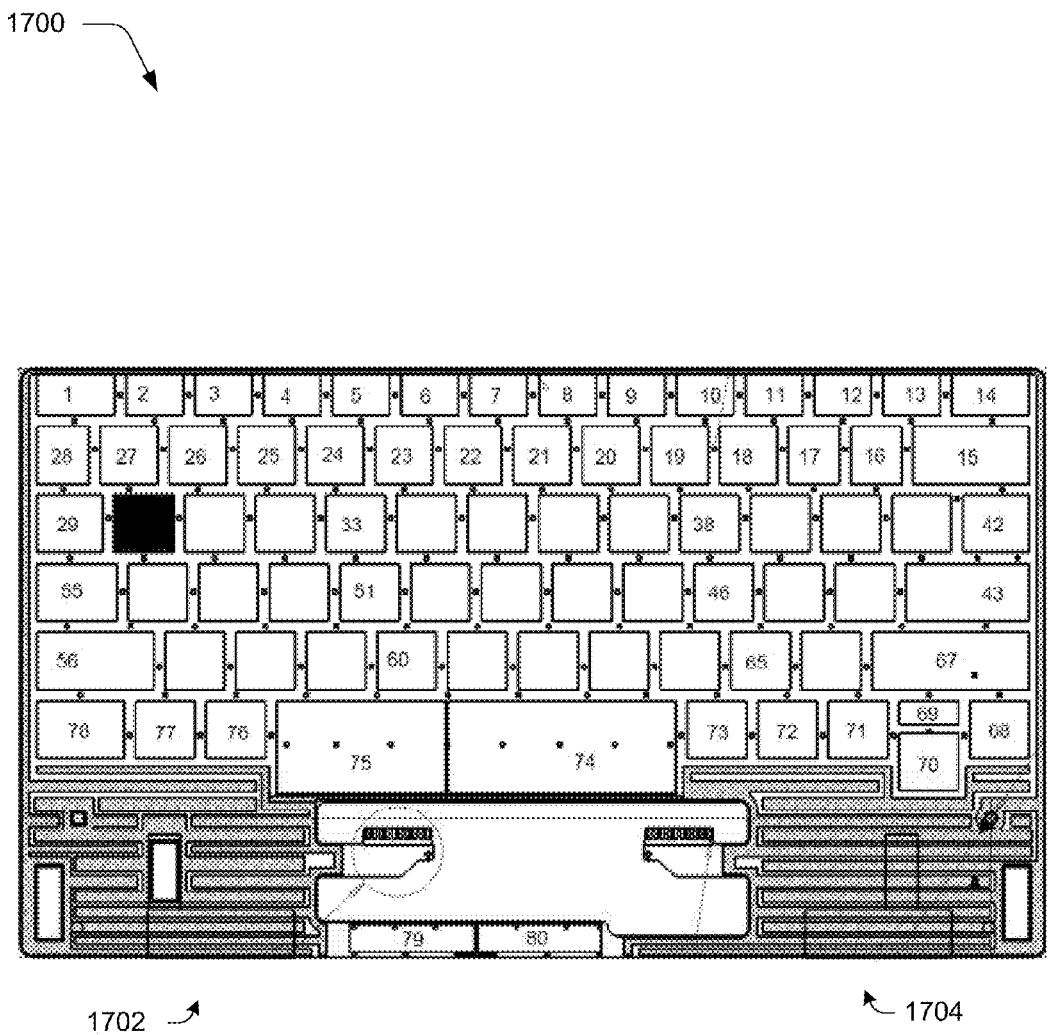
FIG. 17A depicts an example of an adhesive layer applied as part of a keyboard having a plurality of keys in which different arrangements of adhesive are used for different keys.

FIG. 17A depicts an example of an adhesive layer 1700 applied as part of a keyboard having a plurality of keys in which different arrangements of adhesive are used for different keys. Securing portions in this example are illustrated in black lines and dots of adhesive that are used to secured the flexible contact layer 502 with the spacer layer 506. As shown, different arrangements of the securing portions may be used to address differences in how corresponding keys are likely to be pressed.

For example, as shown the arrangements of adhesive for respective keys in the home row (e.g., keys 43-55) is different than arrangements of adhesive for a row of keys in the next lower row, e.g., keys 56-67. This may be performed to address "where" a key is likely to be pressed, such as at a center or particular one of the four sides of the key. This may also be performed to address "how" a key a likely to be pressed, such as using a pad of a finger as opposed to a user's fingernail, which finger of a user is likely to press the key, and so on. Thus, as illustrated in the example adhesive layer 1700 of FIG. 17, different arrangements may be used for different rows of keys as well as for different columns of the keys.

The adhesive layer 1700 in this example is also illustrated as forming first and second pressure equalization devices 1702, 1704. In this example, adhesive is disposed to leave channels formed between the adhesive. Thus, the adhesive defines the channels that form the device. The channels are configured to connect openings 1510 formed as part of the pressure sensitive keys between the flexible contact layer 502 and the sensor substrate 504 to an outside environment of the input device 104.

In this way, air may move between the outside environment and the openings through the channels to generally equalize the air pressure, which may help prevent damage to the input device 104, e.g., when faced with reduced air pressure in an airplane. In one or more implementations, the channels may be formed as a labyrinth having a plurality of bends to protect against outside contaminants from passing through the pressure equalization devices 1702, 1704 to the openings 1510. In the illustrated example, the pressure equalization devices 1702, 1704 are disposed as part of a palm rest of the spacer layer to leverage available space to form longer channels and thus further protect against contamination. Naturally, a wide variety of other examples and locations are also contemplated without departing from the spirit and scope thereof.

Figure 17B:
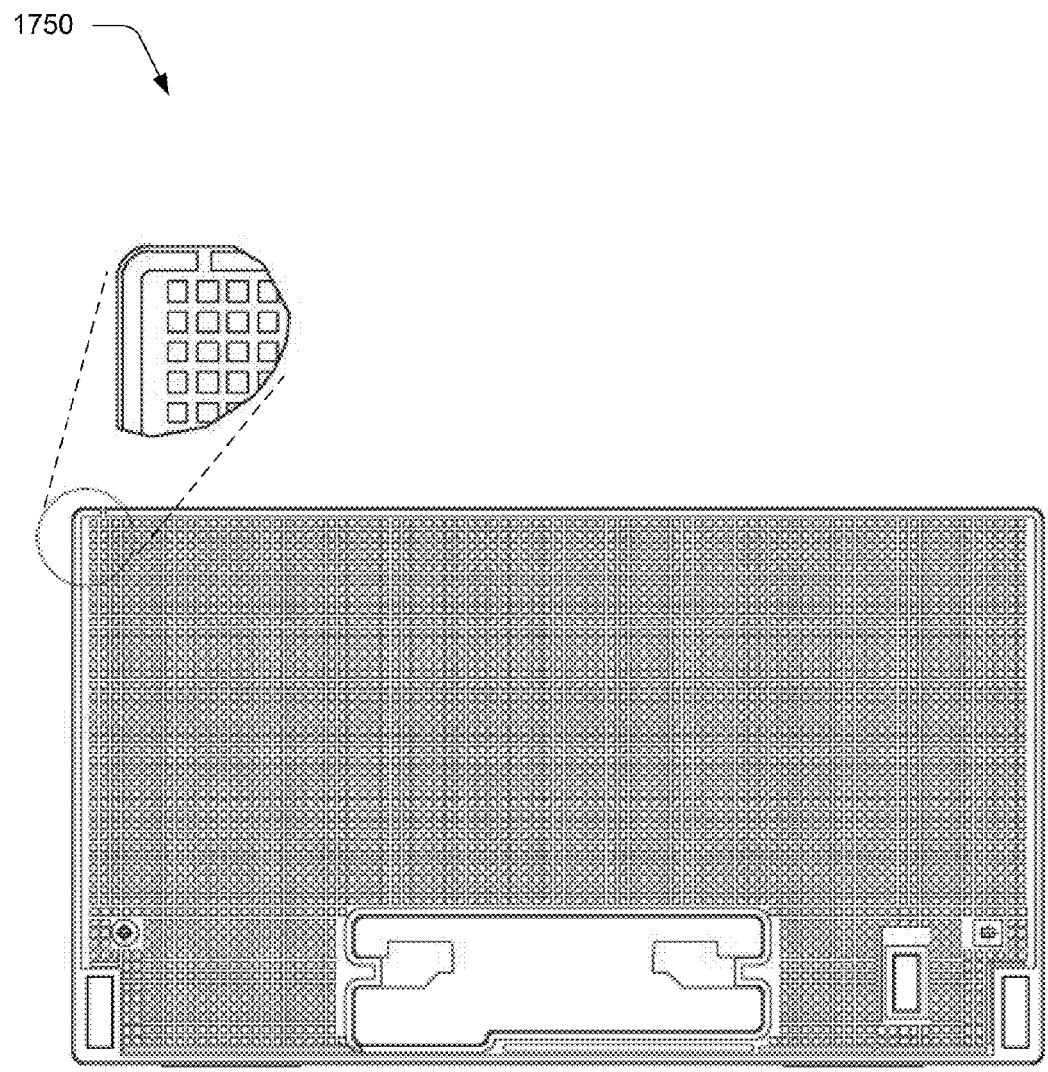
FIG. 17B depicts another example implementation of a layer incorporating a matric that may be used to reduce air entrapment.

FIG. 17B depicts another example implementation of a layer 1750 incorporating a matrix that may be used to reduce air entrapment, which may or may not correspond to the adhesive layer 410 of FIG. 4. In this example, strategic adhesive placement (or other securing techniques) is used to reduce air entrapment between consecutive layers. In the previous example, a vented labyrinth seal in the sensor substrate/flexible contact layer interface was described.

In this example, a layer (e.g., below the sensor substrate 202) is not configured as a "full bleed adhesive sheet," but instead is a square matrix of adhesive patches that bind the consecutive layers together. This allows easier assembly and eliminates air entrapment between layers. In this way, multiple layers may be bonded together through adhesive construction to achieve thin profile, stiffness, and allow internal electronics nesting of components.

Nesting

Figure 18:
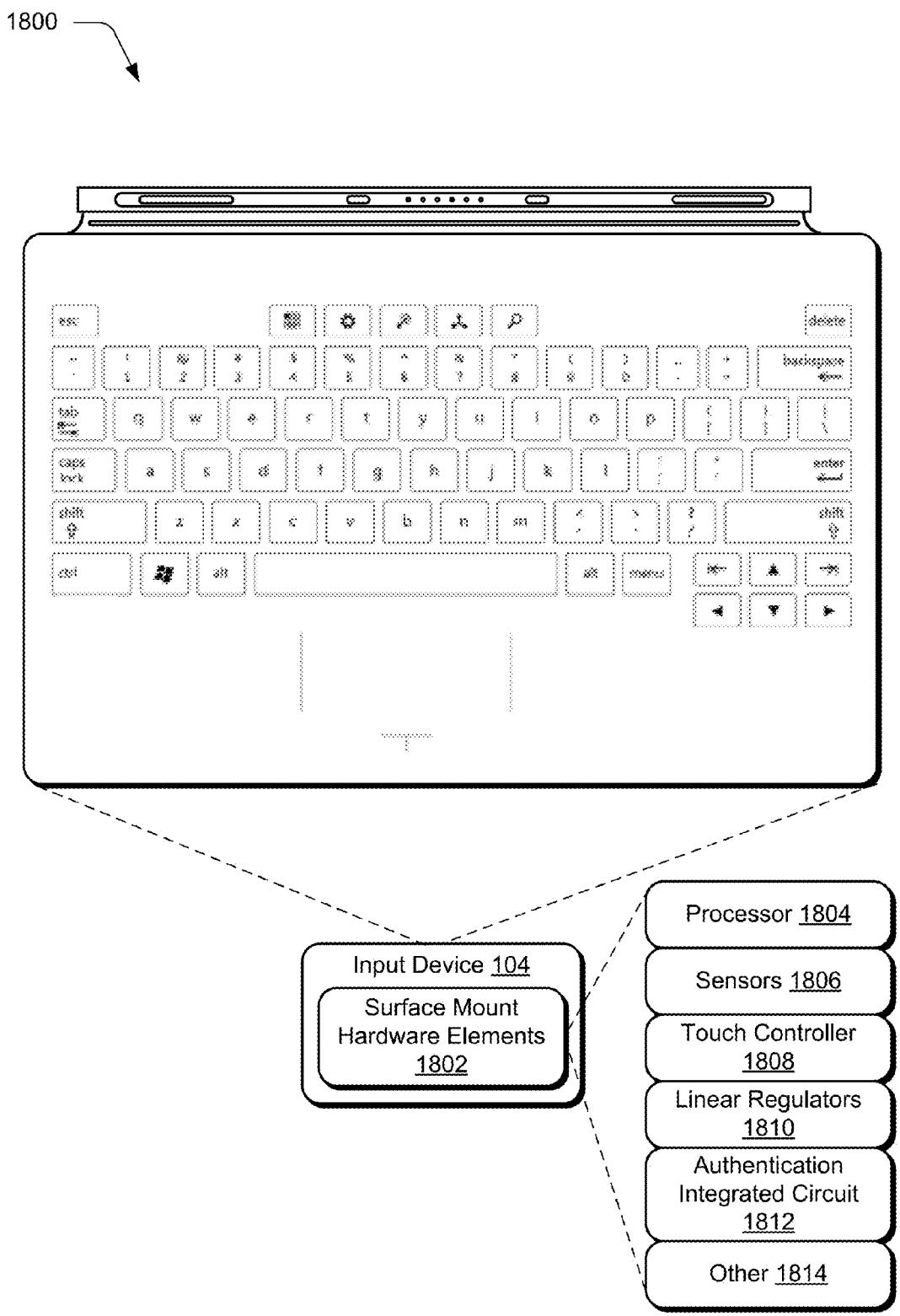
FIG. 18 depicts an example of surface mount hardware elements that may be used to support functionality of the input device of FIG. 1.

FIG. 18 depicts an example 1800 of surface mount hardware elements 1802 that may be used to support functionality of the input device 104. The input device 104 may be configured in a variety of ways to support a variety of functionality. For example, the input device 104 may be configured to include pressure sensitive keys as described in relation to FIGS. 5-7, a track pad as shown in FIG. 1, or other functionality such as mechanically switched keys, a biometric reader (e.g., fingerprint reader), and so on.

Accordingly, the input device 104 may include a variety of different types of surface mount hardware elements 1802 to support this functionality. For example, the input device 104 may include a processor 1804 which may be leveraged to perform a variety of different operations. An example of such an operation may include processing signals generated by the pressure sensitive keys 500 of FIG. 5 or other keys (e.g., mechanically switched keys that are not pressure sensitive) into a human interface device (HID) compliant input, such as to identify a particular keystroke. Thus, in this example the input device 104 may perform the processing of the signals and provide a result of this processing as an input to the computing device 102. In this way, the computing device 102 and software thereof may readily identify the inputs without modification, such as by an operating system of the computing device 102.

In another example, the input device 104 may include one or more sensors 1806. The sensors 1806, for instance, may be leveraged to detect movement and/or an orientation of the input device 104. Examples of such sensors 1806 include accelerometers, magnetometers, inertial measurement units (IMUs), and so forth.

In a further example, the input device 104 may include a touch controller 1808, which may be used to process touch inputs detected using one or more keys of the keyboard, the track pad, and so forth. In yet a further example, the input device 104 may include one or more linear regulators 1810 to maintain a relatively steady voltage for electrical components of the input device 104.

The input device 104 may also include an authentication integrated circuit 1812. The authentication integrated circuit 1812 may be configured to authenticate the input device 104 for operation with the computing device 102. This may be performed in a variety of ways, such as to share secrets between the devices that are processed by the input device 104 and/or the computing device 102 to perform the authentication. A variety of other 1814 surface mount hardware elements 1802 are also contemplated to support a variety of different functionality.

As previously described, however, inclusion of the surface mount hardware elements 1802 using conventional techniques may have an adverse effect on an overall thickness of the input device 104. However, in one or more implementations described herein layers of the input device 104 may include nesting techniques to mitigate this effect, further discussion of which may be found in relation to the following figure.

Figure 19:
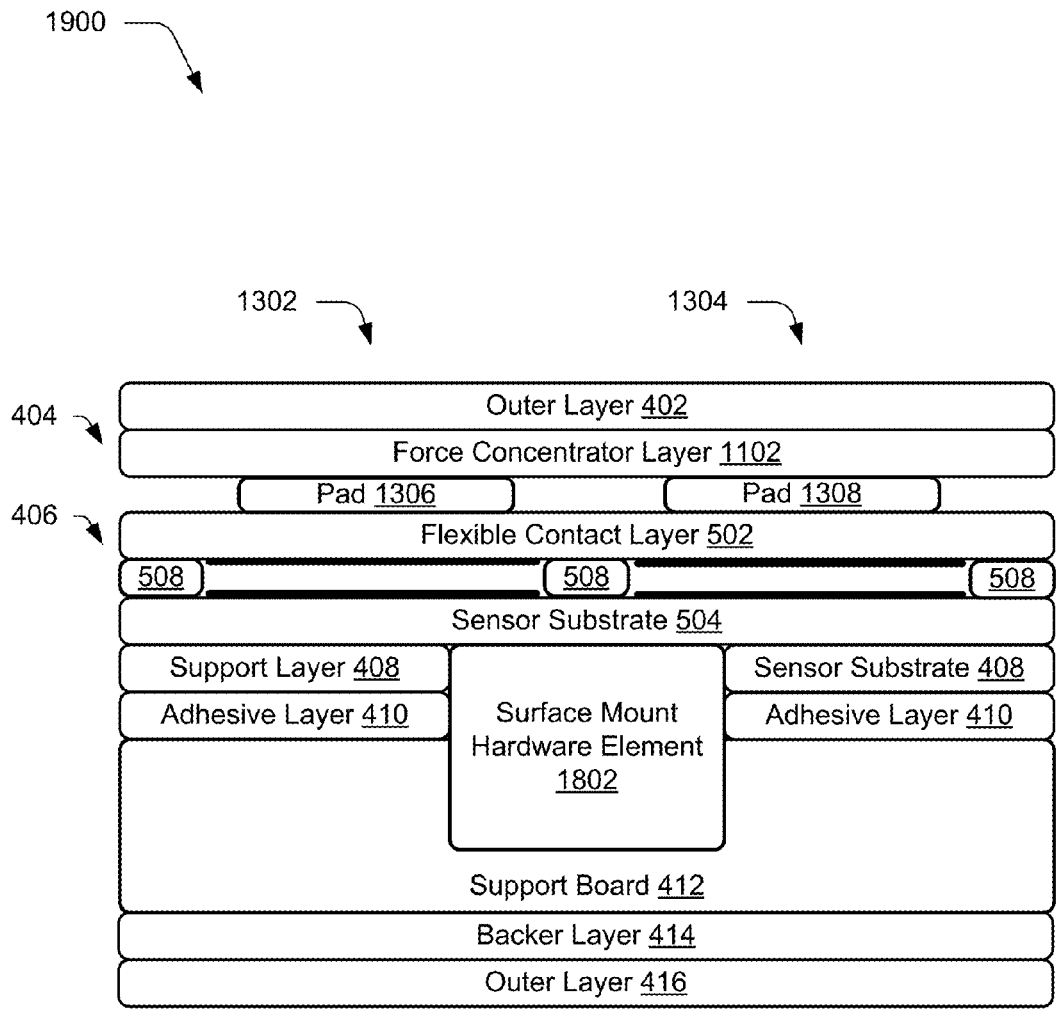
FIG. 19 illustrates an example implementation in which the surface mount hardware element of FIG. 18 is depicted as being nested in one or more layers of the input device.

FIG. 19 illustrates an example implementation 1900 in which the surface mount hardware element 1802 of FIG. 18 is depicted as being nested in one or more layers of the input device 104. As previously described, the input device may include top and bottom outer layers 402, 416 which may be formed to have a desirable tactile feel to a user, such as through formation using microfiber, and so on. The outer layer 402, for instance, may be configured using an embossed fabric (e.g., 0.6 millimeter polyurethane) in which the embossing is used to provide indications of underlying keys as well as indications of respective functions of the keys.

A force concentrator 404 is disposed beneath the outer layer 402 that includes a force concentrator layer 1102 and a plurality of pads 1306, 1308 to support respective first and second pressure sensitive keys 1302, 1304. The force concentrator 404 may be configured to provide a mechanical filter, force direction, and to hide witness lines of underlying components.

A pressure sensitive key assembly 406 is disposed beneath the pads 1306, 1308 of the force concentrator layer 1102 in this example, although other examples are also contemplated in which a force concentrator 404 is not utilized. The pressure sensitive key assembly 406 includes layers used to implement pressure sensitive keys. As described in FIG. 5, for instance, the flexible contact layer 502 may include a force sensitive ink, which through flexing the flexible contact layer 502 may contact one or more conductors of the sensor substrate 504 to generate a signal usable to initiate an input.

The sensor substrate 504 may be configured in a variety of ways. In the illustrated example, the sensor substrate 504 includes a first side on which the one or more conductors are configured, such as through implementation as traces on a printed circuit board (PCB). A surface mount hardware element 1802 is mounted to second side of the sensor substrate 504 that is opposite the first side.

The surface mount hardware element 1802, for instance, may be communicatively coupled through the sensor substrate 504 to the one or more conductors of the first side of the sensor substrate 504. The surface mount hardware element 1802 may then process the generated signals to convert the signals to HID compliant inputs that are recognizable by the computing device 102.

This may include processing of analog signals to determine a likely intention of a user, e.g., to process miss hits, signals from multiple keys simultaneously, implement a palm rejection threshold, determine if a threshold has been exceeded that is indicative of a likely key press, and so on. As previously described in relation to FIG. 18, a variety of other examples of functionality that may be implemented using surface mount hardware elements of the input device 104 are contemplated without departing from the spirit and scope thereof.

In order to reduce an effect of a height the surface mount hardware element 1802 on an overall thickness of the input device 104, the surface mount hardware element 1802 may disposed through one or more holes of other layers of the input device 104. In this example, the surface mount hardware element 1802 is disposed through holes that are made through the support layer 408 and the adhesive layer 410 and at least partially through the support board 412. Another example is also illustrated in FIG. 4 in which holes are formed entirely through each of the support layer 408, adhesive layer 410, and the support board 412.

Thus, in this example an overall thickness of the layers of the input device 104 of the force concentrator layer 1102 through the backer layer 414 and the layers disposed in between may be configured to have a thickness of approximately 2.2 millimeters or less. Additionally, depending on the thickness of the material chosen for the outer layers 402, 416 the overall thickness of the input device 104 at a pressure sensitive key may be configured to be approximately at or below three and a half millimeters. Naturally, other thicknesses are also contemplated without departing from the spirit and scope thereof.

Key Formation

Figure 20:
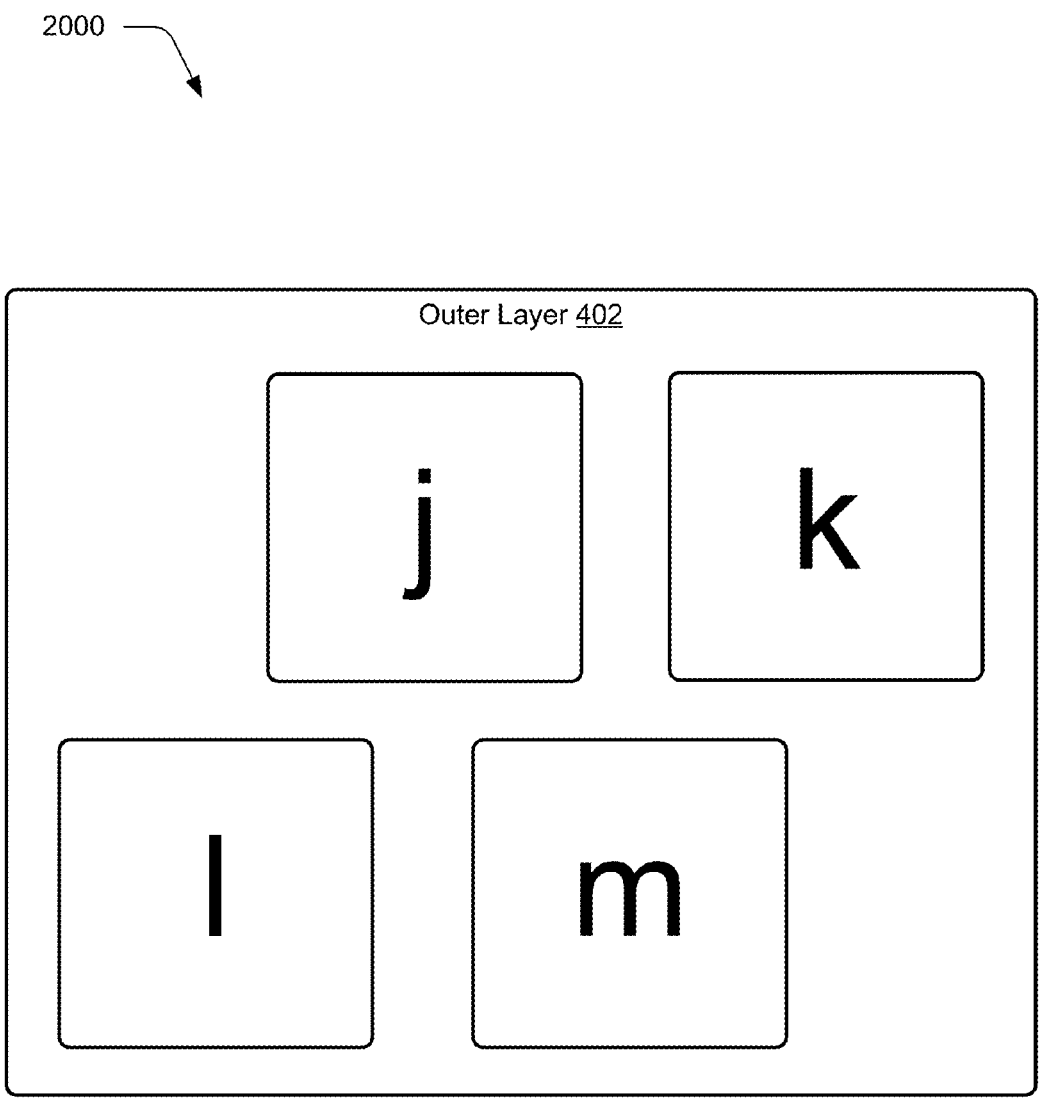
FIG. 20 depicts an example implementation showing a top view of an outer surface of the input device of FIG. 1 that includes a plurality of keys.

FIG. 20 depicts an example implementation 2000 showing a top view of an outer surface 402 of the input device 104 of FIG. 1 that includes a plurality of keys. In this example, the outer surface 402 of the input device is configured to cover a plurality of keys of a keyboard, examples of which are illustrated as the letters "j," "k", "l", and "m" but naturally other keys and corresponding functions are also contemplated, such as numbers, punctuation, different languages and layouts, functions (e.g., a piano keyboard, game controller), and so on.

As previously described, conventional techniques that were utilized to configure an input device to support a thin form factor could result in an inefficient and undesirable user experience when interacting with the device, e.g., such as to type, due to difficulty in locating and identifying particular keys of the device. However, techniques are described in this section and elsewhere that may be employed to aid a user's experience with the input device 104.

The keys in this example are illustrated as indicating a border of the key as a rectangle having rounded corners, which may correspond to the edges of the spacer layer 506 of the key 400 described previously. Naturally, borders may be indicated in a variety of other ways, such as lines along one or more edges of the key, a series of dots, and so forth.

Regardless of a shape and pattern of how the border is indicated, the indications may be configured to provide tactile feedback such that a user may locate the keys using one or more fingers of the user's hand. For example, the border may be indicated through a series of protrusions that "stick up" from a surface of the outer layer 402. In another example, embossing techniques may be used to form depressions in the outer layer 402 to indicate the border, further discussion of which may be found beginning in relation to FIG. 23.

The keys may also include indications of respective functions of the keys such that a user may readily identify the function on sight, examples of which include the letters "j," "k," "l," and "m" although other examples are also contemplated as previously described. Conventional techniques that were relied upon to provide such indications could lack permanency, especially when applied to a flexible surface such as the outer layer 402 of FIG. 20. Accordingly, techniques are described herein in which the indications of functions are formed within the outer layer 402 itself and therefore provide resiliency against damage, further discussion of which may be found beginning in relation to FIG. 25.

Figure 21:
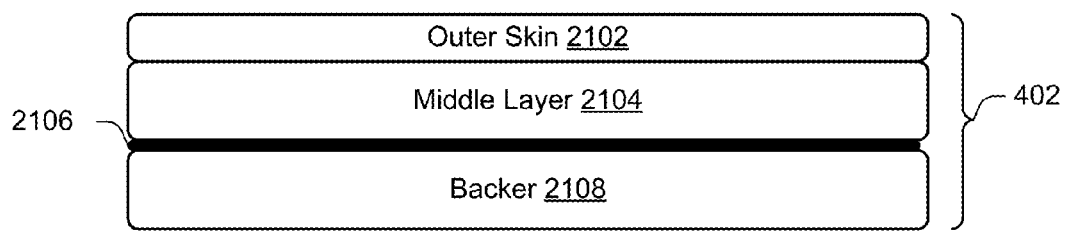
FIG. 21 depicts a cross section view of the outer layer of FIGS. 4 and 20.

FIG. 21 depicts a cross section view 2100 of the outer layer 402 of FIGS. 4 and 20. The outer layer 402 in this example is shown as formed from a plurality of layers. These layers include an outer skin 2102, a middle layer 2104, a base layer 2106, and a backer 2108. These layers form the outer layer 402 that acts as an outer cover to the input device 104 that includes the indications of borders and inputs as described in relation to FIG. 20.

In this example the outer skin 2102 and middle layer 2104 are "dry" in that solidifying (e.g., curing, drying, forming from a melted material, etc.) is not involved when forming the layers together to form the outer layer 402. The base layer 2106 in this example is a "wet" layer in that it formed to bond as part of the backer 2108. For example, the backer 2108 may be formed as a weave (e.g., nylon tricot weave) such that the baser layer 2106 is melted within the weave to bond the backer 2108 to the middle layer 2104.

As previously described, a thin form factor may be desired for the input device 104 (e.g., to support use as a cover) and therefore thinness of the outer layer 402 and the components of the layer may be used to support this form factor. In an implementation, the outer skin 2102 is formed from a polyurethane having a thickness of approximately 0.065 millimeters, although other materials and thicknesses are also contemplated. The middle layer 2104 is formed to have a thickness of approximately 0.05 millimeters from an open cell material that may be colored as further described in relation to FIG. 25.

The base layer 2106 as described above may be formed as a wet layer that melts within the backer 2108 and thus may be considered to have a minimal effect on thickness of the outer layer 402. The backer 2108 is formed from a weave material (e.g., nylon tricot) having a thickness of approximately 0.3 millimeters. Thus, the outer layer 402 as a whole may be configured to support the thin form factor of the input device 104. However, through such a configuration, conventional formation of the borders of the keys and indications of the keys could not be applied to such a form factor. Accordingly, techniques are described herein that may be used for such thicknesses as further described in beginning in relation to FIGS. 23 and 25, respectively.

Figure 22:
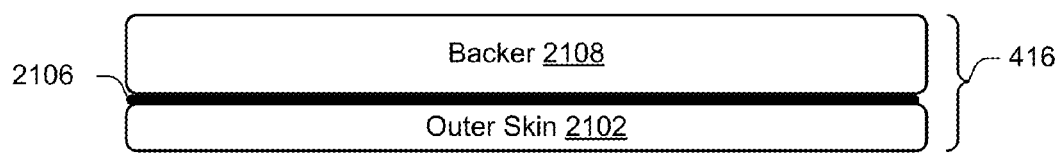
FIG. 22 depicts a cross section view of an outer layer of FIG. 4.

FIG. 22 depicts a cross section view 2200 of the outer layer 416 of FIG. 4. This outer layer 416 is configured to cover a bottom of the input device 104 in this example. Accordingly, the middle layer 2104 of the outer layer 402 may be left out to further promote thinness of the input device 104. For example, the outer layer 416 may include the outer skin 2102, base layer 2106, and backer 2108 as described above but not include the middle layer 2104.

Figure 25:
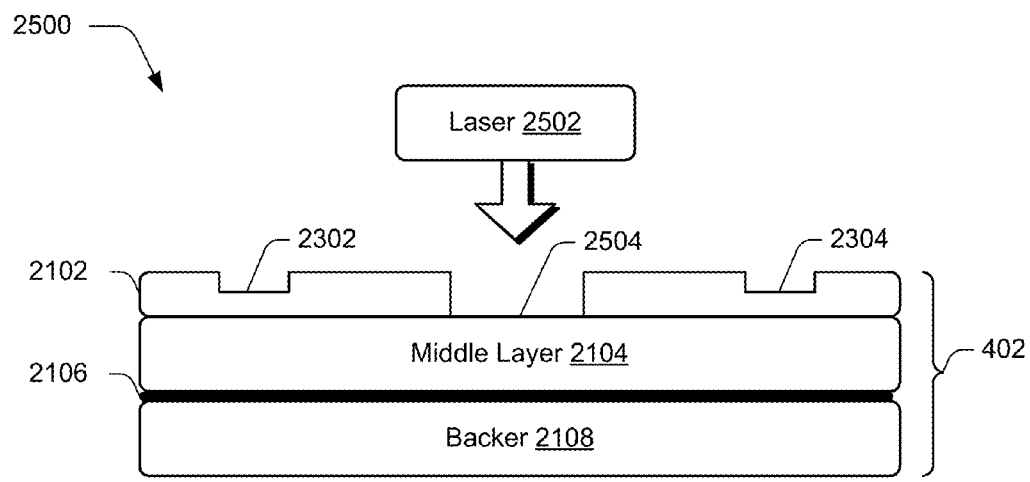
FIG. 25 depicts an example implementation in which a portion of an outer skin is removed to expose a middle layer to form an indication of a function of a key or other indication.

However, other implementations are also contemplated, such as to include the middle layer 2104 to support indications and other writing as further described in relation to FIG. 25. It should be readily apparent that the outer layer 416 may also be configured in a variety of other ways to include a variety of other sub-layers that differ from the outer layer 402 of FIG. 21 without departing from the spirit and scope thereof.

Figure 23:
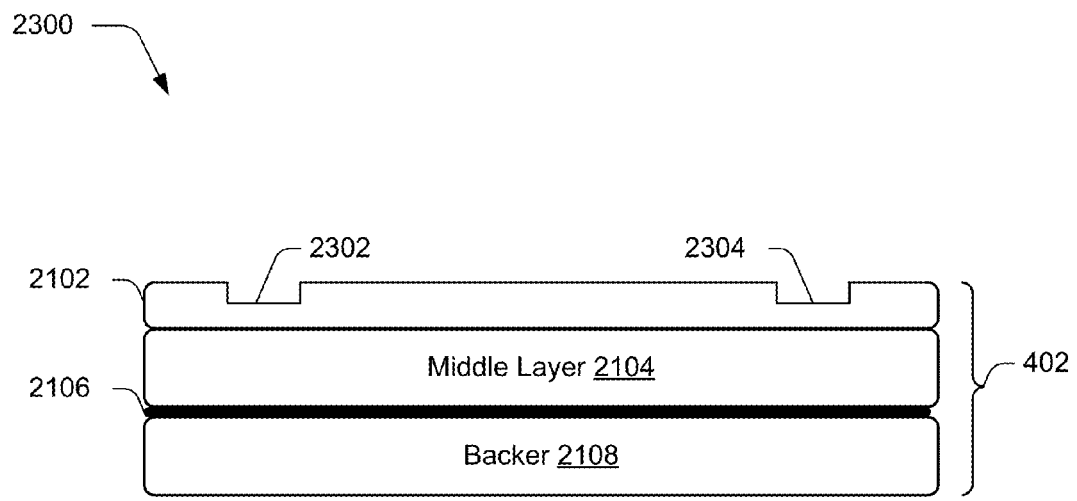
FIG. 23 depicts a cross section view of an outer layer of FIG. 21 in which a border of a key is formed in an outer skin.

FIG. 23 depicts a cross section view 2300 of the outer layer 402 of FIG. 21 in which a border of a key is formed in the outer skin 2102. In this example, first and second depressions 2302, 2304 are formed to indicate a border of a key as described in relation to FIG. 20. As previously described, overall thinness of the input device 104 may be supported through using thinner layers to form the device.

Conventional techniques used to form these layers, however, may be insufficient for a desired purpose. For instance, conventional techniques involving embossing typically used material with thicknesses of well over one millimeter to make depressions. Such depressions could thus be made to have a depth that is sufficient to be felt tactilely by a user. On the contrary, embossing of a material having a thickness of less than a millimeter may result in a depression that is not easily identified by a user using conventional techniques. An example of this includes the thickness of the outer skin 2102 in the present example of approximately 0.065 millimeters which would accordingly support a depth of a depression that is even less than that.

Techniques are described in which embossing may be used to form depressions 2302, 2304 that may be felt tactilely by a user that have a depth that is less than that of conventional depressions. For example, the first and second depressions 2302, 2304 may be configured to have a depth of approximately one third of a thickness of the outer skin 2102, such as approximately 0.02 millimeters. Using conventional techniques such a depth was not readily felt tactilely by a user.

However, using techniques described herein the first and second depressions may be formed to have sharp edges (having at least one edge such as a substantially right angle) that may be felt tactilely by the user. In this way, a user may readily feel edges of a key for an improved typing experience yet the overall thickness of the outer skin 2102, and thus the outer layer 402 and input device itself may be configured to support a thin form factor. The outer skin 2102, for instance, may be configured to have a minimum amount of thickness such that the middle dry layer 2104 is not viewable through the outer skin 2102. This may be used to support formation of indications through different colorings of the layers as further described beginning in relation to FIG. 25. The first and second depressions 2302, 2304 may be formed in a variety of ways, an example of which is described in relation to the following figure.

Figure 24:
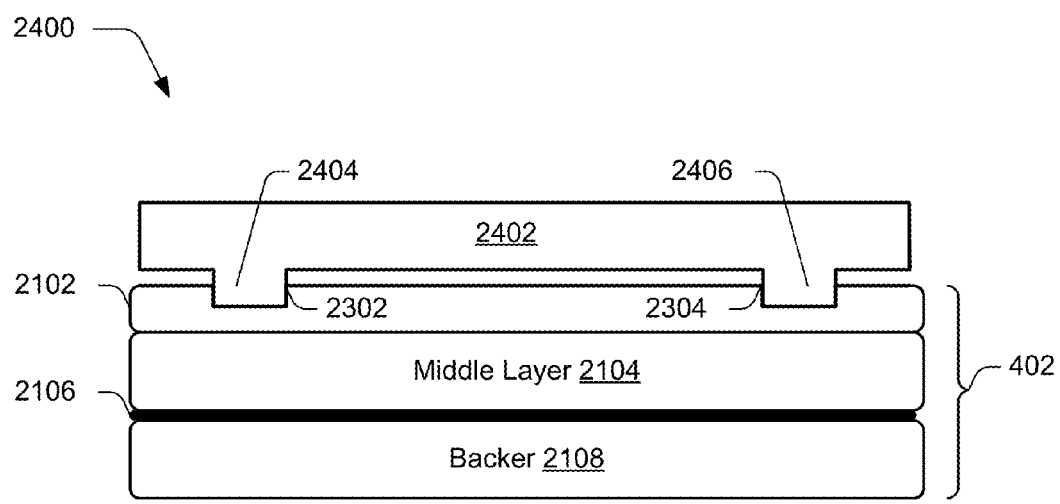
FIG. 24 depicts an example implementation in which first and second depressions of FIG. 23 are formed in an outer skin of an outer layer.

FIG. 24 depicts an example implementation 2400 in which the first and second depressions 2302, 2304 of FIG. 23 are formed in the outer skin 2102 of the outer layer 402. In this example, a heated plate 2402 (e.g., a copper heated plate) includes first and second protrusions 2404, 2406 that are configured to form the first and second 2302, 2304 depressions in the outer skin 2102.

The heated plate 2402, for instance, may be heated to a temperate that is sufficient to emboss yet not burn the outer skin 2102, e.g., less than 130 degrees Celsius such as in a range of 110-120 degrees Celsius. The heated plate 2402 may then be pressed against the outer skin 2102 of the outer layer 402 using a pressure that is sufficient to form the first and second depressions 2302, 2304, which may again be chosen on the characteristics of the material used to form the outer skin 2102.

In the illustrated example of FIG. 24, the heated plate 2402 is pressed against the outer skin 2102 to form the first and second depressions 2302, 2304. As shown, a height of the first and second protrusions 2404, 2406 is greater than a depth of the first and second depressions 2302, 2303 that are formed in the outer skin 2102. In this way, portions of the outer skin 2102 that are not to be embossed (e.g., an area between the first and second protrusions 2404, 2406 in this example) are not contacted by the heated plate 2402. This may help to preserve an original look and feel of the outer skin 2402 as originally manufactured. Other implementations are also contemplated in which the heated plate 2402 does touch the outer skin 2102 along this portion.

In one or more implementations, the heated plate 2402 is configured to provide a different look and feel (e.g., appearance and texture) to the portions of the outer skin 2102 that are embossed in comparison with portions of the outer skin 2102 that are not embossed. In this way, a user may determine the boundary of the keys readily by look and feel. In another implementation, the heated plate 2402 is configured to form the first and second depressions 2302, 2304 to have a similar look and feel to a surface of the outer skin 2102. This may be performed in a variety of ways, such as through sandblasting of the heated plate 2402. A variety of other implementations are also contemplated without departing from the spirit and scope thereof.

FIG. 25 depicts an example implementation 2500 in which a portion of the outer skin 2102 is removed to expose the middle layer 2104 to form an indication of a function of a key. In this example, the outer layer 402 having the embossed first and second depressions 2302, 2304 is shown, although this technique may also be applied to the outer layer 402 before embossing, e.g., the outer layer of FIG. 21.

A laser 2502 is shown as transmitting a laser beam depicted as an arrow to remove a portion of the outer skin 2102. By removing this portion, a corresponding portion 2504 of the middle layer 2104 is exposed to be viewable by a user of the outer layer 402. Thus, by using a middle layer 2104 that has a color that is different from a color of outer skin 2102, indications of functions of respective keys and other indicia (e.g., warnings, logos, and so on) may be formed in the outer surface 402. A variety of different colors may be utilized, such as white for the middle layer 2104 and charcoal for the outer layer 2102.

In one or more implementations, the middle layer 2104 is formed to have a sufficient thickness such that it is not discolored or undesirably melted during removal of the portion. Further, a thickness of the outer skin 2102 may be chosen such that the middle layer 2104 is not viewable through portions of the outer skin 2102 that have not had material removed, i.e., so that the middle layer 2104 is not viewable through the material of the outer skin 2102.

Additionally, the laser 2502 may also be chosen based on the color of material used to form the outer skin 2102. For example, different wavelengths may support removal of different colors of material. In this way, a variety of different types of indications may be formed as part of the outer surface 402 which may then be used as a cover for the key assembly of the input device 104.

Figure 26:
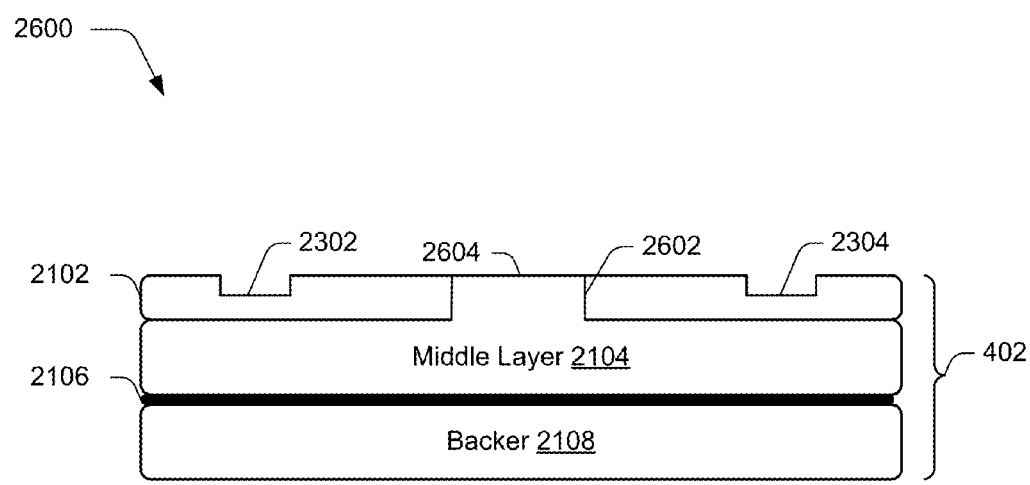
FIG. 26 depicts an example implementation in which removal of a portion of an outer skin causes a middle layer to expand through an opening formed in the outer skin.

FIG. 26 depicts an example implementation 2600 in which removal of a portion of the outer skin 2102 causes the middle layer 2104 to expand through an opening formed in the outer skin 2102. An opening 2602 may be formed in the outer skin 2102 as previously described in relation to FIG. 25. In this example, however, the middle layer 2104 is configured to expand in response to this removal.

Heat from the laser 2502 of FIG. 25, for instance, may cause an open cell structure of the middle layer 2104 to expand. This expansion may cause the middle layer 2104 to pass through an opening 2602 formed in the middle layer 2102. Further, the heat may also cause an exposed surface 2604 of the middle layer 2104 to form a generally smooth surface. In the illustrated example, this expansion is configured such that the exposed surface 2604 of the middle layer 2104 forms a substantially continuous surface with the outer skin 2102, e.g., the surfaces are generally contiguous. A variety of other examples are also contemplated, including differing amount of expansion of the middle layer 2104 (e.g., to extend past a surface of the outer skin 2102), having the middle layer 2104 remain below the surface of the outer skin 2102, having the middle layer 2104 remain as shown in FIG. 25, and so forth.

Example System and Device

Figure 27:
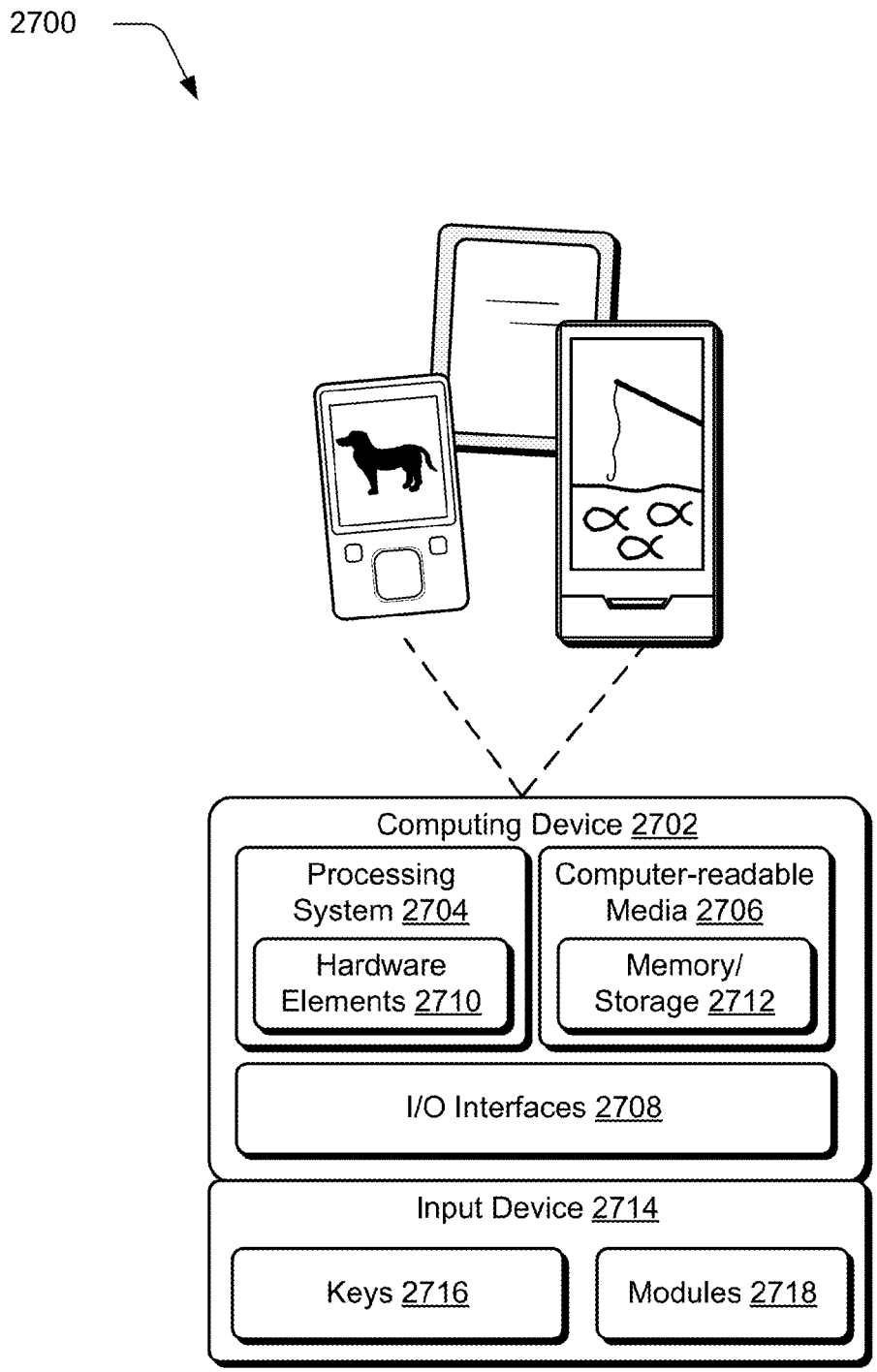
FIG. 27 illustrates an example system including various components of an example device that can be implemented as any type of computing device as described with reference to the other figures to implement embodiments of the techniques described herein.

FIG. 27 illustrates an example system generally at 2700 that includes an example computing device 2702 that is representative of one or more computing systems and/or devices that may implement the various techniques described herein. The computing device 2702 may be, for example, be configured to assume a mobile configuration through use of a housing formed and size to be grasped and carried by one or more hands of a user, illustrated examples of which include a mobile phone, mobile game and music device, and tablet computer although other examples are also contemplated.

The example computing device 2702 as illustrated includes a processing system 2704, one or more computer-readable media 2706, and one or more I/O interface 2708 that are communicatively coupled, one to another. Although not shown, the computing device 2702 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 2704 is representative of functionality to perform one or more operations using hardware. Accordingly, the processing system 2704 is illustrated as including hardware element 2710 that may be configured as processors, functional blocks, and so forth. This may include implementation in hardware as an application specific integrated circuit or other logic device formed using one or more semiconductors. The hardware elements 2710 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 2706 is illustrated as including memory/storage 2712. The memory/storage 2712 represents memory/storage capacity associated with one or more computer-readable media. The memory/storage component 2712 may include volatile media (such as random access memory (RAM)) and/or nonvolatile media (such as read only memory (ROM), Flash memory, optical disks, magnetic disks, and so forth). The memory/storage component 2712 may include fixed media (e.g., RAM, ROM, a fixed hard drive, and so on) as well as removable media (e.g., Flash memory, a removable hard drive, an optical disc, and so forth). The computer-readable media 2706 may be configured in a variety of other ways as further described below.

Input/output interface(s) 2708 are representative of functionality to allow a user to enter commands and information to computing device 2702, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 2702 may be configured in a variety of ways to support user interaction.

The computing device 2702 is further illustrated as being communicatively and physically coupled to an input device 2714 that is physically and communicatively removable from the computing device 2702. In this way, a variety of different input devices may be coupled to the computing device 2702 having a wide variety of configurations to support a wide variety of functionality. In this example, the input device 2714 includes one or more keys 2716, which may be configured as pressure sensitive keys, mechanically switched keys, and so forth.

The input device 2714 is further illustrated as include one or more modules 2718 that may be configured to support a variety of functionality. The one or more modules 2718, for instance, may be configured to process analog and/or digital signals received from the keys 2716 to determine whether a keystroke was intended, determine whether an input is indicative of resting pressure, support authentication of the input device 2714 for operation with the computing device 2702, and so on.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 2702. By way of example, and not limitation, computer-readable media may include "computer-readable storage media" and "computer-readable signal media."

"Computer-readable storage media" may refer to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 2702, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 2710 and computer-readable media 2706 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 2710. The computing device 2702 may be configured to implement particular instructions and/or functions corresponding to the software and/or hardware modules. Accordingly, implementation of a module that is executable by the computing device 2702 as software may be achieved at least partially in hardware, e.g., through use of computer-readable storage media and/or hardware elements 2710 of the processing system 2704. The instructions and/or functions may be executable/operable by one or more articles of manufacture (for example, one or more computing devices 2702 and/or processing systems 2704) to implement techniques, modules, and examples described herein.

CONCLUSION

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:

1. An input device comprising:
a key assembly including a plurality of keys that are usable to initiate respective inputs for a computing device;
a connection portion including a flexible hinge configured to be removably connected to the computing device physically and communicatively to communicate signals generated by the plurality of keys to the computing device; and
an outer layer that is configured to cover the flexible hinge and the plurality of keys of the key assembly, the outer layer having a plurality of areas that are embossed thereon that indicate borders of the plurality of keys, the borders of the plurality of keys embossed to have raised or depressed thicknesses of less than a thickness of the outer layer.

2. The input device as described in claim 1, wherein the plurality of areas are embossed using a heated plate having a plurality of protrusions that are configured to form the plurality of areas when pressed against the outer layer.

3. The input device as described in claim 2, wherein at least two of the plurality of protrusions of the heated plate have a height such that an area between the at least two protrusions of the plurality of protrusions that is not to be embossed is not contacted by the heated plate when pressed against the outer layer.

4. The input device as described in claim 3, wherein the plurality of areas that are embossed have a different surface smoothness than another part of the outer layer that is not embossed.

5. The input device as described in claim 3, wherein the plurality of protrusions of the heated plate are not sandblasted.

6. The input device as described in claim 1, wherein the outer layer includes an outer skin that is embossed and a middle layer that is disposed beneath the outer skin, the middle layer having a color that is different than a color of the outer skin.

7. The input device as described in claim 6, wherein a portion of the outer skin is removed to expose the middle layer, the portion forming part of an indication of a function of a key of the plurality of keys.

8. The input device as described in claim 7, wherein the portion of the outer skin is removed using a laser.

9. The input device as described in claim 8, wherein the removal of the portion of the outer skin causes a corresponding portion of the middle layer to expand through an opening formed in the outer skin.

10. The input device as described in claim 9, wherein the corresponding portion of the middle layer expands through the opening formed in the outer skin such that a surface of the corresponding portion of the middle layer forms a substantially continuous surface with the outer skin.

11. The input device as described in claim 1, wherein the plurality of keys are configured to implement a QWERTY keyboard.

12. A keyboard comprising:
a key assembly including a plurality of keys that are usable to initiate respective inputs for a computing device;
a connection portion configured to be removably connected to the computing device physically and communicatively via a flexible hinge to communicate signals generated by the plurality of keys to the computing device through the flexible hinge; and
an outer layer that is configured to cover the flexible hinge and the plurality of keys of the key assembly, the outer layer having an outer skin and a middle layer that is disposed beneath the outer skin, a portion of the outer skin removed via a manufacturing process subsequent to the outer skin being formed to expose the middle layer to form at least part of an indication of a function of a key of the plurality of keys.

13. The keyboard as described in claim 12, wherein the middle layer has a color that is different than a color of the outer skin.

14. The keyboard as described in claim 12, wherein the portion of the outer skin is removed using a laser.

15. The keyboard as described in claim 12, wherein the removal of the portion of the outer skin causes a corresponding portion of the middle layer to expand through an opening formed in the outer skin.

16. The keyboard as described in claim 15, wherein the corresponding portion of the middle layer expands through the opening formed in the outer skin such that a surface of the corresponding portion of the middle layer forms an approximate continuous surface with the outer skin.

17. The keyboard as described in claim 12, wherein the outer skin includes a plurality of areas that are embossed thereon that indicate one or more borders of more than one key of the plurality of keys.

18. A method comprising:
embossing an outer skin of an outer layer that is usable to cover a plurality of keys of a key assembly to indicate a border of the plurality of keys, the border of the plurality of keys embossed to a have raised or depressed thicknesses of less than a thickness of the outer layer;
removing a portion of the outer skin covering the plurality of keys via a manufacturing process subsequent to the outer skin being formed to expose a middle layer of the outer layer that is disposed beneath the outer skin, the portion removed to form at least part of an indication of a function of a key of the plurality of keys; and
covering the key assembly with the outer layer having the indication of the border and the indication of the function of the key of the plurality of keys.

19. The method as described in claim 18, wherein:
the plurality of areas are embossed using a heated plate having protrusions that are configured to form the plurality of areas when pressed against the outer layer; and
at least two of the protrusions of the heated plate having a height such that an area between the at least two protrusions that is not to be embossed is not contacted by the heated plate when pressed against the outer layer.

20. The method as described in claim 18, wherein the outer layer and the key assembly have a combined thickness of 3.5 millimeters or less.

* * * * *